United States Patent [19]
Sakaguchi

[11] Patent Number: 5,790,565
[45] Date of Patent: Aug. 4, 1998

[54] CMOS INTEGRATED CIRCUIT FAILURE DIAGNOSIS APPARATUS AND DIAGNOSTIC METHOD

[75] Inventor: Kazuhiro Sakaguchi, Tokyo, Japan

[73] Assignee: NEC Corporation, Tokyo, Japan

[21] Appl. No.: 782,933

[22] Filed: Jan. 13, 1997

[30] Foreign Application Priority Data

Jan. 12, 1996 [JP] Japan .................................. 8-021825
Apr. 30, 1996 [JP] Japan .................................. 8-108810
Jul. 3, 1996 [JP] Japan .................................. 8-172722

[51] Int. Cl.$^6$ .................................................. G06F 11/00
[52] U.S. Cl. .................................................. 371/27.1
[58] Field of Search .............................. 371/22.1, 22.4, 371/22.5, 22.6, 24, 25.1, 27.1

[56] References Cited

FOREIGN PATENT DOCUMENTS 0 494 311 A1  7/1992  European Pat. Off. .
545423        2/1993  Japan .

OTHER PUBLICATIONS

European Search Report, dated Jun. 3, 1997.
Chennian Di, et al. "On Accurate Modeling and Efficient Simulation of CMOS Opens", International Test Conference, Paper 40.2, Jan. 1, 1993, pp. 875-882.

*Primary Examiner*—Vincent P. Canney
*Attorney, Agent, or Firm*—Whitham, Curtis, Whitham

[57] ABSTRACT

A failure diagnosis apparatus is provided which predicts failure locations in a CMOS integrated circuit in which an Iddq has been discovered, this apparatus having a test pattern storage unit 1 for storing test patterns used to perform a functional test of the CMOS integrated circuit, an LSI tester 3 which performs a functional test and an Iddq test on the CMOS integrated circuit based on the test patterns, a test results storage unit 6 to store test results, a circuit data storage unit 2 to store various information with regard to the device under test, a logic simulator 5 for receiving the above-noted test patterns and circuit data and performing a logic simulation of the internal operation of the circuit, a simulation results storage unit 7, and a failure location judgment unit 8 for outputting the diagnosis results based on test results and simulation results. This diagnosis apparatus predicts short circuit failures between signal lines and between a signal line and either a power supply line or a ground line, based, on the results of a simulation of internal circuit signal values at a point in time at which a test pattern is applied for which an abnormality is not detected in an Iddq test.

37 Claims, 39 Drawing Sheets

FIG.3

| No. | CL | RESET | Q0 | Q1 | Q2 |
|-----|----|-------|----|----|----|
| 1 | * | 0 | * | * | * |
| 2 | * | 1 | * | * | * |
| 3 | * | 0 | 0 | 0 | 0 |
| 4 | 0 | 0 | 0 | 0 | 0 |
| 5 | 1 | 0 | 1 | 0 | 0 |
| 6 | 0 | 0 | 1 | 0 | 0 |
| 7 | 1 | 0 | 0 | 1 | 0 |
| 8 | 0 | 0 | 0 | 1 | 0 |
| 9 | 1 | 0 | 1 | 1 | 0 |
| 10 | 0 | 0 | 1 | 1 | 0 |
| 11 | 1 | 0 | 0 | 0 | 1 |
| 12 | 0 | 0 | 0 | 0 | 1 |
| 13 | 1 | 0 | 1 | 0 | 1 |
| 14 | 0 | 0 | 1 | 0 | 1 |
| 15 | 1 | 0 | 0 | 0 | 0 |
| 16 | 0 | 0 | 0 | 0 | 0 |
| 17 | 1 | 0 | 1 | 0 | 0 |
| 18 | 0 | 0 | 1 | 0 | 0 |

FIG.4

| No. | CL | RESET | Q0 | Q1 | Q2 | FUNCTIONAL TEST | Iddq TEST |
|---|---|---|---|---|---|---|---|
| 1 | * | 0 | * | * | * | | Pass |
| 2 | * | 1 | * | * | * | | Pass |
| 3 | * | 0 | 0 | 0 | 0 | Pass | Pass |
| 4 | 0 | 0 | 0 | 0 | 0 | Pass | Pass |
| 5 | 1 | 0 | 1 | 0 | 0 | Pass | Fail |
| 6 | 0 | 0 | 1 | 0 | 0 | Pass | Fail |
| 7 | 1 | 0 | 0 | 1 | 0 | Pass | Fail |
| 8 | 0 | 0 | 0 | 1 | 0 | Pass | Fail |
| 9 | 1 | 0 | 1 | 1 | 0 | Pass | Pass |
| 10 | 0 | 0 | 1 | 1 | 0 | Pass | Pass |
| 11 | 1 | 0 | 0 | 0 | 1 | Pass | Pass |
| 12 | 0 | 0 | 0 | 0 | 1 | Pass | Fail |
| 13 | 1 | 0 | 1 | 0 | 1 | Pass | Fail |
| 14 | 0 | 0 | 1 | 0 | 1 | Pass | Pass |
| 15 | 1 | 0 | 0 | 0 | 0 | Pass | Pass |
| 16 | 0 | 0 | 0 | 0 | 0 | Pass | Pass |
| 17 | 1 | 0 | 1 | 0 | 0 | Pass | Fail |
| 18 | 0 | 0 | 1 | 0 | 0 | Pass | Fail |

FIG.5

| No. | CL | RESET | Q0 | Q1 | Q2 | S1 | S2 | S3 | S4 | S5 |
|-----|----|----|----|----|----|----|----|----|----|----|
| 1 | * | 0 | * | * | * | 1 | * | * | * | * |
| 2 | * | 1 | * | * | * | 1 | * | * | * | * |
| 3 | * | 0 | 0 | 0 | 0 | 1 | 1 | 0 | 1 | 0 |
| 4 | 0 | 0 | 0 | 0 | 0 | 1 | 1 | 0 | 1 | 0 |
| 5 | 1 | 0 | 1 | 0 | 0 | 1 | 0 | 1 | 1 | 0 |
| 6 | 0 | 0 | 1 | 0 | 0 | 1 | 0 | 1 | 1 | 0 |
| 7 | 1 | 0 | 0 | 1 | 0 | 1 | 1 | 0 | 0 | 0 |
| 8 | 0 | 0 | 0 | 1 | 0 | 1 | 1 | 0 | 0 | 0 |
| 9 | 1 | 0 | 1 | 1 | 0 | 1 | 0 | 1 | 0 | 1 |
| 10 | 0 | 0 | 1 | 1 | 0 | 1 | 0 | 1 | 0 | 1 |
| 11 | 1 | 0 | 0 | 0 | 1 | 1 | 1 | 0 | 1 | 0 |
| 12 | 0 | 0 | 0 | 0 | 1 | 1 | 1 | 0 | 1 | 0 |
| 13 | 1 | 0 | 1 | 0 | 1 | 1 | 0 | 1 | 1 | 0 |
| 14 | 0 | 0 | 1 | 0 | 1 | 1 | 0 | 1 | 1 | 0 |
| 15 | 1 | 0 | 0 | 1 | 1 | 1 | 1 | 0 | 1 | 0 |
| 16 | 0 | 0 | 0 | 1 | 1 | 1 | 1 | 0 | 1 | 0 |
| 17 | 1 | 0 | 1 | 1 | 1 | 1 | 0 | 1 | 1 | 0 |
| 18 | 0 | 0 | 1 | 1 | 1 | 1 | 0 | 1 | 1 | 0 |

FIG.6

| No. | CL | RESET | Q0 | Q1 | Q2 | S1 | S2 | S3 | S4 | S5 |
|---|---|---|---|---|---|---|---|---|---|---|
| 1 | * | 0 | * | * | * | 1 | * | * | * | * |
| 2 | * | 1 | * | * | * | 1 | * | * | * | * |
| 3 | * | 0 | 0 | 0 | 0 | 1 | 1 | 0 | 1 | 0 |
| 4 | 0 | 0 | 0 | 0 | 0 | 1 | 1 | 0 | 1 | 0 |
| 9 | 1 | 0 | 1 | 1 | 0 | 1 | 0 | 1 | 0 | 1 |
| 10 | 0 | 0 | 1 | 1 | 0 | 1 | 0 | 1 | 0 | 1 |
| 11 | 1 | 0 | 1 | 0 | 1 | 1 | 1 | 0 | 1 | 0 |
| 12 | 0 | 0 | 0 | 0 | 1 | 1 | 1 | 0 | 1 | 0 |
| 15 | 1 | 0 | 0 | 0 | 0 | 1 | 1 | 0 | 1 | 0 |
| 16 | 0 | 0 | 0 | 0 | 0 | 1 | 1 | 0 | 1 | 0 |

FIG.7

| No. | CL | RESET | Q0 | Q1 | Q2 | S1 | S2 | S3 | S4 | S5 |
|---|---|---|---|---|---|---|---|---|---|---|
| 5 | 1 | 0 | 1 | 0 | 0 | 1 | 0 | 1 | 1 | 0 |
| 6 | 0 | 0 | 1 | 0 | 0 | 1 | 0 | 1 | 1 | 0 |
| 7 | 1 | 0 | 0 | 1 | 0 | 1 | 1 | 0 | 0 | 0 |
| 8 | 0 | 0 | 0 | 1 | 0 | 1 | 1 | 0 | 0 | 0 |
| 13 | 1 | 0 | 1 | 0 | 1 | 1 | 0 | 0 | 1 | 0 |
| 14 | 0 | 0 | 1 | 0 | 1 | 1 | 0 | 0 | 1 | 0 |
| 17 | 1 | 0 | 1 | 0 | 0 | 1 | 0 | 1 | 1 | 0 |
| 18 | 0 | 0 | 1 | 0 | 0 | 1 | 0 | 1 | 1 | 0 | p = 4  NO Iddq ABNORMALITY
H1 = {{ S1, S2, S4, VDD }},  L1 = {{ CL, RESET, Q0, Q1, Q2, S3, S5, GND }}
A : SEE TABLE BELOW

FIG.21

FAILURE CANDIDATE LIST

THE EXISTENCE OF A SHORT FAILURE IS PREDICTED BETWEEN
THE FOLLOWING SIGNAL LINES

SHORT FAILURE BETWEEN Q0 AND Q1
SHORT FAILURE BETWEEN Q0 AND Q3
SHORT FAILURE BETWEEN Q1 AND S3
SHORT FAILURE BETWEEN S2 AND S4
SHORT FAILURE BETWEEN Q0 AND S5
SHORT FAILURE BETWEEN Q1 AND S5
SHORT FAILURE BETWEEN S3 AND S5
SHORT FAILURE BETWEEN S1 AND VDD

FIG.24

| No. | CL | RESET | Q0 | Q1 | Q2 | FUNCTIONAL TEST | Iddq TEST |
|---|---|---|---|---|---|---|---|
| 1 | * | 0 | * | * | * | Pass | Pass |
| 2 | * | 1 | * | * | * | Pass | Pass |
| 3 | * | 0 | 0 | 0 | 0 | Pass | Fail |
| 4 | 0 | 0 | 0 | 0 | 0 | Pass | Fail |
| 5 | 1 | 0 | 1 | 0 | 0 | Pass | Pass |
| 6 | 0 | 0 | 0 | 0 | 0 | Pass | Pass |
| 7 | 1 | 0 | 1 | 0 | 0 | Pass | Fail |
| 8 | 0 | 0 | 0 | 1 | 0 | Pass | Fail |
| 9 | 1 | 0 | 1 | 1 | 0 | Pass | Pass |
| 10 | 0 | 0 | 0 | 1 | 1 | Pass | Pass |
| 11 | 1 | 0 | 1 | 1 | 1 | Pass | Fail |
| 12 | 0 | 0 | 0 | 0 | 1 | Pass | Fail |
| 13 | 1 | 0 | 1 | 0 | 1 | Pass | Fail |
| 14 | 0 | 0 | 0 | 0 | 0 | Pass | Fail |
| 15 | 1 | 0 | 1 | 0 | 0 | Pass | Fail |
| 16 | 0 | 0 | 0 | 0 | 0 | Pass | Fail |
| 17 | 1 | 0 | 1 | 0 | 0 | Pass | Pass |
| 18 | 0 | 0 | 1 | 0 | 0 | Pass | Pass |

| PATTERN NUMBER | x | y | w | z | u |
|---|---|---|---|---|---|
| 1 | 0 | 0 | 0 | 0 | 0 |
| 2 | 0 | 0 | 0 | 1 | 0 |
| 3 | 0 | 0 | 1 | 0 | 0 |
| 4 | 0 | 0 | 1 | 1 | 1 |
| 5 | 0 | 1 | 0 | 0 | 0 |
| 6 | 0 | 1 | 0 | 1 | 0 |
| 7 | 0 | 1 | 1 | 0 | 0 |
| 8 | 0 | 1 | 1 | 1 | 0 |
| 9 | 1 | 0 | 0 | 0 | 1 |
| 10 | 1 | 0 | 0 | 1 | 1 |
| 11 | 1 | 0 | 1 | 0 | 1 |
| 12 | 1 | 0 | 1 | 1 | 1 |
| 13 | 1 | 1 | 0 | 0 | 1 |
| 14 | 1 | 1 | 0 | 1 | 0 |
| 15 | 1 | 1 | 1 | 0 | 0 |
| 16 | 1 | 1 | 1 | 1 | 1 |

FIG.33

| PATTERN NUMBER | x | y | w | z | a | b | c | d | e | f | g | u |
|---|---|---|---|---|---|---|---|---|---|---|---|---|
| 1 | 0 | 0 | 0 | 0 | 1 | 1 | 1 | 1 | 1 | 1 | 1 | 0 |
| 2 | 0 | 0 | 0 | 1 | 1 | 1 | 0 | 1 | 1 | 1 | 1 | 0 |
| 3 | 0 | 0 | 1 | 0 | 1 | 0 | 1 | 1 | 1 | 1 | 1 | 0 |
| 4 | 0 | 0 | 1 | 1 | 1 | 0 | 0 | 1 | 0 | 1 | 1 | 1 |
| 5 | 0 | 1 | 0 | 0 | 0 | 1 | 1 | 1 | 1 | 1 | 1 | 0 |
| 6 | 0 | 1 | 0 | 1 | 0 | 1 | 0 | 1 | 1 | 1 | 1 | 0 |
| 7 | 0 | 1 | 1 | 0 | 0 | 0 | 1 | 1 | 1 | 1 | 1 | 0 |
| 8 | 0 | 1 | 1 | 1 | 0 | 0 | 0 | 1 | 1 | 1 | 1 | 0 |
| 9 | 1 | 0 | 0 | 0 | 1 | 1 | 1 | 0 | 1 | 1 | 0 | 1 |
| 10 | 1 | 0 | 0 | 1 | 1 | 1 | 0 | 0 | 1 | 1 | 1 | 1 |
| 11 | 1 | 0 | 1 | 0 | 1 | 0 | 1 | 0 | 1 | 1 | 1 | 1 |
| 12 | 1 | 0 | 1 | 1 | 1 | 0 | 0 | 0 | 0 | 0 | 1 | 1 |
| 13 | 1 | 1 | 0 | 0 | 0 | 1 | 1 | 1 | 1 | 1 | 0 | 1 |
| 14 | 1 | 1 | 0 | 1 | 0 | 1 | 0 | 1 | 1 | 1 | 1 | 0 |
| 15 | 1 | 1 | 1 | 0 | 0 | 0 | 1 | 1 | 1 | 1 | 1 | 0 |
| 16 | 1 | 1 | 1 | 1 | 0 | 0 | 0 | 1 | 0 | 0 | 1 | 1 |

FIG.34

| PATTERN NUMBER | FUNCTIONAL FAILURE | Iddq FAILURE | Iddq CURRENT VALUE (mA) |
|---|---|---|---|
| 1 | NORMAL | NORMAL | 0 |
| 2 | NORMAL | NORMAL | 0 |
| 3 | NORMAL | NORMAL | 0 |
| 4 | NORMAL | ABNORMAL | 0.7 |
| 5 | NORMAL | NORMAL | 0 |
| 6 | NORMAL | NORMAL | 0 |
| 7 | NORMAL | NORMAL | 0 |
| 8 | NORMAL | NORMAL | 0 |
| 9 | NORMAL | ABNORMAL | 3.4 |
| 10 | NORMAL | ABNORMAL | 1.1 |
| 11 | NORMAL | ABNORMAL | 1.1 |
| 12 | NORMAL | ABNORMAL | 1.1 |
| 13 | NORMAL | ABNORMAL | 2.3 |
| 14 | NORMAL | NORMAL | 0 |
| 15 | NORMAL | NORMAL | 0 |
| 16 | NORMAL | ABNORMAL | 0.7 |

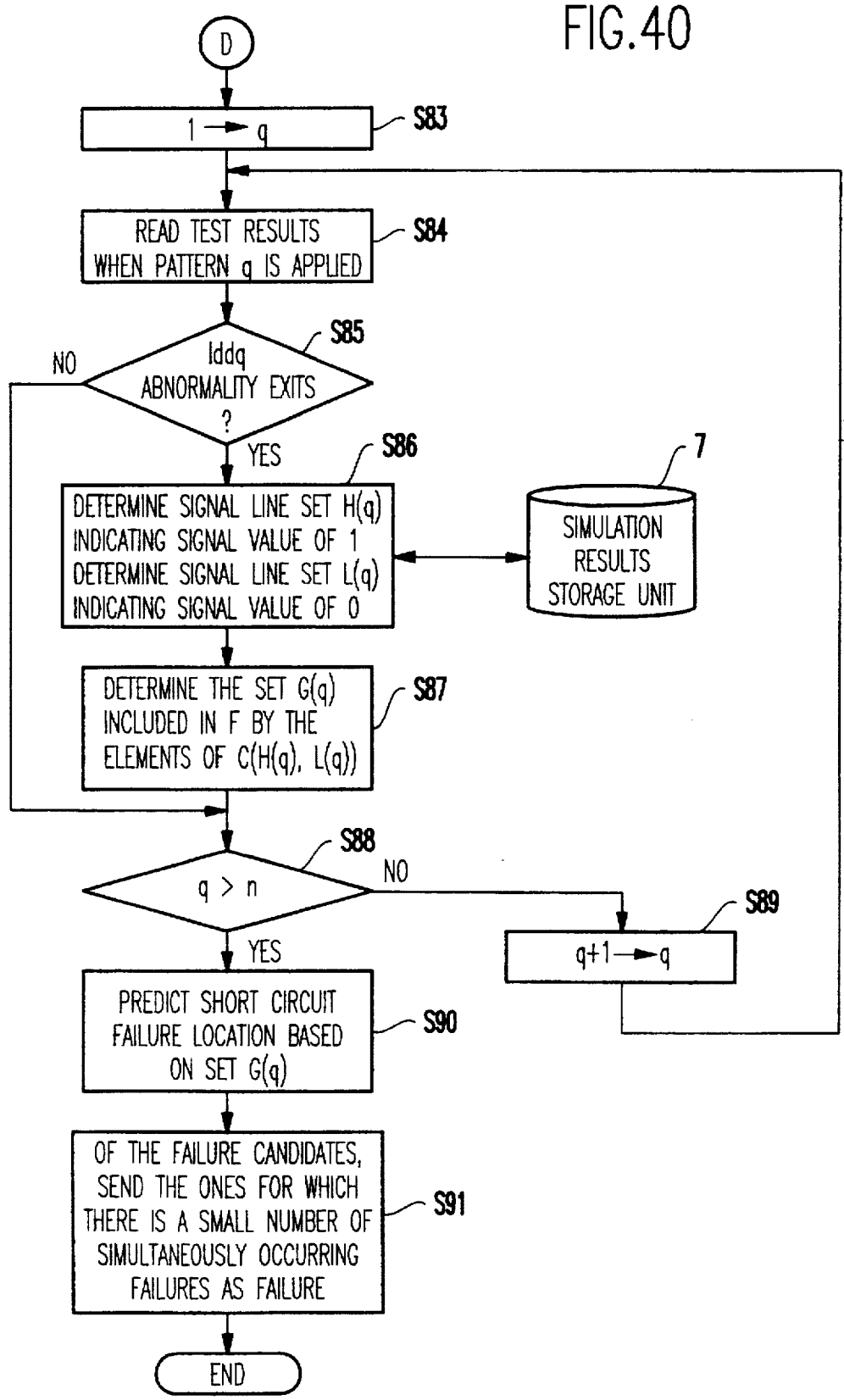

CMOS INTEGRATED CIRCUIT FAILURE DIAGNOSIS APPARATUS AND DIAGNOSTIC METHOD

BACKGROUND OF THE INVENTION

1. Field of the Invention

The present invention relates to a CMOS integrated circuit failure diagnosis apparatus, and more specifically it relates to an integrated circuit failure diagnosis apparatus which predicts the location of a failure in an integrated circuit from power supply current abnormality information obtained from Iddq test results

2. Description of the Related Art

In the past, this type of CMOS IC failure diagnosis apparatus, was used to identify the location of a failure in order to establish the cause of a failure in a CMOS IC.

For example, there is a method for identifying the failure location by using an electron beam to observe the voltages at various locations on the chip.

For example, in the Japanese Unexamined Patent Publication (KOKAI) No. 5-45423, there is the disclosure of technology for the purpose of obtaining a potential contrast image of an IC with high speed and without deterioration, in analyzing a failure location in an integrated circuit.

This technology obtains a potential contrast image in synchronization with the drive of the integrated circuit while driving the integrated circuit using an LSI tester, and when doing so temporary storage of the applied test patterns used to obtain the potential contrast image is done as the potential contrast image is obtained. While there are also a diagnosis method which uses an emission microscope and a diagnosis method which uses a liquid crystal, both of these require the opening of the integrated circuit, and involve difficulty in identifying the location of a failure due to the increased degree of integration of integrated circuits.

In integrated circuit diagnosis apparatuses of the past, when analyzing an integrated circuit using an electron beam tester, because an electron beam is used to measure the potential on the wiring in an integrated circuit, and because of the minimizing of feature sizes, the increase in the number of layers, and the increase in the density of integrated circuits, it is difficult to measure the target wiring potential, making it impossible to identify the failure location.

In the functional testing of a device, with respect to the case of an Iddq failure in which there is no detection of an abnormality in the input and output signal values, but in which an abnormal power supply current characteristically occurs under a specific input condition, because the method of the past traced wiring on which the expected value that would occur in a normal device is different from the actual device wiring signal value so as to figure out the failed portion, it does not function effectively.

Because when an Iddq failure exists an extremely large current can flow, depending upon the circuit state, use of such a device in a low-power-consumption apparatus such as a cellular telephone can hinder the achievement of the expected performance.

An object of the present invention is to provide a diagnosis apparatus and diagnosis method which, for an Iddq failure, in which there is no detection of an abnormality in the input and output signal values, but in which a characteristically abnormal power supply current occurs dependent upon an input/output pattern condition, makes possible the prediction of the location and cause of the failure.

Another object of the present invention is to provide a CMOS integrated circuit diagnosis apparatus and diagnosis method capable of identification even in the case in which there is a plurality of locations which are causes of the above-noted failure.

Yet another object of the present invention is to provide a CMOS integrated circuit diagnosis apparatus and diagnosis method capable of indicating the position of an actual location on a chip at which a failure occurs.

SUMMARY OF THE INVENTION

To achieve the above-noted objects, a CMOS integrated circuit diagnosis apparatus and method according to the present invention have the following basic technical constitution. Specifically, the first aspect of the present invention is a CMOS integrated circuit failure diagnosis apparatus which uses functional test results and Iddq test results to diagnosis a failure in a CMOS integrated circuit in which exists no abnormality in a function test but exists an Iddq failure which in an Iddq test exhibits an Iddq abnormality for a specific test pattern only, this CMOS integrated circuit failure diagnosis apparatus having a test pattern storage unit into which are stored test patterns coded as the input and output signals to and from the circuit to be tested for function test with respect to the CMOS integrated circuit, an LSI tester which receives the above-noted test patterns and which performs a functional test and an Iddq test of the CMOS integrated circuit to be tested, a test results storage unit into which are stored the results of the above-noted functional test and Iddq test, a circuit data storage unit into which is stored circuit data which is a record of the element placement information, element function information, and element-to-terminal wiring information of the circuit under test, a logic simulator which performs a logic simulation of the operation of the internal circuitry of the above-noted circuit under test using the above-noted test patterns and above-noted circuit data, a simulation results storage unit into which are stored the results of the above-noted logic simulation, and a failure location judgment unit which outputs diagnosis results which predict the location of a failure in the above-noted circuit, based on the results of the above-noted functional and Iddq tests and the results of the above-noted simulation.

A second aspect of the present invention is a CMOS integrated circuit failure diagnosis method which uses functional test results and Iddq test results to diagnosis a failure in a CMOS integrated circuit in which exists no abnormality in a function test but exists an Iddq failure which in an Iddq test exhibits an Iddq abnormality for a specific test pattern only, this method comprising a first step of using a test pattern for the purpose of performing a functional test of the above-noted CMOS integrated circuit and performing a functional test and an Iddq test of the above-noted CMOS integrated circuit by means of a prescribed LSI tester, a second step of performing an operational simulation with regard to the above-noted CMOS integrated circuit, and a third step of predicting a location of a short circuit failure in a signal line within the above-noted CMOS integrated circuit, from the test results from the above-noted first step and the simulation results from the above-noted second step.

BRIEF DESCRIPTION OF THE DRAWINGS

FIG. 3 is a drawing which shows an example of a test pattern used in this embodiment aspect.

FIG. 4 is drawing which shows functional test results and Iddq test results.

FIG. 5 is a drawing which shows simulation results.

FIG. 6 is a drawing which shows the internal circuit signal values when a pattern is applied in the case in which an Iddq failure is not detected.

FIG. 7 is a drawing which shows the internal circuit signal values when a pattern is applied in the case in which an Iddq failure is detected.

FIG. 21 is a drawing which shows an example of a list of candidates for the locations of short circuit failures obtained from the above-noted FIG. 11 through FIG. 20.

FIG. 24 is a drawing which shows the LSI test results obtained in the ninth embodiment aspect of a CMOS integrated circuit failure diagnosis apparatus according to the present invention.

FIG. 25 is a drawing which shows the simulation results for the case of using a test pattern for which an Iddq abnormality does not occur in the ninth embodiment aspect of a CMOS integrated circuit failure diagnosis apparatus according to the present invention.

FIG. 26 is a drawing which shows the simulation results for the case of using a test pattern for which an Iddq abnormality occurs in the ninth embodiment aspect of a CMOS integrated circuit failure diagnosis apparatus according to the present invention.

FIG. 32 is a drawing which shows an example of a test pattern used in the twelfth embodiment aspect of a CMOS integrated circuit failure diagnosis apparatus according to the present invention.

FIG. 33 is a drawing which shows the simulation results obtained in the twelfth embodiment aspect of a CMOS integrated circuit failure diagnosis apparatus according to the present invention.

FIG. 34 is a drawing which shows the LSI test results obtained in the twelfth embodiment aspect of a CMOS integrated circuit failure diagnosis apparatus according to the present invention.

FIGS. 39 and 40 are flowcharts which show the operating procedure in the fifteenth embodiment aspect of a CMOS integrated circuit failure diagnosis apparatus according to the present invention.

DETAILED DESCRIPTION OF THE INVENTION

Specific examples the configuration of a CMOS integrated circuit failure diagnosis apparatus and CMOS integrated circuit failure diagnosis method according to the present invention will be described in detail below, with reference being made to the relevant accompanying drawings.

Figure 1:
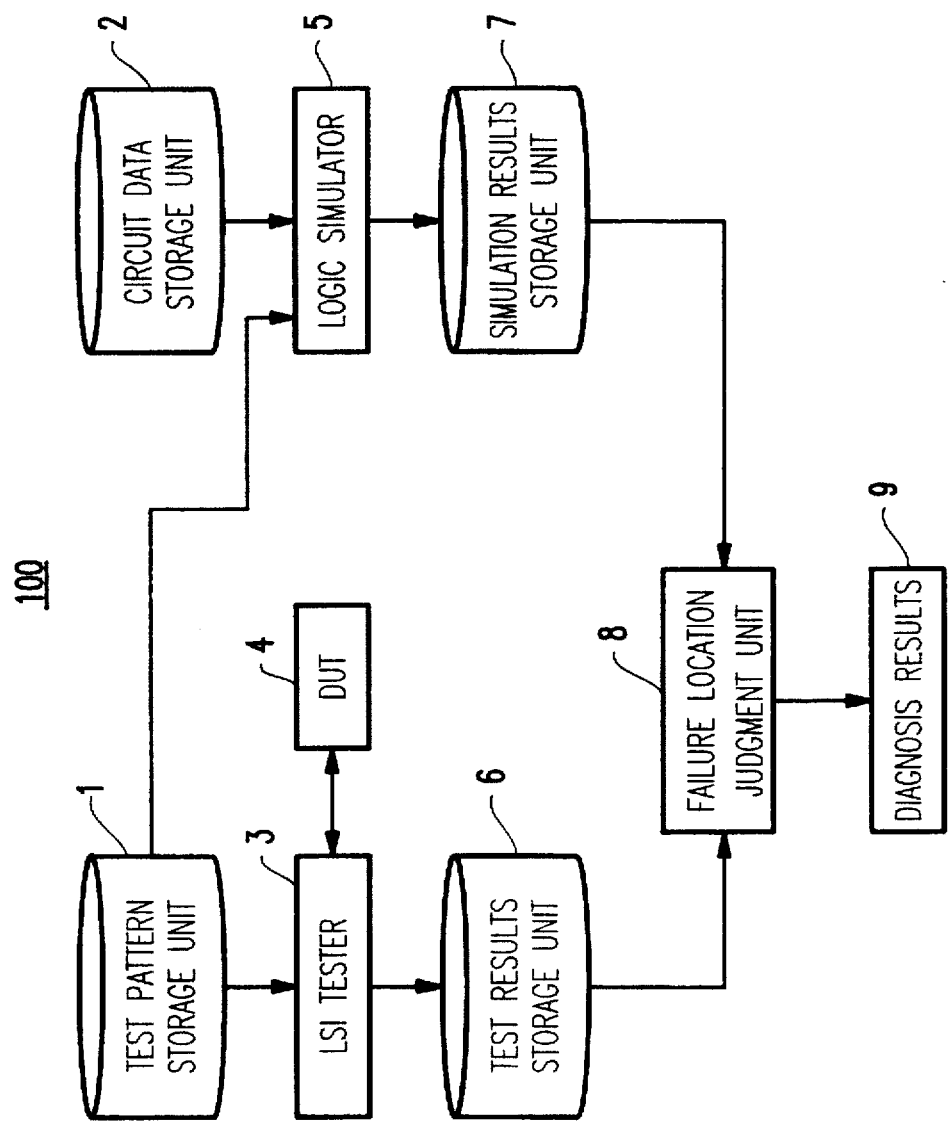
FIG. 1 is a block diagram showing the configuration of the first embodiment aspect of a failure diagnosis apparatus according to the present invention.

FIG. 1 is a block diagram which shows a specific example of the configuration of a CMOS integrated circuit failure diagnosis apparatus 100 according to the present invention.

FIG. 1 shows a CMOS integrated circuit failure diagnosis apparatus which has a test pattern storage unit 1 into which are stored test patterns coded as the input and output signals to and from the circuit, an LSI tester 3 which receives the above-noted test patterns and which performs a functional test and an Iddq test of the CMOS integrated circuit, a test results storage unit 6 into which are stored the results of the above-noted functional test and Iddq test, a circuit data storage unit 2 into which is stored circuit data which is a record of the element placement information of the CMOS integrated circuit to be tested, element function information, and element-to-terminal wire-connecting information of the circuit under test, a logic simulator which receives the above-noted circuit information and which performs a logic simulation 5 of the operation of the internal circuitry of the above-noted circuit under test at each individual time with the above-noted test patterns applied thereto, a simulation results storage unit 7 into which are stored the results of the above-noted logic simulation, and a failure location judgment unit 8 which outputs diagnosis results which predict the location of a failure in the above-noted circuit, based on the results of the above-noted functional and Iddq tests and the results of the above-noted simulation.

In FIG. 1, the reference numeral 9 denotes a display means which displays the diagnosis results.

In the above-noted failure location judgment unit of the present invention, a plurality of judgment methods can be used, one specific example of which is the judgment of the short circuit failure location from the results of simulation of the internal circuit signal values at the point in time at which a test pattern is applied for which an abnormality does not occur in an Iddq test, and from the results of simulation of the internal circuit signal values at the point in time at which a test pattern is applied for which an abnormality is detected in an Iddq test.

In this case, a judgment of the short circuit failure location is made based on combinations of signal lines indicating the same signal value at all times, combinations of signal lines indicating differing signal values at all times, the common signal lines thereamong, the number of times a signal line combination indicating the same signal value indicates the same signal value, the number of times a signal line combination indicating differing signal values indicates differing signal values, and the like.

Specifically, the mechanism by which an abnormal Iddq current flows is considered. Consider the case in which, for some reason due to any reasons, a wires indicating signal values of 1 and 0 are short-circuitted via a resistance R. In this case, if the resistance R is sufficiently large, the signal values on each of the wires will not exceed the threshold values, so that they will maintain their values of 1 and 0.

However, the short-circuitted current by the resistance R is reflected in the overall device powers supply current, resulting in an abnormally large current that is not normally detected, this being detected as an Iddq abnormality. This resistance-caused Iddq abnormality only results when the signal values of the two signal lines are mutually different, an Iddq abnormality not being detected when they have the same signal value. That is, at the point at which a test pattern i is applied, if the set of signal lines indicating a signal value of 1 is H(i) and the set of signal lines indicating the signal value of 0 is L(i), if no Iddq abnormality exists at the point at which the test pattern i is applied, there are no short circuit failures between any signal lines of H(i) and L(i). If an Iddq abnormality exists, there will be a short circuit failure existing between signal lines between H(i) and L(i). In this case, by taking the power supply signal value to be 1, and the ground line signal value to be 0, these being taken to be signal lines, it is impossible to perform diagnosis of short circuit failures involving the power supply line and ground line as well.

Next, the first embodiment aspect of a CMOS integrated circuit failure diagnosis apparatus 100 according to the present invention will be described with reference to the drawing.

In FIG. 1, which shows a block diagram of the first embodiment aspect of the CMOS integrated circuit failure diagnosis apparatus 100, at the test pattern storage unit 1, test patterns, which are input and output signal sequences for the purpose of inspecting the functioning of the device under test (DUT) 4 are stored.

The LSI tester 3 is connected to the test pattern storage unit 1, and performs a functional test of the device under test (DUT) 4 connected thereto, based on the test patterns which are send to it from the test pattern storage unit 1, while simultaneously performing an Iddq test which tests whether or not an abnormal power supply current for each individual test pattern. The results of this functional test and Iddq test are sent to and stored within the test results storage unit 6.

The LSI tester 3 is connected to the test pattern storage unit 1, and performs a functional test of the DUT 4 based on test patterns set to it from the test pattern storage unit 1 (test patterns being applied to the DUT 4 from the drivers of the LSI tester and the response output from the DUT 4 being compared with test pattern expected values by comparators), while simultaneously performing an Iddq test for each individual test pattern (also known as test vector), to test if an abnormal power supply current flows (by measuring the power supply current IDD of the DUT and comparing it with a prescribed threshold value).

At the circuit data storage unit 2, the circuit information of the device under test (DUT) 4 is stored. This circuit information comprising information regarding existing circuit elements, element-to-element and element-to-input pin and element-to-output pin connection information, and information which is a coding of the functional operation of the circuit elements.

The logic simulator 5 is connected to the circuit data storage unit 2 and to the test pattern storage 1, and executes a simulation of the circuit operation occurring when the test patterns are applied to the DUT 4. The results of that execution are sent to and stored within the simulation results storage unit 7. The failure location judgment unit 8 is connected to the test results storage unit 6 and to the simulation results storage unit 7, and makes a judgment of the location at which a failure exists in the device under test (DUT) 4, based on the data sent to it from each of the above-noted storage units.

The results of the dinagnosis thereof will be displayed at a display means 9.

Figure 2:
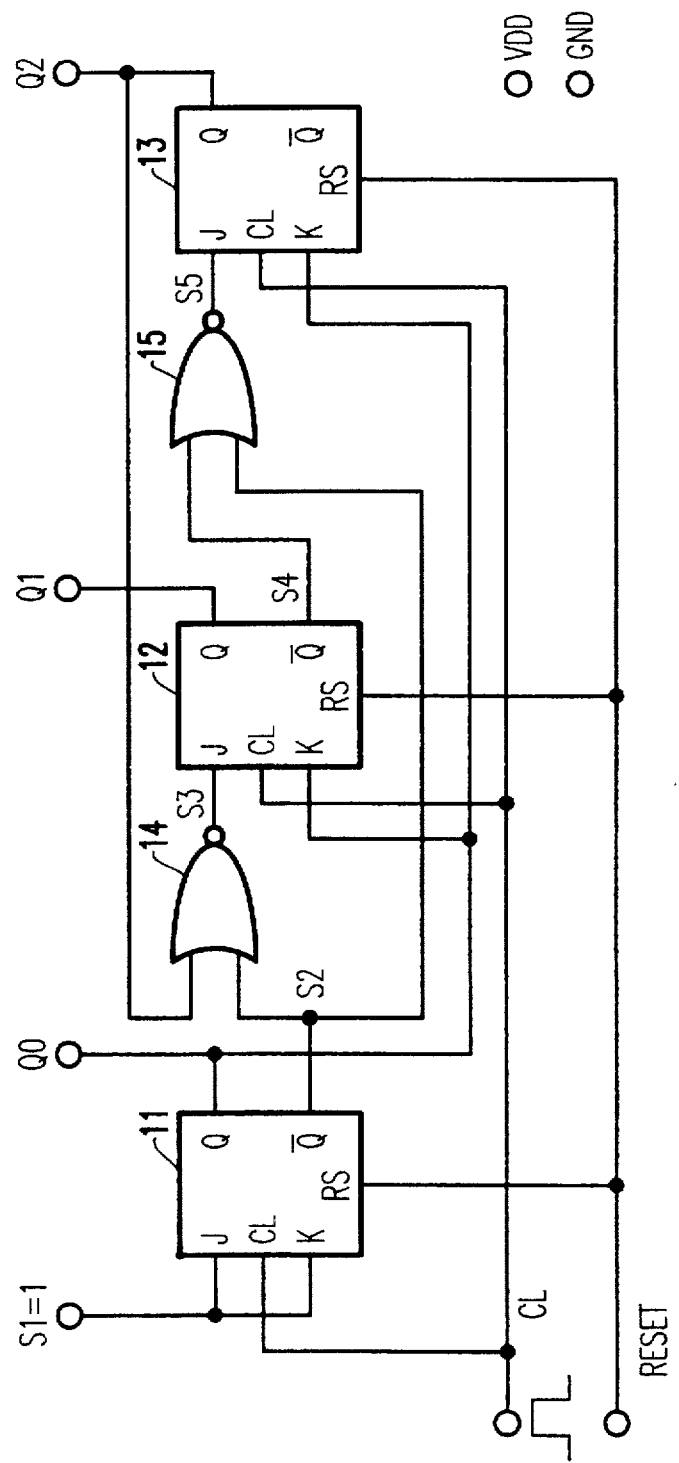
FIG. 2 is a circuit diagram which shows an example of a circuit to be measured in an inspection.

Next, an example of the operation of FIG. 1 will be described. FIG. 2 is a circuit diagram which shows an example of the DUT 4. This circuit comprises the JK flip-flops 11, 12, and 13, and the NOR gates 14 and 15. The circuit information for this circuit is stored in the circuit data storage unit 2. FIG. 3 is an example of a test pattern with respect to this device under test (DUT) 4.

In this case, the data in the columns for the signals CL and RESET are signal values applied to the device under test (DUT) 4, and the data in the columns for signals Q0, Q1, and Q2 are the expected output values from the circuit. The signal values θ 0 and 1 indicated, respectively, the low and high signal levels, with * indicating a 0 or 1 (the so-called "don't care" condition). Using this test pattern, a functional test of the DUT 4 is performed by the LSI tester 3.

In the circuit shown in FIG. 2, let us assume that a short circuit failure has occurred, for example, between signal lines S2 and S4. If the short circuit resistance is sufficiently large, there will be no influence on the logical functioning of the circuit.

However, if the logical values on signal lines S2 and S4 are different, an abnormally high power supply current will flow through the short circuit resistance, this being observed as an Iddq abnormality. As a result, the test results of the LSI tester 3 will be as shown in FIG. 4. In this example, the functional test results are pass for all test patterns, and an Iddq abnormality is detected at patterns 5, 6, 7, 8, 13, 14, 17 and 18 in the Iddq test, with no Iddq abnormality detected at the other patterns. These test results are sent to and stored within the test results storage unit 6.

At the logic simulator 5, a simulation is executed, based on the test patterns data sent from the test pattern storage unit 1 an the circuit data sent from the circuit data storage unit 2, the signal values at each internal circuit point being obtained for the times at which each pattern is applied.

Using the circuit which is shown in FIG. 2, if the test patterns shown in FIG. 3 are used, the simulation results are as shown in FIG. 5. These simulation results are sent to and stored within the simulation results storage unit 7.

The failure location judgment unit 8 makes a judgment of the location of a failure in the CMOS integrated circuit device under test (DUT) 4 using the test results from the test results storage unit 6 and the simulation results from simulation result storage unit 7.

The method of making this judgment is described below.

First, the test patterns for which an Iddq abnormality was not detected are collected based upon the test results, this set being called G. In the example shown in FIG. 4, for example, they are 1, 2, 3, 4, 9, 10, 11, 12, 15, 16, and thus this is G={1, 2, 3, 4, 9, 10, 11, 12, 15, 16}

Next, the signal values of each internal circuit signal line when the above-noted patterns are applied are obtained from the simulation results. Specifically, FIG. 6 is a drawing which shows the signal values of internal circuit parts when patterns for which an Iddq abnormality was not detected are applied, and FIG. 7 is a drawing which shows the signal values of internal circuit parts when patterns for which an Iddq abnormality was detected are applied.

As shown in FIG. 6, if the set of signal lines indicating a signal value of 1 when the pattern p∈G, for which an Iddq abnormality was not detected, is applied is Hp, and the set of signal lines indicating a signal value of 0 is Lp. And if we take the example of the 4th pattern, for which an Iddq abnormality is not detected, H4={S1, S2, S4, VDD} and L4={CL, RESET, Q0, Q1, Q2, S3, S5, GND}, in which VDD and GND are the power supply and ground lines, respectively.

At this point, we will define an operator C operating between two sets as follows.

$$C(A, B) = \{q | q = \{a, b\} = \{b, a\}, a \in A, b \in B, a \neq b\},$$

where A and B are sets.

Next, we will determine C (Hp, Lp). If we observe the elements {i, j} of the results of this determination, it can be seen that there is no short circuit between the signal line i and the signal line j.

The reason for this is that, because for the test pattern p, the signal lines i and j indicate differing signal values, and if a short circuit failure existed between them, there should have been an Iddq abnormality detected. But because an Iddq abnormality was not detected, it can be seen that there is not short circuit failure between signal line i and signal line j.

If the total set of signal lines of the device under test (DUT) 4 is S, the set of combinations of possible signal lines that can be short circuited is C(S, S). Because the set of combination of signal lines between which there is no short circuit failure for a test pattern p for which an Iddq abnormality is not detected is indicated by C(Hp, Lp), the possibility of a short circuit is narrowed to the combination of signal lines indicated by the elements of C(S, S)-C(Hp, Lp).

By determining C(S, S)-[p∈G∪]C (Hp, Lp), it is possible to determine the combination of signal lines which are candidates for short circuit failure.

As a convenience, we will use the notation [p∈G∪] for the sum set with regard to p∈G, this being followed hereinafter and with regard to the product set as well.

The above operations are indicated here for the example shown in FIG. 4.

G = {1, 2, 3, 4, 9, 10, 11, 12, 15, 16}
S = {CL, RESET, Q0, Q1, Q2, S1, S2, S3, S4, S5, VDD, GND}
C (S, S) = {{CL, RESET}, {CL, Q0}, {CL, Q1}, ..., {RESET, Q0}, ..., {S4, S5}}
$H_1$ = {S1, VDD}
$L_1$ = {RESET, GND}
$H_2$ = {RESET, S1, VDD}
$L_2$ = {GND}
$H_3$ = {S1, S2, S4, VDD}
$L_3$ = {RESET, Q0, Q1, Q2, S3, S5, GND}
$H_4$ = {S1, S2, S4, VDD}
$L_4$ = {CL, RESET, Q0, Q1, Q2, S3, S5, GND}
$H_9$ = {CL, Q0, Q1, S1, S3, S5, VDD}
$L_9$ = {RESET, Q2, S2, S4, GND}
$H_{10}$ = {Q0, Q1, S1, S3, S5, VDD}
$L_{10}$ = {CL, RESET, Q2, S2, S4, GND}
$H_{11}$ = {CL, Q2, S1, S2, S4, VDD}
$L_{11}$ = {RESET, Q0, Q1, S3, S5, GND}
$H_{12}$ = {Q2, S1, S2, S4, VDD}
$L_{12}$ = {CL, RESET, Q0, Q1, S3, S5, GND}
$H_{15}$ = {CL, S1, S2, S4, VDD}
$L_{15}$ = {RESET, Q0, Q1, Q2, S3, S5, GND}
$H_{16}$ = {S1, S2, S4, VDD}
$L_{16}$ = {CL, RESET, Q0, Q1, Q2, S3, S5, GND}

From the above, we have the following.

C(H1, L1) = {{RESET, S2}, {RESET, VDD}, {GND, S1}, {GND, VDD}

C(H2, L2) = {{GND, RESET}, {GND, S1}, {GND, VDD}}

C(H3, L3) = {{RESET, S1}, {Q0, S1}, {Q1, S1}, ...,

{RESET, S2}, ..., {S4, S5}}

This is continued thereafter, ultimately yielding the following.

C(S, S) − [p∈G∪]C(Hp, Lp) = {{Q0, Q1}, {Q0, S3}, {Q0, Q5},

{Q1, S3}, {Q1, S5}, {S2, S4}, {S3, S5}, {S1, VDD}}

From the above, of the 66 locations at which there is the possibility of a short circuit failure, it is possible to narrow the candidates to 8 locations, these including {S2, S4}, which is the actual failure location. This failure candidate set is output as the diagnosis results 9.

Figure 9:
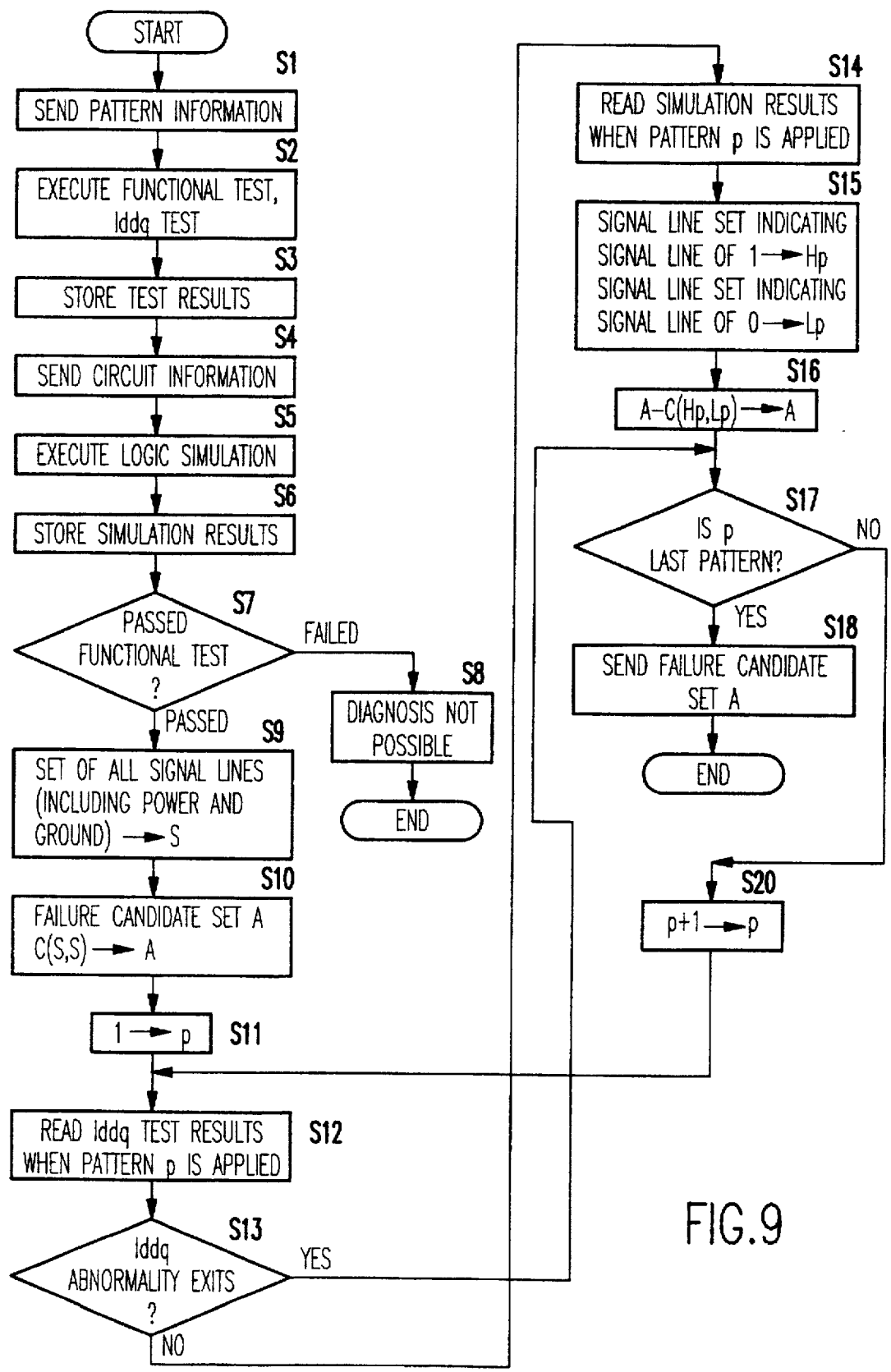
FIG. 9 is a flowchart which shows the operational flow in the first embodiment aspect of a CMOS integrated circuit failure diagnosis apparatus according to the present invention.

An example of the operating procedure of the above-noted CMOS integrated circuit failure diagnosis method is shown as a flowchart in FIG. 9.

Specifically, after starting, at step S1 the required test pattern information is sent from the test pattern storage unit 1, at step S2 a prescribed functional test and Iddq test are performed with respect to a prescribed CMOS integrated circuit, and at step S3 the results from these tests are stored in the test results storage unit 6.

Then, at step S4 circuit information with regard to the above-noted CMOS integrated circuit is read out from the circuit data storage unit 2, and at step S5 a logic simulation is performed by the logic simulator 5, for the internal circuit of the CMOS integrated circuit as questioned, the results thereof being stored in the simulation results storage unit 7 at step S6.

Thereafter, processing proceeds to step S7 at which a judgment is made as to whether or not the CMOS integrated circuit passed the functional test. If it did not pass, processing proceeds to step S8, at which the judgment is made that it is not possible to diagnose this CMOS integrated circuit, and the routine is ended.

Figure 10:
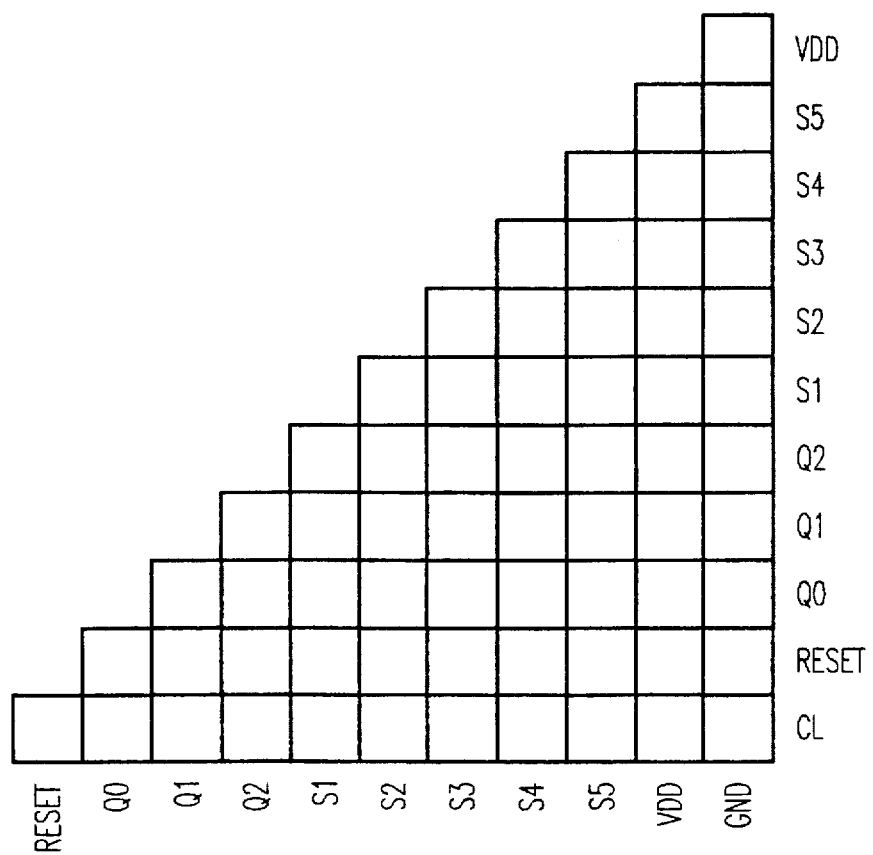
FIG. 10 is a drawing which shows an example of a failure candidate set for the case of using the circuit shown in FIG. 2.
Figure 11:
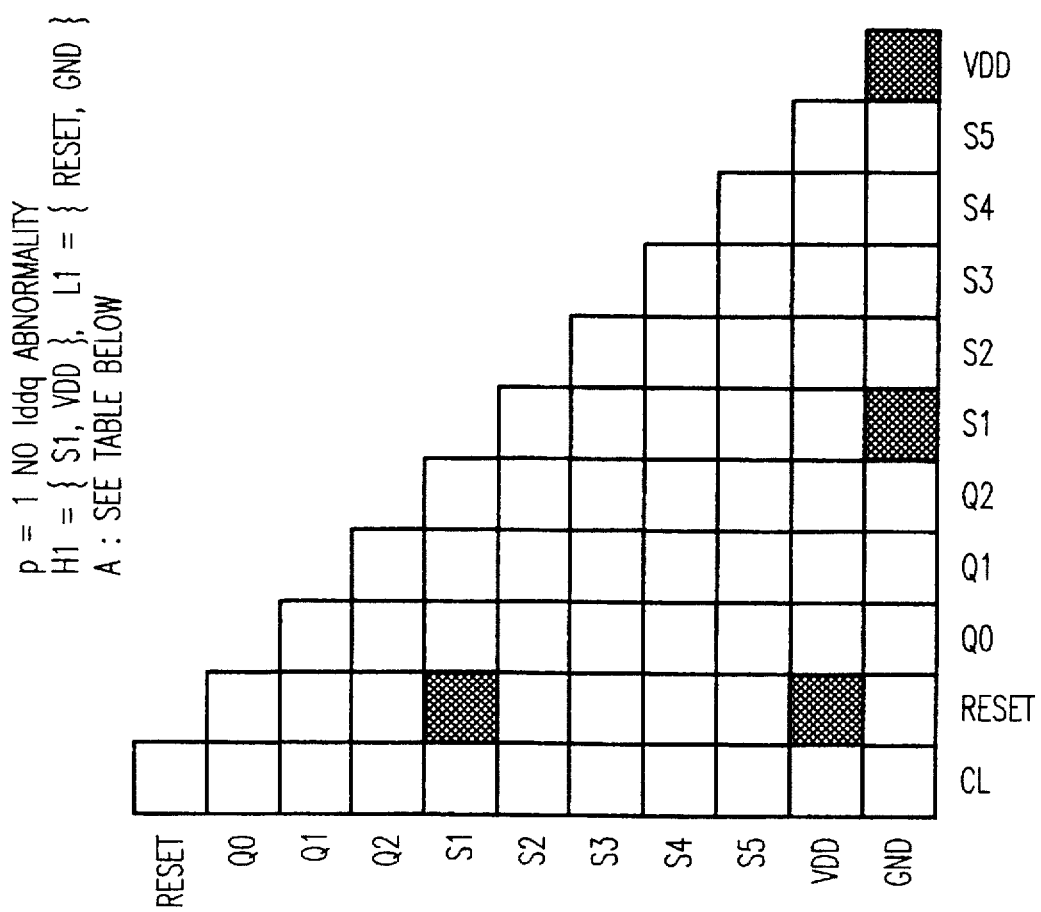
FIG. 11 through FIG. 20 are drawings which show, for each of the respective test patterns in the case in which there is no Iddq abnormality (P=1, 2, 3, 4, 9, 10, 11, 12, 15, 16) a set of combinations of signal lines in the set shown in FIG. 10 for which there is the danger of failure, from the simulation results with these patterns applied.
Figure 12:
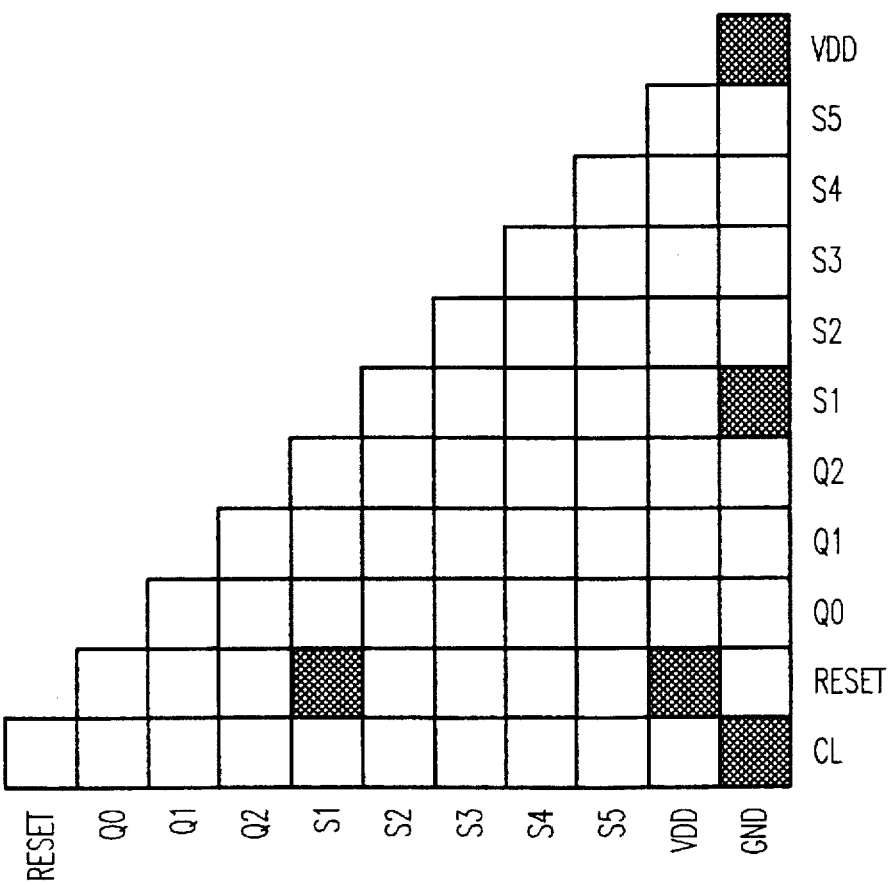
Figure 13:
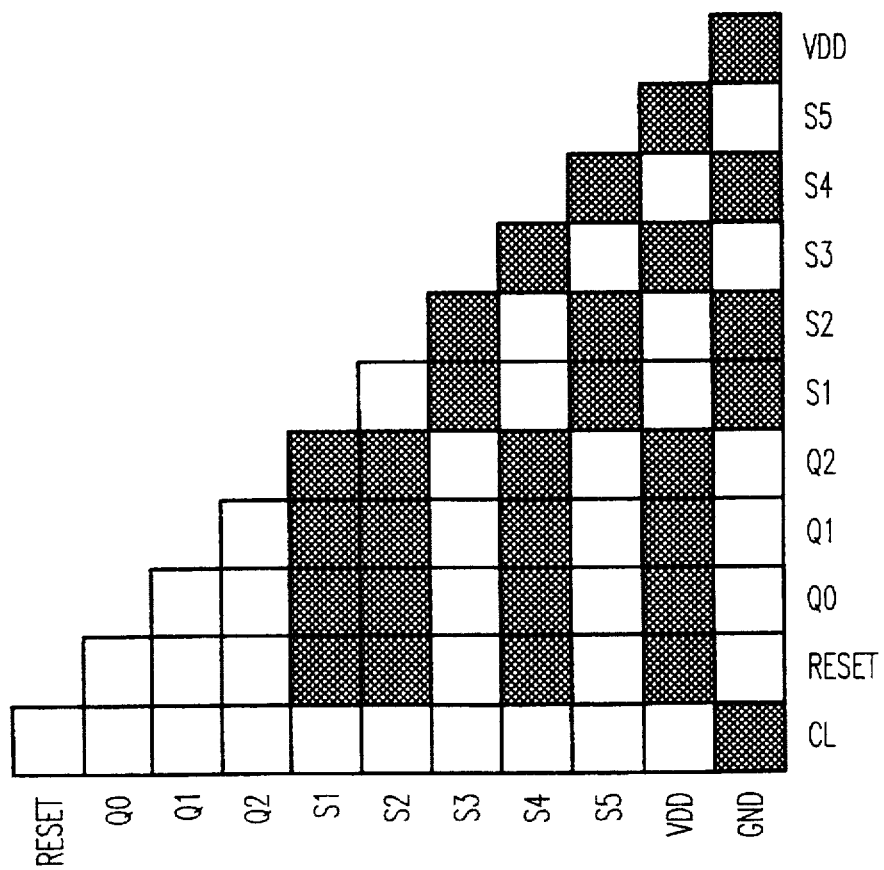
Figure 14:
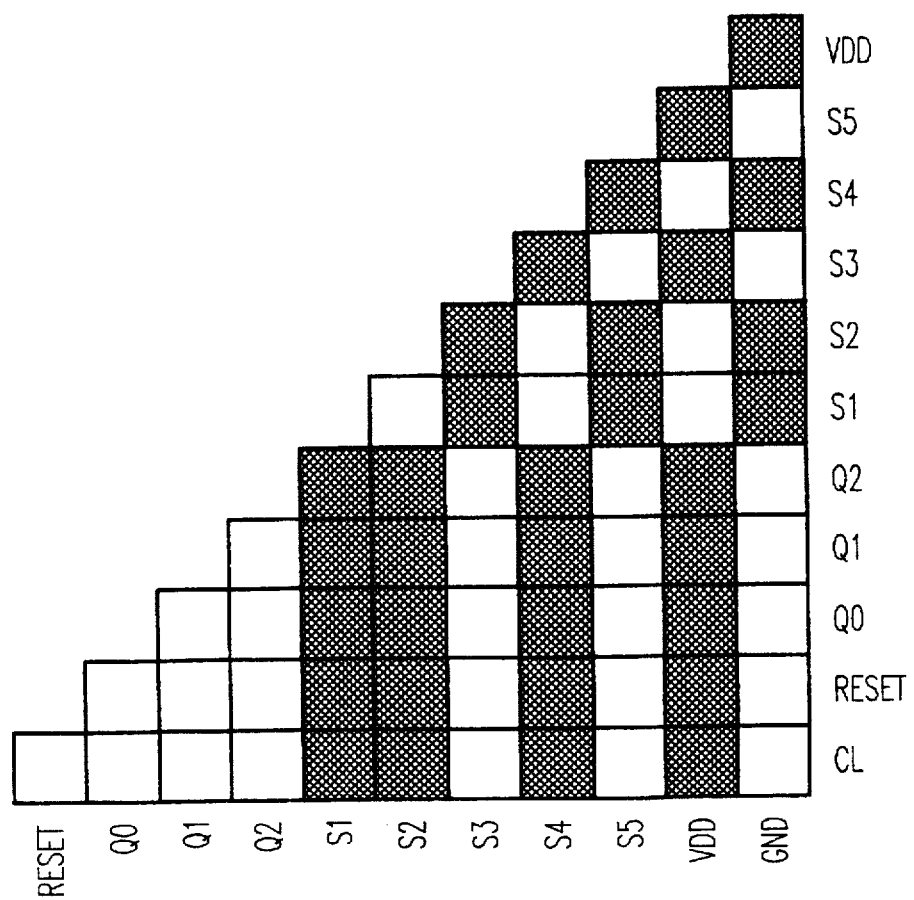
Figure 15:
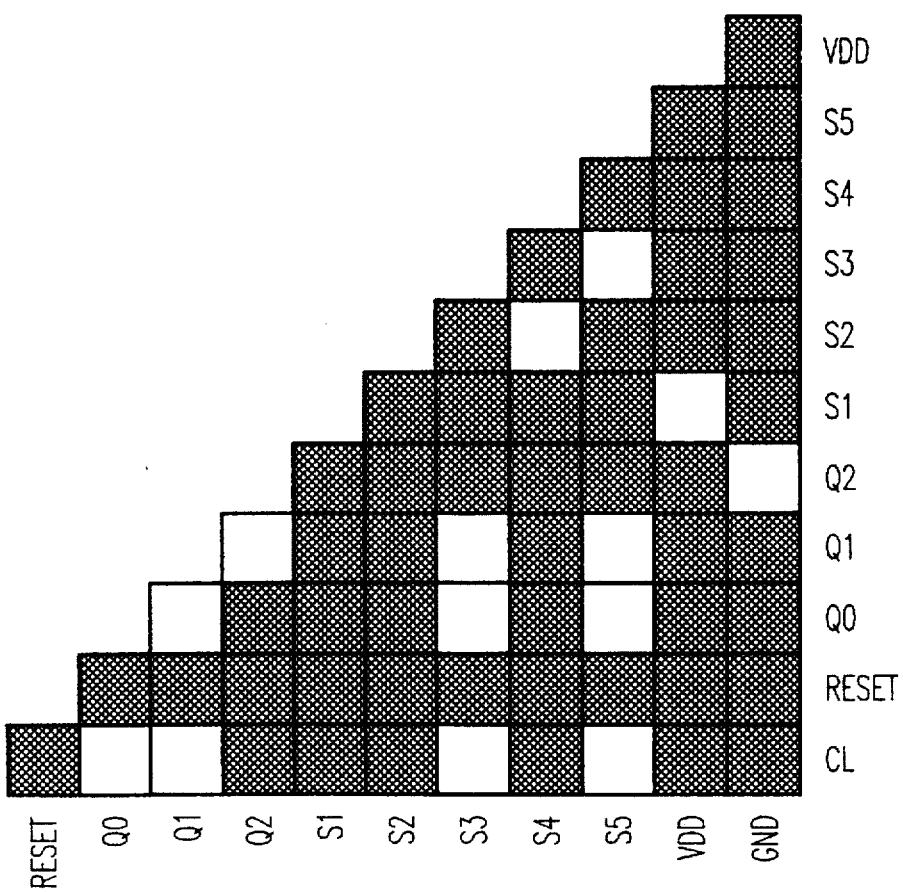
Figure 16:
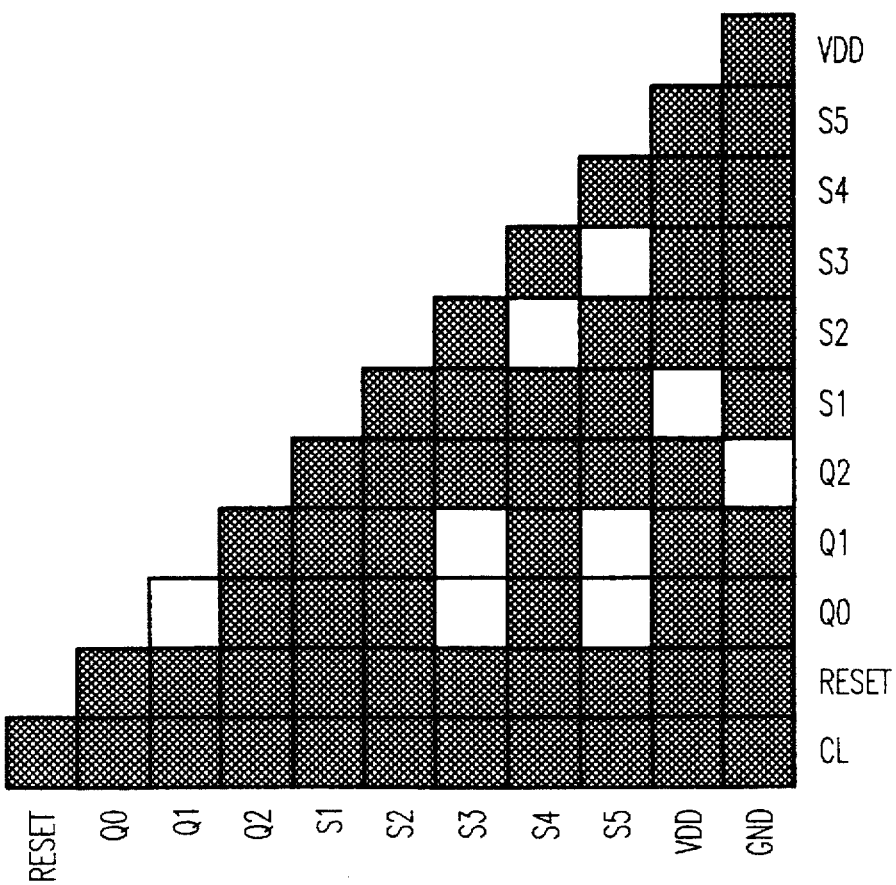
Figure 17:
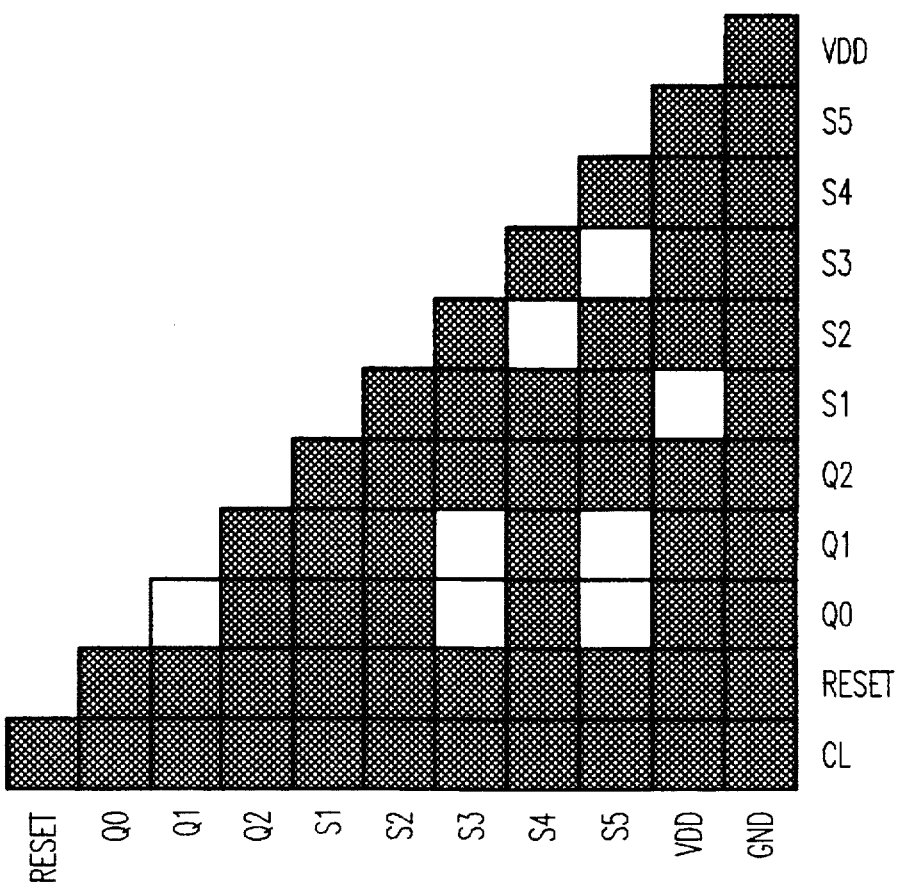
Figure 18:
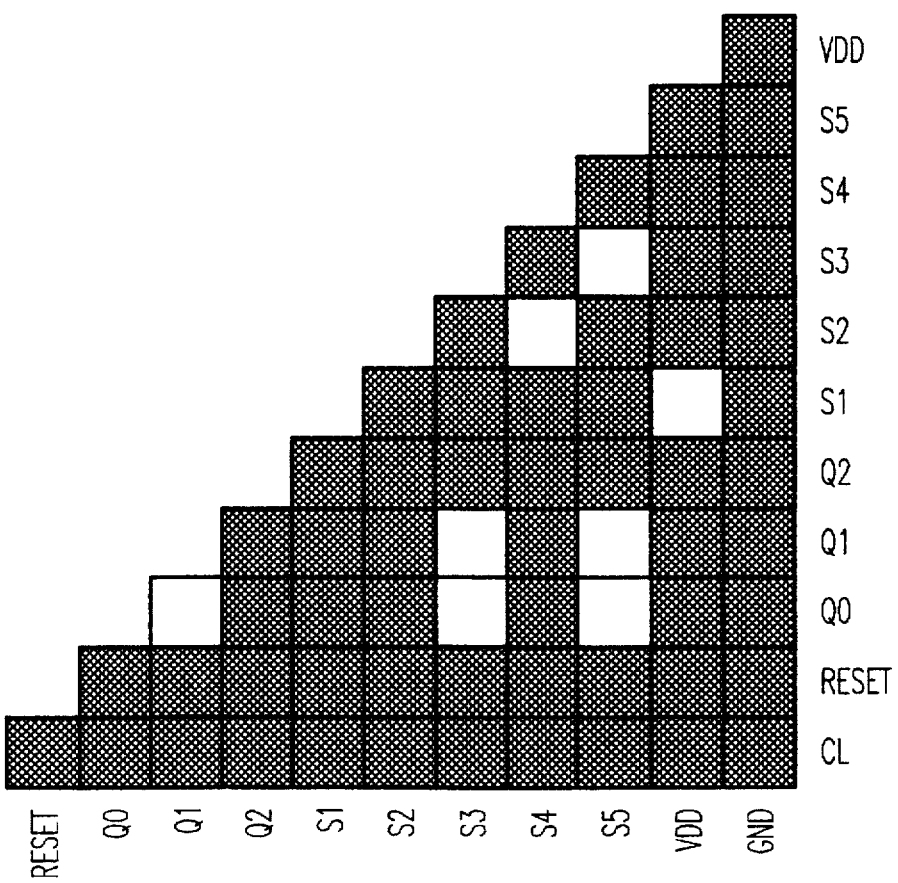
Figure 19:
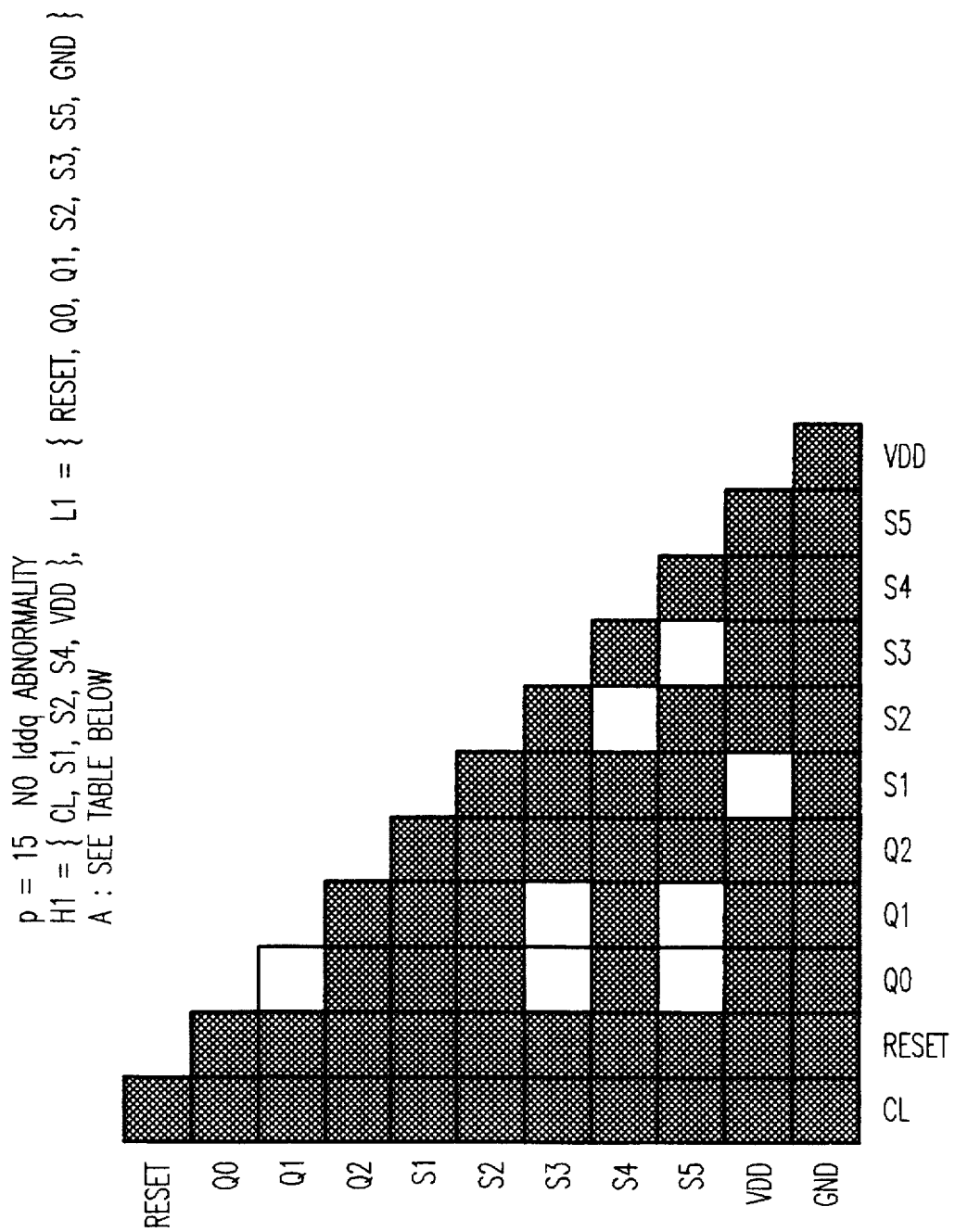

However, if the result at step S7 is that the integrated circuit passed the functional test, processing proceeds to step S9, as which, as shown in the example of FIG. 10, the set S of all of the signal lines of the CMOS integrated circuit (including the power supply and ground lines) is created, and at step S10, the failure candidate set A for the failure candidate signal line combination C(S, S) is created from this set S of all of the signal lines.

Specifically, the set in FIG. 10 is obtained by selecting from the mutual combinations of input/output terminals and internal signal lines shown in FIG. 2, combinations of signal lines that are failure candidates.

Next, at step S11 the 1st pattern (P=1) is applied to the CMOS integrated circuit, and at step S12 the Iddq test results when this pattern P is applied are read out.

At step S13, a judgment is made as to whether or not there is an Iddq abnormality in the CMOS integrated circuit a the point at which the individual patterns (P) are applied thereto, and if the result is yes, processing proceeds to step S17, at which a judgment is made as to whether or not the test pattern (P) is the last pattern.

If the result was no at step S13, processing proceeds to step S14, at which the simulation results when the above-noted test pattern is applied are read out, and at step S15, the set Hp of signal lines indicating a signal value of 1 and the set Lp of signal lines indicating a signal value of 0 are determined, and at which the set C(Hp, Lp) of combinations of signal lines between which a short circuit does not exist is determined.

Thereafter, as step S16, the above-noted set C(Hp, Lp) is subtracted from the set A which was determined at step S10, to create the set A of signal line combinations that are short circuit failure candidates.

Next, processing proceeds to step S17, at which a judgment is made as to whether or not the test pattern (P) is the last pattern. If it is, processing proceeds to step S18, at which the failure candidate set A is output. If the result at step S17 was no, the next test pattern is selected and return is made to step S12, from which the above-noted operations are repeated.

FIG. 11 to FIG. 21 show, for the circuit shown in FIG. 2 and the case in which the test patterns shown in FIG. 3 are sequentially applied to the CMOS integrated circuit device under test, the signal line combinations for each of the test patterns P=1, 2, 3, 4, 9, 10, 11, 12, 15, 16) that are predicted as having a short circuit, by collecting the test patterns for which, as shown in FIG. 4, there is not Iddq abnormality, taken from the table shown in FIG. 6, which establishes a relationship between the test patterns for which there was not Iddq abnormality and the simulation results, the white boxes in these drawings indicating signal line combinations predicted as having a short circuit failure.

Figure 20:
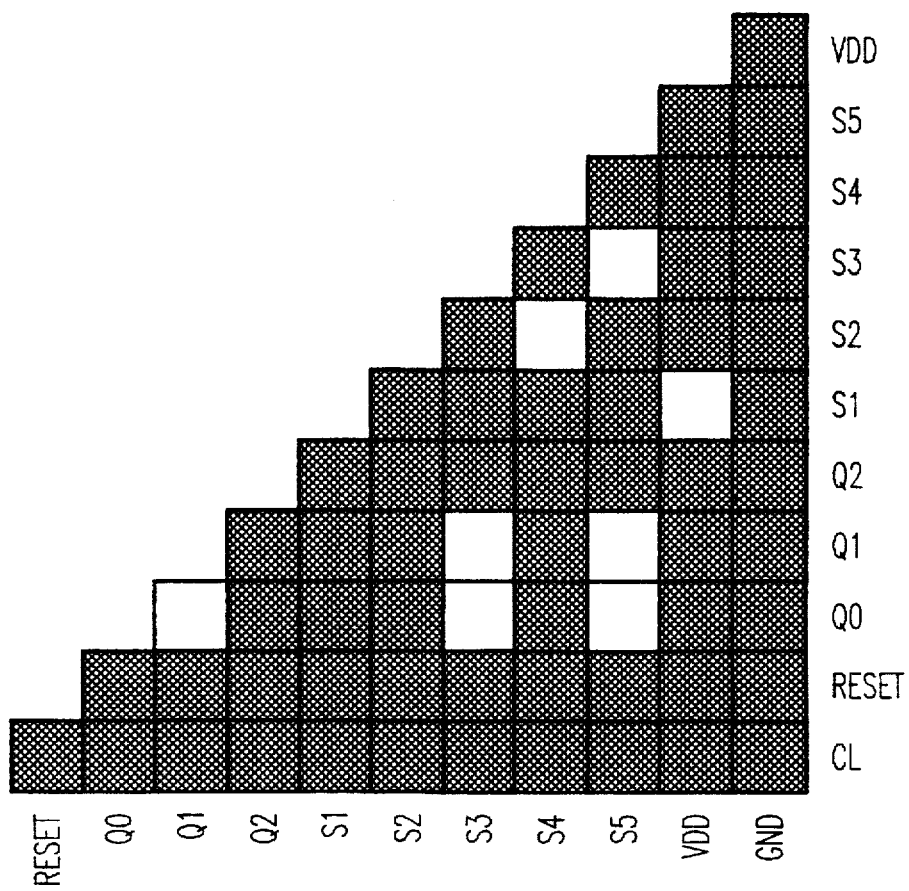

Therefore, if patterns P=1 through P=16 are sequentially applied and a comparison is made with the corresponding simulation results, the signal line combinations at which the judgment that there is no failure (the black blocks) successively increase in number, until finally, as shown in FIG. 20, there are short circuit failure candidates at 8 locations.

Next, the second embodiment aspect of a CMOS integrated circuit failure diagnosis apparatus 100 according to the present invention will be described.

In the first embodiment aspect of a CMOS integrated circuit failure diagnosis apparatus 100 according to the present invention, whereas only the cases in which there was no Iddq abnormality in the Iddq test were treated, in the second embodiment aspect, only the cases in which there is an Iddq abnormality in the Iddq test are treated.

Therefore, while the configuration of the apparatus used in the second embodiment aspect of the present invention is substantially the same as that shown in FIG. 1, the algorithm of the failure location judgment unit 8 is different from that in the first embodiment aspect.

Specifically, this embodiment aspect uses the following method to make a judgment of failure location. First, as a result of the Iddq test the patterns for which an abnormality occurred are collected from the test results storage unit, these being called F. These are, for example as shown in FIG. 4, patterns 5, 6, 7, 8, 13, 14, 17, and 18, so that F={5, 6, 7, 8, 13, 14, 17, 18}. Next, the signal values of each signal line at internal parts of the circuit are obtained from the simulation results for application of each pattern. In the case of the circuit of FIG. 2, this is as shown in FIG. 7.

The set of signal lines indicating a signal value of 1 when the pattern p∈F, for which an Iddq abnormality was detected, is applied is Hp, and the set of signal lines indicating a signal value of 0 is Lp. For example, an Iddq abnormality is detected for pattern 5, with H5={C1, Q0, S1, S3, S4, VDD} and L5={RESET, Q1, Q2, S2, S5, GND}.

Next, we will determine C (Hp, Lp). If we observe the elements {i, j} of the results of this determination, it can be seen that there is a possibility of a short circuit between the signal line i and the signal line j, and further that there is no short circuit between signal lines indicated by elements not included in C(Hp, Lp).

The reason for this is that, for the test pattern p, the signal lines i and j indicate differing signal values and an Iddq abnormality was detected. For the combination of signal lines indicated by elements that are not included in C(Hp, Lp), because all the signal lines have the same signal value, even if there were to be a short between them, there is no Iddq abnormality detected.

By determining [p∈F∩]C (Hp, Lp), it is possible to determine the combination of signal lines which are candidates for short circuit failure.

For the circuit shown in FIG. 2, this is as follows.

[p∈F∩]C (Hp, Lp)={{RESET, S1}, {Q0, Q1}, {Q1, S4}, {S1, S5}, {S2, S4}, {GND, S1}, {Q0, S2}, {RESET, VDD}, {S5, VDD}}

Thus, there is the possibility of a short circuit failure between these ten combinations of signal lines, and indeed there actually is a short circuit between S2 and S4. However, since the above combinations include the VDD and GND being shorted, the list is narrowed to 9 combinations when this combination is eliminated. The results are output as the diagnosis results 9.

Figure 22:
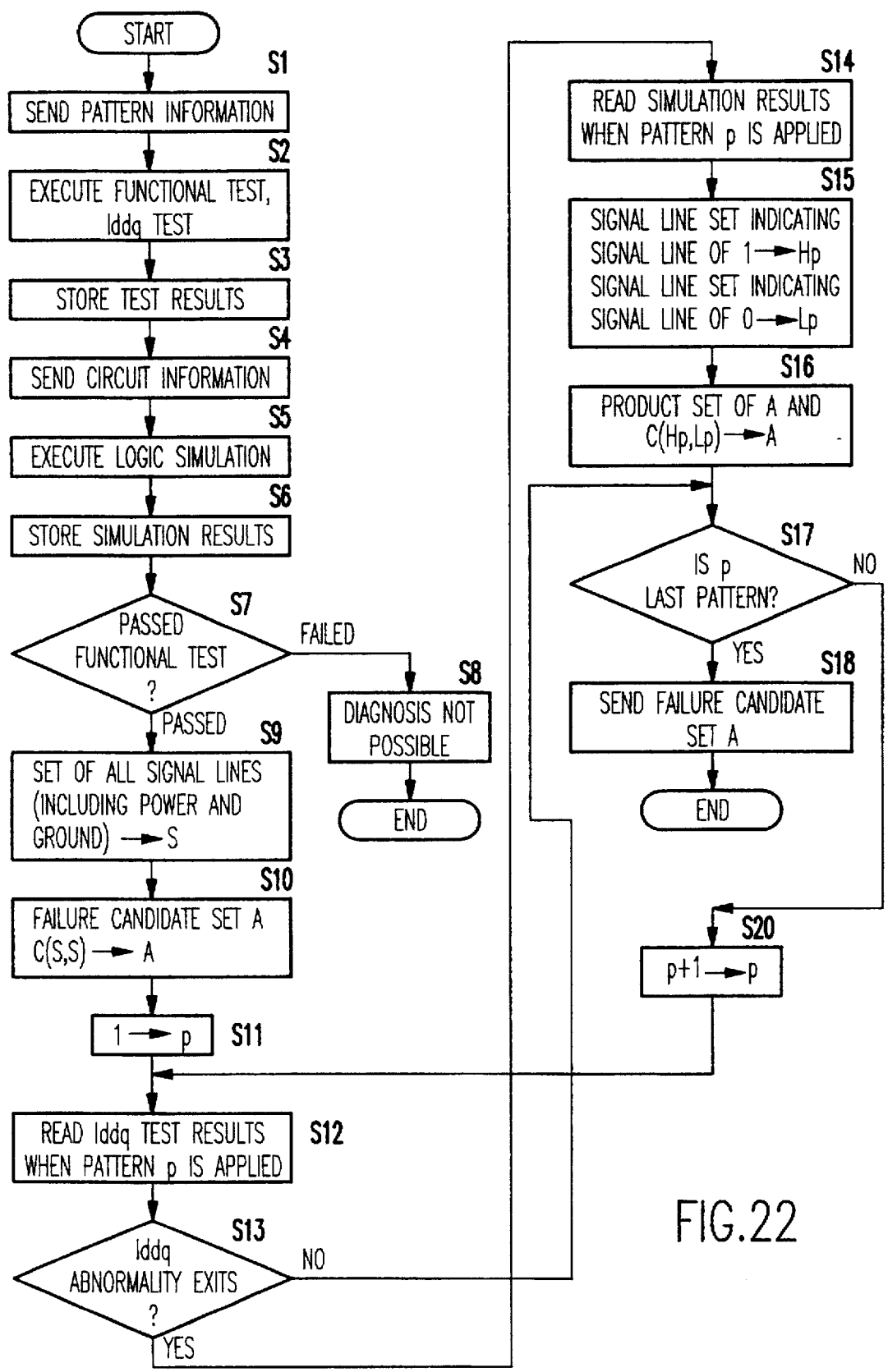
FIG. 22 is a flowchart which shows the operating procedure in the second embodiment aspect of a CMOS integrated circuit failure diagnosis apparatus according to the present invention.

An example of the operating procedure of the above-noted second embodiment aspect of an CMOS integrated circuit failure diagnosis method is shown as a flowchart in FIG. 22.

While this flowchart of this embodiment is substantially the same as the flowchart shown in FIG. 9, which shows the first embodiment aspect, it differs in that, based on the results of the judgment as step S13, the flow thereafter is the opposite of that in FIG. 9, that at step S16, the product set of the set A which was determined at step S10 and the above-noted set C (Hp, Lp) is determined, and that the set A is created as a set of short circuit failure candidates.

Next, the third embodiment aspect of a CMOS integrated circuit failure diagnosis apparatus 100 according to the present invention will be described.

While the configuration of the apparatus used in the second embodiment aspect of the present invention is substantially the same as that shown in FIG. 1, the algorithm of the failure location judgment unit 8 is different from that used in the first and second embodiment aspects.

Specifically, the above-noted failure location judgment unit has both the function of the first embodiment aspect and the function of the second embodiment aspect.

More specifically, with regard to the circuit that is shown in FIG. 2, at the failure location judgment unit 8 in the first embodiment aspect, the judgment is made that a possibility of a failure exists at the locations indicated by {Q0, Q1}, {Q0,S3}, {Q0, S5}, {Q1, S3}, {Q1, S5}, {S2, S4}, and {S3, S5} and in the failure location judgment unit 8 in the second embodiment aspect, the judgment is made that a possibility of a failure exists at the locations indicated by {RESET, S1}, {Q0, Q1}, {Q1, S4}, {S1, S5}, {S2, S4}, {GND, S1}, {Q0, S2}, {RESET, VDD}, and {S5, VDD}.

In this embodiment aspect, the failure location judgment unit extracts those failure candidates which are common to both of the above results. Thus, it judges that only {Q0, Q1} and {S2, S4} are short circuit failure location candidates. These results are output as the diagnosis results 9.

Figure 23A:
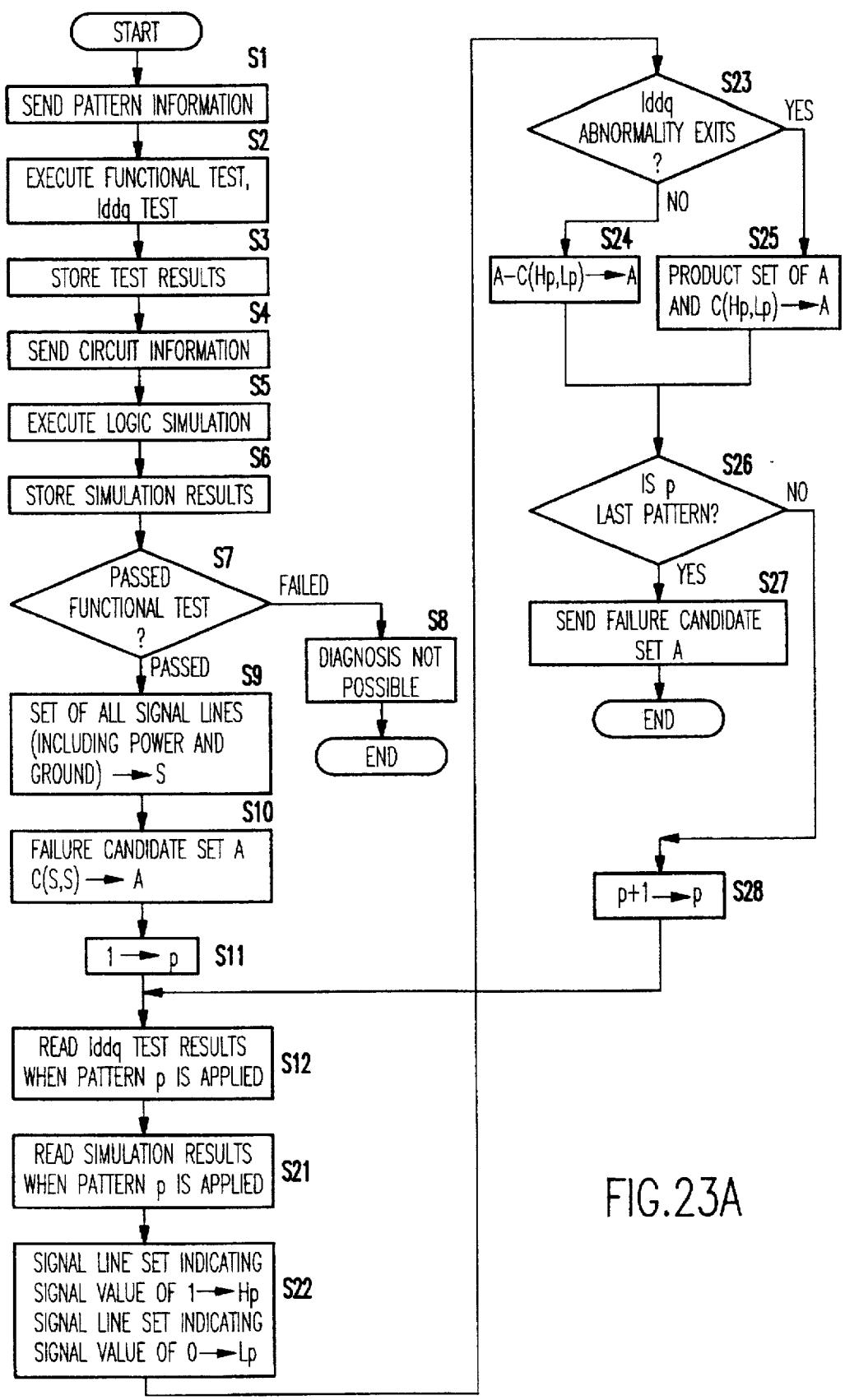
FIG. 23A is a flowchart which shows the operating procedure in the third embodiment aspect of a CMOS integrated circuit failure diagnosis apparatus according to the present invention.

An example of the operating procedure of the above-noted third embodiment aspect of a CMOS integrated circuit failure diagnosis method is shown as a flowchart in FIG. 23A.

Specifically, the steps from step S1 to S12 are the same as shown in FIG. 9 and will not be repeated here, the steps thereafter, which differ from those of FIG. 9 being described below.

At step S12, the 1st test pattern (P=1) is applied to the CMOS integrated circuit and the Iddq test results when this pattern applied are read out, after which processing proceeds to step S21, at which the results of a simulation with the above-noted test pattern applied are read out. Then, at step S22 the set Hp of signal lines indicating a signal value of 1, the set Lp of signal lines indicating a signal value of 0, and the set C (Hp, Lp) of signal line combinations at which a short does not exist are determined.

Next, as step S23, a judgment is made as to whether or not an Iddq abnormality occurs in the CMOS integrated circuit when each of the test patterns (P) is applied. If there is no Iddq abnormality, processing proceeds to step S24, at which the set A of signal line combinations that are short circuit candidates is determined by subtracting the above-noted set C (Hp, Lp) from the set A as determined at step S10.

If, however, the result was yes at step S23, processing proceeds to step S25, at which the product set of the set A as determined in step S10 and the above-noted set C is determined, the set A being created as the set of signal line combinations that are short circuit candidates.

Next, processing proceeds to step S26, at which a judgment is made as to whether or not the test pattern (P) is the last pattern. If it is, processing proceeds to step S27, at which the failure candidate set A is output and the routine is ended. If the result at step S26 was no, however, the next test pattern is selected and return is made to step S12, from which the above-noted operations are repeated.

Next, the fourth embodiment of an CMOS failure diagnosis apparatus 100 according to the present invention will be described.

While the configuration of the apparatus used in the fourth embodiment aspect of the present invention is substantially the same as that shown in FIG. 1, the algorithm of the failure location judgment unit 8 is different from that used in the first, second, and third embodiment aspects.

Specifically, the above-noted failure location judgment unit 8, features weighting information added to the functions of the above-noted first, second, and third embodiment aspects. That is, at the failure location judgment unit 8, a prediction is made of the failure location, based on the results of $C(S, S)-[p \in G \cup ]C(Hp, Lp)$, and in the failure location judgment unit 8, with G having n elements, and G' resulting from eliminating m elements from G, there exists a failure with a weight of (n-m)/n at least between signals indicated by $C(S, S)-[p \in G' \cup ]C(Hp, Lp)$.

This results is displayed at the diagnosis results display means 9.

Figure 23B:
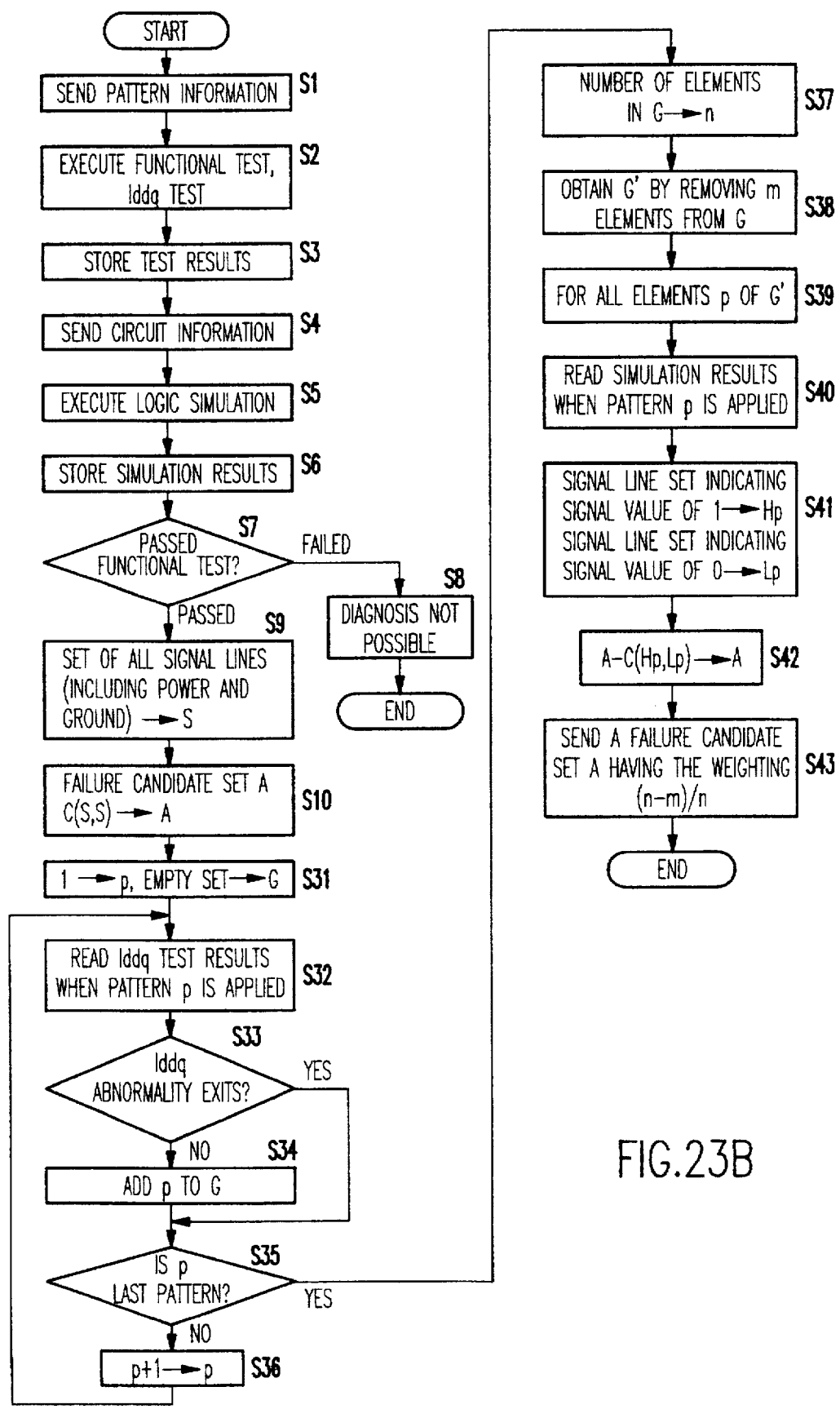
FIG. 23B is a flowchart which shows the operating procedure in the fourth embodiment aspect of a CMOS integrated circuit failure diagnosis apparatus according to the present invention.

The above-noted fourth embodiment aspect of the present invention will now be described with reference being made to the flowchart shown in FIG. 23B.

Because steps S1 through S10 are the same as in the third embodiment aspect, which is shown in the flowchart of FIG. 23A, they will not be described again at this point.

At step S31, an empty set G is created from the failure candidates A obtained at step S10.

The failure candidate set A has the following initial values.

A = {(RESET, CL), (Q0, CL), (Q0, RESET), (Q1, CL), (Q1, RESET), (Q1, Q0), (Q2, CL), (Q2, RESET), (Q2, Q0), (Q2, Q1), (S1, CL), (S1, RESET), (S1, Q0), (S1, Q1), (S1, Q2), (S2, CL), (S2, RESET), (S2, Q0), (S2, Q1), (S2, Q2), (S2, S1), (S3, CL), (S3, RESET), (S3, Q0), (S3, Q1), (S3, Q2), (S3, S1), (S3, S2), (S4, CL), (S4, RESET), (S4, Q0), (S4, Q1), (S4, Q2), (S4, S1), (S4, S2), (S4, S3), (S5, CL), (S5, RESET), (S5, Q0), (S5, Q1), (S5, Q2), (S5, S1), (S5, S2), (S5, S3), (S5, S4), (VDD, CL), (VDD, RESET), (VDD, Q0), (VDD, Q1), (VDD, Q2), (VDD, S1), (VDD, S2), (VDD, S3), (VDD, S4), (VDD, S5), (GND, CL), (GND, RESET) (GND, Q0), (GND, Q1), (GND, Q2), (GND, S1), (GND, S2), (GND, S3), (GND, S4), (GND, S5), (GND, VDD)}

At step S32, the Iddq test results indicated in FIG. 4 are read out, and in the steps from S33 to S37 the pattern numbers for which the Iddq test was passed are selected and the empty set G={1,2,3, 4, 9, 10, 11, 12, 15, 16} is prepared.

By doing this, n is established as 10.

Next, at step S38, the number of items m is selected. While the method of selecting this number is arbitrary, it can be, for example, 4, in which case 4 elements would be eliminated from G.

Specifically, this would result in the following.

If {11, 12, 15, 16} were to be removed, the result would be G'={1, 2, 3, 4, 9, 10}.

Next, at step S39 and step S40, with regard to all elements p of G', the simulation results for the application of the test pattern p are read out, and at steps S41 and S42, A is determined by the method shown below.

With p=1, because H1={S1}, L1={RESET}, and C(H1, L1) {(S1, RESET), then A-C(H1, L1) is as follows.

A = {(RESET, CL), (Q0, CL), (Q0, RESET), (Q1, CL), (Q1, RESET), (Q1, Q0), (Q2, CL), (Q2, RESET), (Q2, Q0), (Q2, Q1), (S1, CL), (S1, Q0), (S1, Q1), (S1, Q2), (S2, CL), (S2, RESET), (S2, Q0), (S2, Q1), (S2, Q2), (S2, S1), (S3, CL), (S3, RESET), (S3, Q0), (S3, Q1), (S3, Q2), (S3, S1), (S3, S2), (S4, CL), (S4, RESET), (S4, Q0), (S4, Q1), (S4, Q2), (S4, S1),

-continued (S4, S2), (S4, S3), (S5, CL), (S5, RESET), (S5, Q0), (S5, Q1), (S5, Q2), (S5, S1), (S5, S2), (S5, S3), (S5, S4), (VDD, CL), (VDD, RESET), (VDD, Q0), (VDD, Q1), (VDD, Q2), (VDD, S1), (VDD, S2), (VDD, S3), (VDD, S4), (VDD, S5), (GND, CL), (GND, RESET), (GND, Q0), (GND, Q1), (GND, Q2), (GND, S1), (GND, S2), (GND, S3), (GND, S4), (GND, S5), (GND, VDD)}

With p=2, because H2={RESET, S1} and L2={ }, A is not updated.

With p=3, because H3={S1, S2, S4} AND L3={RESET, Q0, Q1, Q2, S3, S5}, we have the following.

C(H$_3$, L$_3$) = {(S1, RESET), (S1, Q0), (S1, Q1), (S1, Q2), (S1, S3), (S1, S5), (S2, RESET), (S2, Q0), (S2, Q1), (S2, Q2), (S2, S3), (S2, S5), (S4, RESET), (S4, Q0), (S4, Q1), (S4, Q2), (S4, S3), (S4, S5)}

From A−C(H3, L3), A is updated as follows.

A = {(RESET, CL), (Q0, CL), (Q0, RESET), (Q1, CL), (Q1, RESET), (Q1, Q0), (Q2, CL), (Q2, RESET), (Q2, Q0), (Q2, Q1), (S1, CL), (S2, CL), (S2, S1), (S3, CL), (S3, RESET), (S3, Q0), (S3, Q1), (S3, Q2), (S4, CL), (S4, S1), (S4, S2), (S5, CL), (S5, RESET), (S5, Q0), (S5, Q1), (S5, Q2), (S5, S3), (VDD, CL), (VDD, RESET), (VDD, Q0), (VDD, Q1), (VDD, Q2), (VDD, S1), (VDD, S2), (VDD, S3), (VDD, S4), (VDD, S5), (GND, CL), (GND, RESET), (GND, Q0), (GND, Q1), (GND, Q2), (GND, S1), (GND, S2), (GND, S3), (GND, S4), (GND, S5), (GND, VDD)}

Thereafter A is successively updated for p=4, p=9, and p=10, until A is finally as follows.

A={(Q1,Q0), (S3, Q0), (S3, Q1), (S5, Q0), (S5, Q1), (S4,S2) (S5, S3), (VDD, S1), (GND, Q2)}

From this, because n=10 and m=4, the failure candidate set A for a failure occurrence possibility with a weight of (10−4)/10=0.6 is obtained.

Next, the fifth embodiment aspect of the present invention will be described. The configuration of the failure diagnosis apparatus 100 in this embodiment aspect is the same as shown in FIG. 1. However, in this embodiment aspect, as the failure location judgment unit 8, a failure location judgment unit 8 is used which adds a different weighting information than in the fourth embodiment aspect.

Specifically, although a prediction of the failure location is made based on the results of [p∈F∪]C (Hp, Lp), in the failure location judgment unit 8 in the previous embodiment, but in the unit 8 of this embodiment, the judgement is made in such a way that, with n elements in the set F, m elements are eliminated to form the set F′, so that there is exists a failure with a weight of (n−m)/n at least between signals indicated by [p∈F∪]C(Hp, Lp).

The sixth embodiment aspect of the present invention will explained next. The configuration of the failure diagnosis apparatus 100 in this embodiment aspect is the same as shown in FIG. 1. However, in this embodiment aspect, as the failure location judgment unit 8, a failure location judgment unit 8 is used which adds a different probability information than in the above-described embodiments. This failure location judgment unit 8 has a function which adds the probability information of the fourth embodiment aspect and a function which adds the probability information of the fifth embodiment aspect.

This failure location judgment unit 8 expresses the probably that a failure exists between signal lines as the product two probabilities, these being the probability of a failure existing calculated as C(S, S)−[p∈G′∪]C(Hp, Lp) and the probability that a failure existing calculated as [p∈F∩]C (Hp, Lp). The result is output as the diagnosis results 9.

Next the seventh embodiment aspect of the present invention will be described. The configuration of the failure diagnosis apparatus 100 in this embodiment aspect is the same as shown in FIG. 1. However, in this case the failure location judgment unit 8 is configured chiefly to detect shorts with respect to the power supply line and shorts with respect to the ground line.

That is, considering short circuit failures in a CMOS integrated circuit, shorts to a power supply line and shorts to a ground line are much more common than shorts between signal lines (which do not include power supply and ground lines). For this reason, in this embodiment aspect, the failure location judgment unit 8 is specialized for shorts with respect to the power supply line and the ground line, and thereby performs failure judgment with good efficiency.

By specializing with respect to shorts to a power supply line or a ground line, considering that the equation used to judge a failure would have a logic value 1 for the power supply line and a logic value 0 for the ground line, the equation would be C({VDD}, S−{VDD,GND})−[p∈G∪]C({VDD},Lp)− for a short with respect to the power supply line and

C({GND}, S−{VDD, GND})−[p∈G∪]C({GND}, Hp)

for a short with respect to the ground line. In the above, it is assumed that the power supply line VDD and the ground line GND are not themselves shorted to one another.

The meaning of these equations is that, in the case of a short circuit failure with respect to the power supply line, of the simulation results of values of each signal line with patterns to be applied for which an Iddq abnormality is not detected, there cannot be a short circuit failure between a signal line indicating a logic value of 0 and the power supply line, and that it can be predicted that a signal line located inside of the circuit when each of the patterns are applied, respectively, which does not indicate a logic value of 0 even once for all patterns for which an Iddq abnormality is not detected can be suspected of having a short circuit failure with respect to the power supply line.

In the same manner, for the case of a short circuit failure with respect to the ground line, a signal line which does not indicate a logic value of 1 even once can be suspected of having a short circuit failure with respect to the ground line.

The failure location judgment unit 8 has a function which, based on the results of a simulation of the signal lines of the internal circuit with patterns applied for which an Iddq abnormality is not detected, predicts that a signal line which does not indicate a value of 0 even once is suspect of a short circuit failure with respect to the power line, and which predicts that a signal line which does not indicate a value of 1 even once is suspect of a short circuit failure with respect to the ground line.

Figure 8:
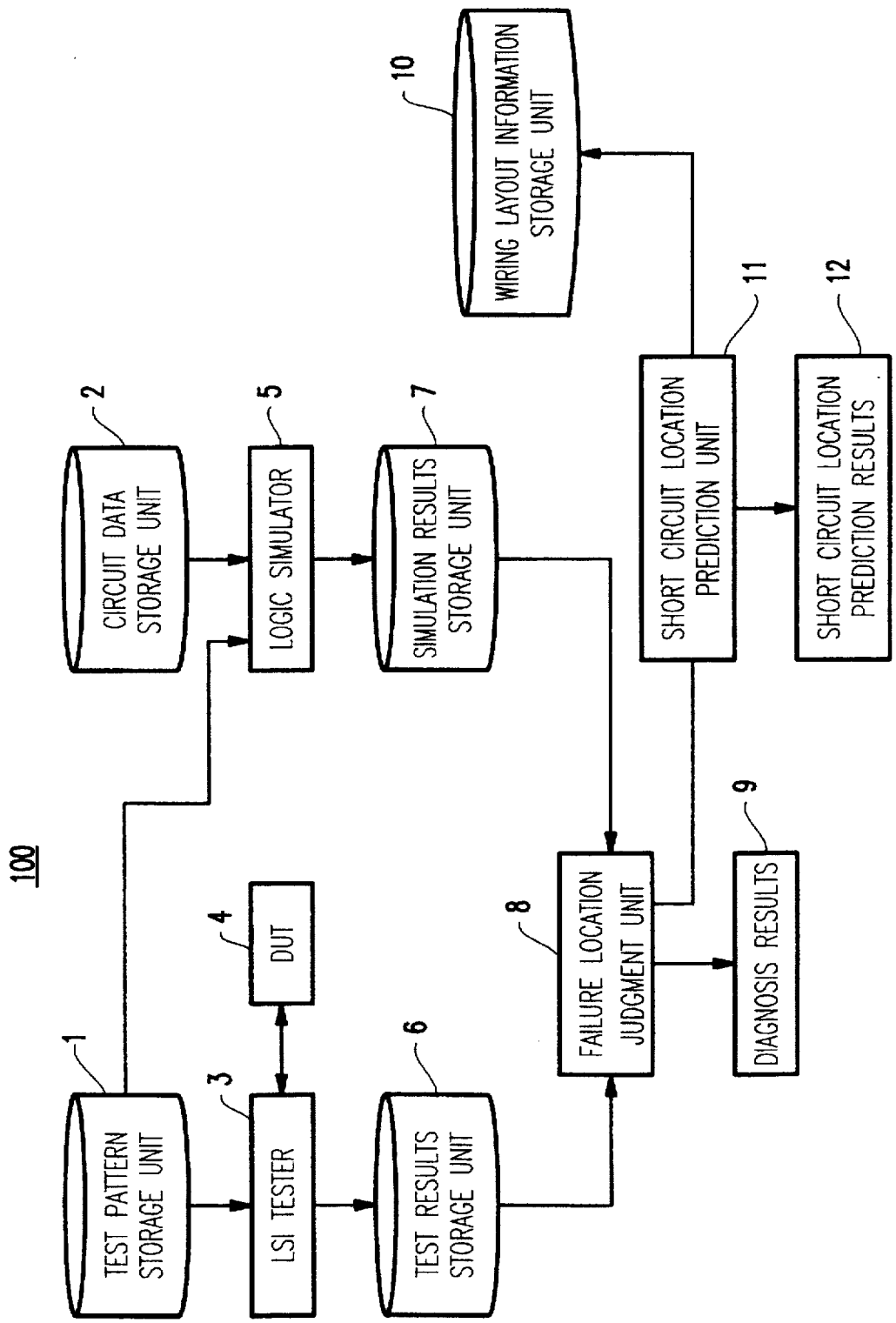
FIG. 8 is a block diagram showing the configuration of the eight embodiment aspect of the present invention.

FIG. 8 shows the eight embodiment aspect of the present invention. In this embodiment aspect, a wiring layout information storage unit 10 and a short circuit location prediction unit 11 have been added anew.

The wiring layout information storage unit 10 has stored in it the position information of the wiring on the chip of the device under test (DUT) and information which relates this to the signal lines. The short circuit location prediction unit 11 obtains the short circuit failure position information from the failure location judgment unit 8 and information which is stored in the wiring layout information storage unit 10, and indicates a location on the chip at which a short circuit is actually occurring.

This indicates a part at which signal lines are crossing each other or are in mutual proximity. The results are output as short location prediction results to the short location prediction results display means 12.

A diagnosis method which is common to the above-noted first through eighth embodiment aspects is that of, with respect to a CMOS integrated circuit which exhibits no abnormality but exhibits an Iddq abnormality only for specific test patterns, performing failure diagnosis by using the results of a functional test and the results of an Iddq test, the test results of a LSI tester which performs both a functional test and an Iddq test of the CMOS integrated circuit and the results of the simulation of the operation of the above-noted CMOS integrated circuit being used as the basis for judging short circuit failures on the signal lines.

Next, the ninth embodiment aspect of a CMOS integrated circuit failure diagnosis apparatus 100 according to the present invention will be described. The configuration of the ninth embodiment aspect a CMOS integrated circuit failure diagnosis apparatus is substantially the same as that shown in FIG. 1. However, the judgment algorithm of the failure judgment unit 8 is different than that used in the first to eight embodiments.

Specifically, in this embodiment, in the configuration shown in FIG. 1, the above-noted failure location judgment unit 8 has the following configuration.

The configurations is such that, from the above-noted functional test results and above-noted Iddq test results and the result of the simulation, based on the number of 0s and 1s in the results of a simulation of the signal values at internal circuit parts for each individual time when patterns for which an Iddq abnormality is not detected, was applied thereto in the Iddq test, and on the number of 0s and 1s in the results of a simulation of the signal values at internal circuit parts for each individual time when patterns for which an Iddq abnormality is detected was applied thereto in the Iddq test, a prediction is made of the location of a short circuit failure in the above-noted device under test.

In this embodiment aspect, test patterns are applied to the CMOS integrated circuit, which is the device under test, from a test apparatus, and both a functional test and an Iddq test are performed, the test results from that test apparatus and the results of a logic simulation of the internal operation of the above-noted device under test are referred to, and from the simulation results corresponding to individual times when a pattern for which an Iddq abnormality does not occur were applied thereto and/or the simulation results corresponding to individual times when a pattern for which an Iddq abnormality does occur, were applied thereto, the number of patterns of logic values 0 and 1 are counted for the internal signal lines within the above-noted device under test, and a prediction is made of the location of a short circuit of the above-noted signal lines with respect to a power supply line or with respect to a ground line.

According to this embodiment aspect, in using the test results from a functional test and an Iddq test of a CMOS integrated circuit and the results of simulation of the circuit operation of the integrated circuit to perform a prediction of the location of the occurrence of a short circuit failure, the configuration is made so that the number of patterns of 0s and the number of patterns of 1s in the results of a simulation of signal values in an internal circuit corresponding to patterns (test vectors) determined by the LSI tester to be patterns at which an Iddq abnormality is detected and in the results of a simulation of signal values of the internal circuit corresponding to patterns (test vectors) determined by the LSI tester to be patterns at which an Iddq abnormality is not detected is used to predict the location of a failure, this enabling the high-speed prediction of the location of a short circuit failure.

Furthermore, in this embodiment aspect, the test patterns for the purpose of evaluating the device under test the patterns include the input patterns at each individual time (test cycles) and the row of corresponding expected patterns.

The Iddq test is a method of testing which is used in short circuit testing of CMOS integrated circuits, this being called an Iddq test because of the VDD supply current quiescent current that is observed. In this test, the IDD power supply current is measured by applying a test vector to the device under test and allowing the signals to settle (reach the quiescent state).

Next, a specific example of the operation of the ninth embodiment aspect of the present invention, with reference being made to FIGS. 24 through 30.

In this embodiment, a device to be tested DUT 4, having the circuit as shown in FIG. 2 can be used.

The circuit data storage unit 2 has stored in it the circuit information of the circuit shown in FIG. 2.

In this embodiment, the test patterns as shown in FIG. 3, can be used for the device 4 under test (DUT), and these test patterns including the input test patterns at a each individual point in time (test cycle) for the purpose of evaluating the DUT, and a plurality of rows (each row of which is called a pattern) of corresponding expected values.

In this case, the data in the columns for the signals CL and RESET are the signal values to be applied to the DUT (applied signals), and the data in the columns for the signals Q0, Q1, and Q2 are the expected output values from the DUT.

As mentioned above, in FIG. 3, the signal values 0 and 1 each represent the low and high level signals, respectively, and * represents either 0 or 1 (the so-called don't care condition).

Using these test patterns, the LSI tester 3 performs a functional test of the device under test (DUT) 4.

At this point, let us say that the signal line S3 shown in FIG. 2 (the connecting line between the output of the NOR circuit and the 2nd stage of JK flip-flop) has a short circuit failure with respect to the power supply line. Under this condition, assume that the shorting resistance is sufficiently large, so that there is not influence on the logical functioning of the circuit, but when the signal line S3 is at the logic level 0, an abnormally power supply current flows via this shorting resistance (i.e., an Iddq abnormality occurs).

As a result, the test results from the LSI tester 3 are as shown in FIG. 24.

In this example, the functional test passes for all patterns, whereas the Iddq test fails for patterns 3, 4, 7, 8, 11, 12, 13, 14, 15, and 16, but there is no Iddq abnormality detected for the other patterns.

These test results are sent to and stored within the test results storage unit 6.

At the logic simulator 5, a simulation is executed, based on the test patterns sent from the test pattern storage unit 1 and on the circuit data sent from the circuit data storage unit 2, the signal values at each node point within the circuit being obtained for each applied patterns.

This logic simulation is performed with respect to the circuit shown in FIG. 2, the test patterns used for this simulation being the test patterns shown in FIG. 3, and the results of the simulation being as shown in FIG. 5.

The results of this simulation are sent to and stored within the simulation results storage unit 7.

The failure location judgment unit 8 uses the test results from the test results storage unit 6 and the simulation results stored in the simulation results storage unit 7 to perform a judgment of the location of a failure in the device under test (DUT) 4.

The method to judge the location of the failure is as follows.

First, from the test results the patterns for which an Iddq abnormality was not detected (the ordinal number of the patterns for which the Iddq test was passed) are extracted. Specifically, in the example shown in FIG. 24, these are patterns 1, 2, 5, 6, 9, 10, 17, and 18.

Next, the signal values of each signal line (or node) within the circuit of the DUT 4 corresponding to the times at which these patterns are applied to the DUT 4 from the LSI tester 3 are obtained by a simulation by means of the logic simulator 5.

Figures 25, 26:
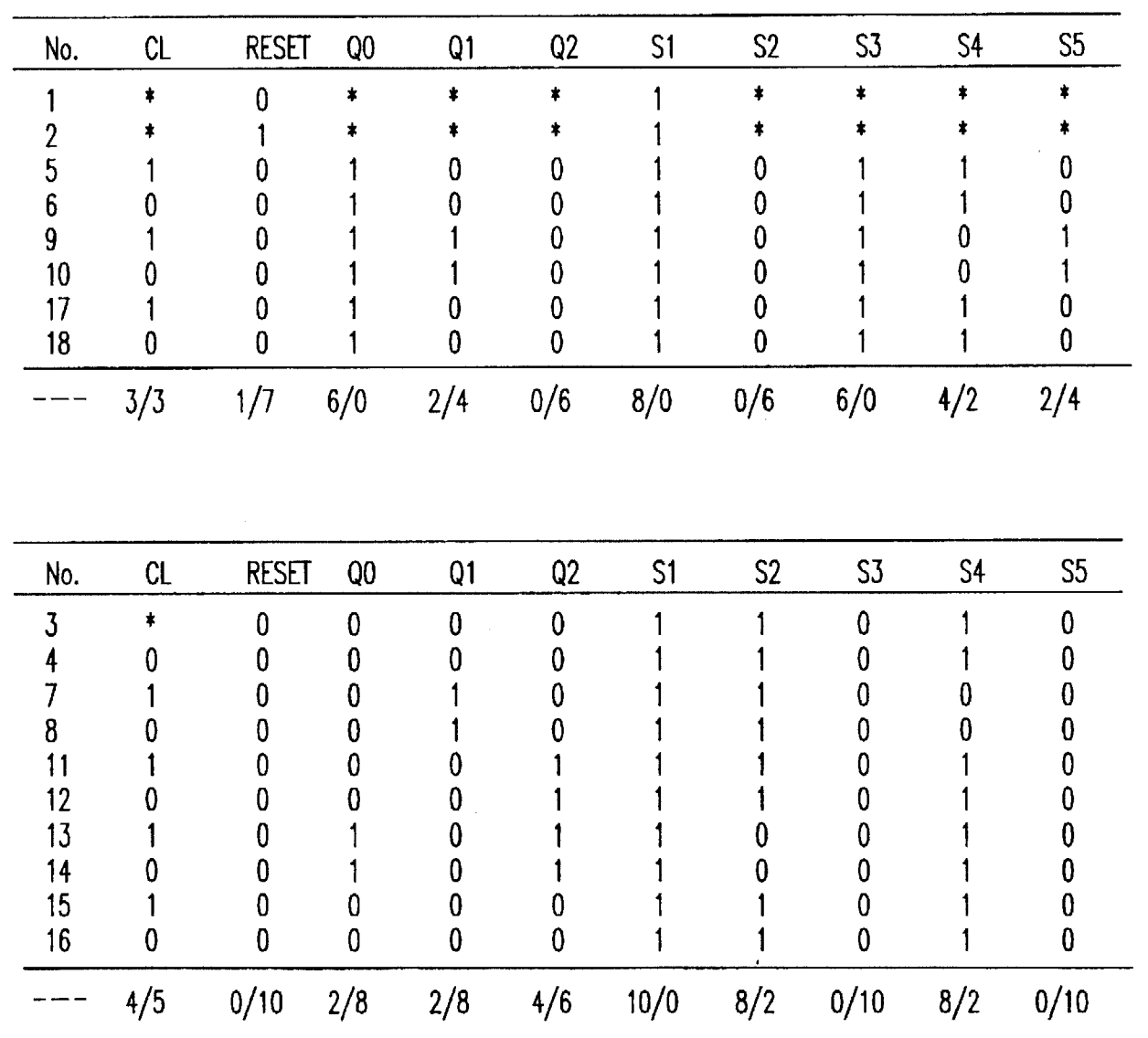

In the case of the logic circuit which is shown in FIG. 2, the results are as shown in FIG. 25. In FIG. 25, the values of m/n at the bottom indicate the number of logic values 1 (m) and the number of logic values 0 (n).

Then the number of patterns (pattern rows) indicating logic values of 0 and 1 is counted for each of the signal lines. In the example shown in FIG. 25, at the node CL the number of patterns indicating 1 is 3, and the number of patterns indicating the value of 0 is 3.

From these results, with regard to a signal line that has no patterns indicating a value of 1, there is a suspicion of a short circuit failure with respect to ground, and with regard to a line that has at least one pattern indicating the value of 1, there is no possibility of a short circuit to the ground line.

For a node or net at which there are no patterns indicating a value of 0, there is a suspicion of a short circuit failure with respect to the power supply line, and for a signal line which has at least one pattern for which the value of 0 is indicated, there is no possibility of a short circuit failure with respect to the power line.

These results, in the form of a thus-obtained failure candidate list, are treated as the failure candidate set A.

From FIG. 25, in the circuit shown in FIG. 2, there is a suspicion of a short circuit failure of signal line Q0 to the power line, of signal line Q2 to the ground line, of signal line S1 to the power line, of signal line S2 to the ground line, and of signal line S3 to the power line.

From the test results (refer to FIG. 24), based on the patterns for which an Iddq abnormality was detected, the results of a simulation of signal line values internal to the circuit of the device under test (DUT) 4 or obtained for each individual time at which those patterns were applied to the DUT 4.

For the circuit shown in FIG. 2, this would be as shown in FIG. 26.

With respect to each of the signal lines, the number of patterns indicating a 0 and the number of patterns indicating a 1 are counted.

As a result, for a node or net of signal lines for which the number of patterns indicating 1 is zero, there is a suspicion of a short circuit failure with respect to the power supply line, and for a signal line for which there are no patterns which indicate a 0, there is a suspicion of a short circuit failure with respect to the ground line.

These results, in the form of a thus-obtained failure candidate list, are treated as the failure candidate set B.

From FIG. 26, in the circuit shown in FIG. 2, there is a suspicion of a short circuit failure of signal line RESET to the power line, of signal line S1 to the ground line, of signal line S3 to the power line, and of signal line S5 to the power line.

The failure candidates which are common to failure candidate set A and failure candidate set B have a high possibility of actually having occurred in the DUT 4.

These results, the failure candidates which are common to failure candidate set A and failure candidate set B, indicate only a short circuit failure of the signal line S3 with respect to the power supply line, this being indeed the short circuit failure that actually exists in the circuit shown in FIG. 2.

The reason that short circuit failures with respect to the power supply line and with respect to this ground line are detected by the above-noted operations is described below.

Figure 27:
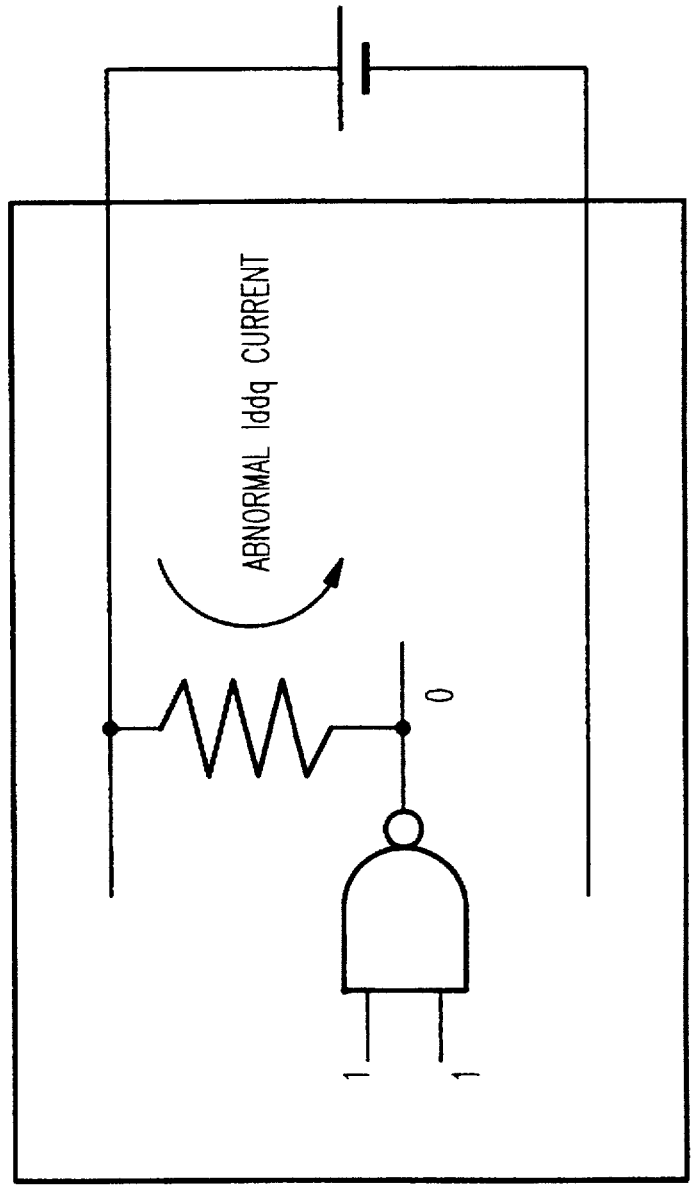
FIG. 27 is a drawing which schematically illustrates the reason for the occurrence of a power supply short circuit in the present invention.

FIG. 27 is a drawing which shows schematically an example of a short circuit with respect to the power supply. In this case, in the case in which the output line of the NAND gate is 0, an abnormal Iddq current flows, resulting in the detection of an Iddq abnormality. When the output line is 1, however, no Iddq abnormality is detected.

That is, if the results of a simulation of this output line of the NAND gate at a time at which a pattern is applied for which an Iddq abnormality was not detected are examined, it can be seen that the output will always be 1 (if the output thereof were to have been 0, an Iddq abnormality would have been detected).

What this means is that in the simulation results, because all the values of this gate output are 1, an examination of the number of patterns indicating 0 and 1 shows that there are zero patterns indicating a value of 0.

This fact means that, speaking with regard to a short circuit to the ground line, in the case of a short circuit failure to the ground line, the number of patterns indicating a value of 1 would be zero.

If we examine the results of a simulation for when patterns are applied for which an Iddq abnormality was detected, with regard to the example shown in FIG. 8, when the NAND output line is 0, it can be seen that an Iddq abnormality would always be detected.

That is, for all the patterns for which an Iddq abnormality was detected, if we examine the results of a simulation at those points in time, we can see that the results of the simulation for the output line would all be 0.

Therefore, a signal line which is always zero for all patterns for which there was an Iddq abnormality detected can be suspected of having a short circuit failure with respect to the power supply line and, stated in reverse, a signal that is always 1 can be suspected of having a short circuit failure with respect to the ground line.

From the results of a simulation for a point in time at which an Iddq abnormality was not detected, and the results of a simulator for a time at which an Iddq abnormality was detected, by selecting commonly suspect failures, it is possible to predict a failure that has actually occurred in the device.

In this embodiment aspect, a failure diagnosis is performed by means of the above-noted operations, and because all that is done is to count the number of patterns of all the patterns at which an Iddq abnormality is not detected at which the expected values on internal signal lines are 0 and 1, it is possible to complete the failure diagnosis instantly.

The results of this failure diagnosis are output as the diagnosis results 9.

Next, the tenth embodiment aspect of the present invention will be described. While this embodiment aspect has the same configuration as shown in FIG. 1, it differs in terms of the functioning of the failure location judgment unit 8, which is different than that of the ninth embodiment aspect.

In the tenth embodiment aspect of the present invention, the failure location judgment unit 8, similar to the case of the ninth embodiment aspect, determines the total number of patterns for which the various signal line values are 0 and 1, from the results of a simulation of the values of internal signal lines corresponding to points in time at which patterns for which an Iddq abnormality in the Iddq test was not detected were applied, and a from the results of a simulation of the values of internal signal lines corresponding to points in time at which patterns for which an Iddq abnormality in the Iddq test was detected were applied.

Then, a judgment of failure candidates is made, starting in sequence from locations having close to a total of 0.

If the results of a simulation of logic values at internal signal lines with the device under test (DUT) 4 corresponding to times when a pattern for which an Iddq abnormality was not detected by the LSI tester 3 was applied, indicate a total of 1 for a value of 0 on the internal signal line S1, a total of 2 for a value of 1 on the internal signal line S2, and a total of 3 for a value of 0 on the internal signal line S3, the judgment is made that there is a high possibility of a short circuit failure of the internal signal line S1 with respect to the power supply line, this followed by lower possibilities of a short circuit failure of the internal signal line S2 with respect to the ground line and of the internal signal line S3 with respect to the power supply line.

In making this type of judgment, if for some reason, for example if the Iddq current is smaller than the prescribed threshold current, so that an Iddq abnormality that should normally be detected is not detected, so that the judgment made is that there is no Iddq abnormality, it could happen that the counting of the totals for 0 and 1 will be in error, and the expression of the possibility of a failure is done to accommodate this situation.

Turning now to an description of the eleventh embodiment aspect of the present invention, this embodiment aspect has the a wiring layout information storage unit 10 and a short circuit location prediction unit 11 added to the circuit configuration of the tenth embodiment, as shown in FIG. 8.

The wiring layout information storage unit 10 has stored in it the position information of the wiring on the chip of the device under test (DUT) and information which relates this to the signal lines.

The short circuit location prediction unit 11 obtains the short circuit failure position information from the failure location judgment unit 8 and information which is stored in the wiring layout information storage unit, and indicates a location on the chip at which a short is actually occurring. This indicates a part at which signal lines are crossing each other or are in mutual proximity. The results are output as short location prediction results to the short location prediction results display means 12.

A method of CMOS circuit failure diagnosis which is common to the above-noted ninth to eleventh embodiments of the present invention is, for example, a CMOS integrated circuit failure diagnosis method which uses a functional test and an Iddq test with respect to a CMOS integrated circuit which exhibits an Iddq abnormality for a specific test pattern in an Iddq test, this method having a first step of using a test pattern for the purpose of performing a functional test of the above-noted CMOS integrated circuit and performing a functional test and an Iddq test of the above-noted CMOS integrated circuit by means of a prescribed LSI tester, a second step of performing an operational simulation with regard to the above-noted CMOS integrated circuit, and a third step of predicting a location of a short circuit failure in a signal line within the above-noted CMOS integrated circuit, from the test results from the above-noted first step and the simulation results from the above-noted second step.

In the above-noted third step, from the simulation results corresponding to individual times when a pattern for which an Iddq abnormality does not occur is applied thereto and/or the simulation results corresponding to individual times when a pattern for which an Iddq abnormality does occur is applied thereto, the number of patterns of logic values 0 and 1 are each counted for the internal signal lines within the above-noted device under test, and a prediction is made of the location of a short circuit of the above-noted signal lines with respect to a power supply line or with respect to a ground line.

More specifically, from the results of a simulation with respect to the points in time at which patterns for which the above-noted Iddq abnormality is not detected is applied thereto in the Iddq test, signal lines which have zero patterns indicating a logic value of 1 are predicted as having a high possibility of a short circuit with respect to a ground line, and signal lines which have zero patterns indicating a logic value of 0 are predicted as having a high possibility of a short circuit with respect to a power supply line, and from the results of a simulation with respect to the points in time at which patterns for which the above-noted Iddq abnormality was detected were applied thereto in the Iddq test, signal lines which have zero patterns indicating a logic value of 1 are predicted as having a high possibility of a short circuit with respect to a power supply line, and signal lines which have zero patterns indicating a logic value of 0 are predicted as having a high possibility of a short circuit with respect to a ground line.

In another method, from the results of a simulation with respect to the points in time at which patterns for which the above-noted Iddq abnormality is not detected in the Iddq test, signal lines which have nearly zero patterns indicating a logic value of 1 are predicted as having a high possibility of a short circuit with respect to a ground line, and signal lines which have nearly zero patterns indicating a logic value of 0 are predicted as having a high possibility of a short circuit with respect to a power supply line, and from the results of a simulation with respect to the points in time at which patterns for which the above-noted Iddq abnormality was detected in the Iddq test, signal lines which have nearly zero patterns indicating a logic value of 1 are predicted as having a high possibility of a short circuit with respect to a power supply line, and signal lines which have nearly zero patterns indicating a logic value of 0 are predicted as having a high possibility of a short circuit with respect to a ground line.

Next, the twelfth embodiment aspect of a CMOS integrated circuit failure diagnosis apparatus 100 according to the present invention will be described.

Specifically, the configuration of the failure diagnosis apparatus 100 of the twelfth embodiment aspect of the present invention is substantially the same as that shown in FIG. 1, except in that a DC power supply current test is used as the Iddq test executed by the LSI tester, and that the failure location judgment algorithm of the failure location judgment unit 8 is different from that of the previously described embodiments.

More specifically, the CMOS integrated circuit failure diagnosis apparatus of this embodiment aspect is a CMOS integrated circuit failure diagnosis apparatus which performs a failure diagnosis with respect to a CMOS integrated circuit in which not only is a functional abnormality not detected in a functional test but also in which a DC power supply current abnormality is detected only for a specific test pattern in a DC power supply current test, this failure diagnosis apparatus making use of the results of the above-noted functional test and the results of the above-noted DC power supply current test to make the diagnosis.

This failure diagnosis apparatus has test pattern storage means 1 for storing test patterns which describe the input and output signals to and from the circuit for the purpose of performing a functional test, a testing means 3, which is an LSI tester, which receives the above-noted test patterns and which performs the above-noted functional test, the above-noted DC power supply current test, and a measurement of the above-noted DC power supply current, a test results storage means 6 for storing the results of the above-noted functional test and the results of the above-noted DC power supply current test and measurement of the above-noted DC power supply current by the above-noted testing means 3, a circuit data storage means 2 for storing the position information of the wiring on the chip of the device under test (DUT) and information which relates this to the signal lines, a logic simulator 5 which performs a logic simulation of the internal circuit operation at each individual time that the above-noted test patterns are applied to the circuit under test, based on the above-noted test patterns and above-noted circuit data, a simulation results storage means 7 for storing the results of the simulation performed by the logic simulator 5, and a failure location judgment unit 8 which, from the results of the above-noted functional test, the above-noted DC power supply current test, and the results of the above-noted simulation, creates an expected failure candidate set, and which also not only establishes simultaneous first order equations having as unknowns the amount of DC power supply current that flows when each failure exists, but also solves these first order simultaneously equations so as to predict a failure between signal lines which include a plurality of failures.

In another CMOS integrated circuit failure diagnosis apparatus according to this embodiment, in addition to the configuration noted above, the failure diagnosis apparatus has a layout information storage means 10 for storing position information of the wiring on the CMOS integrated circuit chip that is the device under test (DUT) and information which relates this to the signal lines at the gate-level representation of this CMOS integrated circuit, and a selection means 13 for selecting, based on the information stored in the above-noted layout information storage means 10, possible failure occurrence locations from the limitations imposed by the layout, the above-noted failure location judgment unit 8 creating, from the results of the above-noted functional test, the above-noted DC power supply current test, and the results of the abovenoted simulation, an expected failure candidate set, and establishing simultaneous first order equations having as unknowns the amount of DC power supply current that flows when each failure exists, and also solving these first order simultaneously equations so as to predict a short circuit failure between signal lines which include a plurality of failures.

Figure 28:
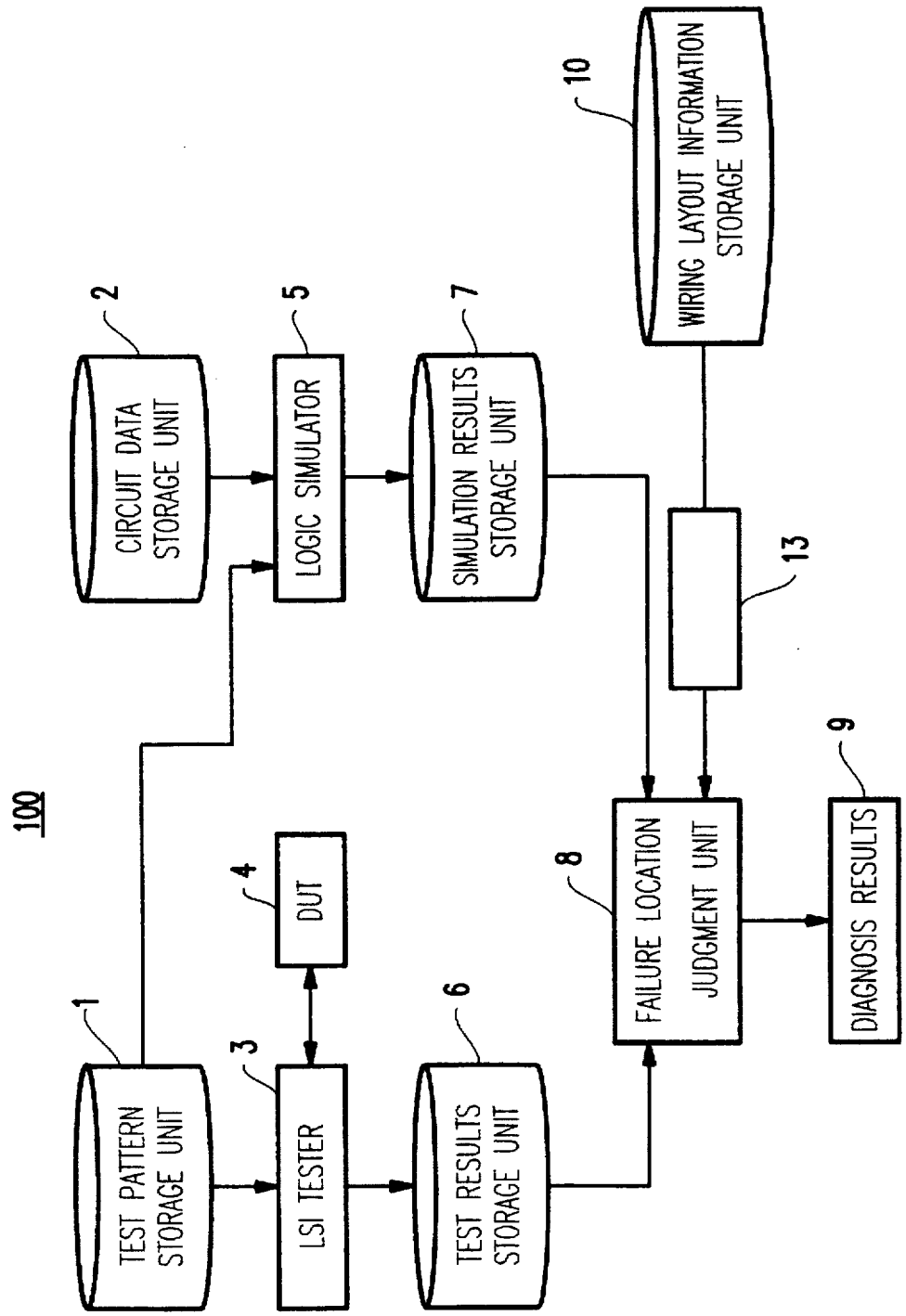
FIG. 28 is a block diagram which shows an example of the configuration of the fourteenth embodiment aspect of a CMOS integrated circuit failure diagnosis apparatus according to the present invention.

As shown in FIG. 28, another CMOS integrated circuit failure diagnosis apparatus according to this embodiment, in addition to the above-noted configuration, has a layout information storage means 10 for storing position information of the wiring on the CMOS integrated circuit chip that is the device under test (DUT) and information which relates this to the signal lines at the gate-level representation of this CMOS integrated circuit, and a means for identifying, from the short circuit failures predicted by the above-noted failure location judgment means 8 and from the layout information stored in the above-noted layout information storage means, the location on the CMOS integrated circuit chip at which a failure has actually occurred.

The method of CMOS integrated circuit failure diagnosis according to this embodiment of the present invention is a CMOS integrated circuit failure diagnosis method by which a failure diagnosis is performed with respect to a CMOS integrated circuit in which not only is a functional abnormality not detected in a functional test but also in which a DC power supply current abnormality is detected only for a specific test pattern in a DC power supply current test, this failure diagnosis method making use of the results of the above-noted functional test and the results of the above-noted DC power supply current test and result of measurement of DC power supply means to make the diagnosis.

This method has a first step of performing the above-noted functional test and the above-noted DC power supply current test, based on test patterns which describe the input and output signals to and from the circuit for the purpose of performing the functional test, a second step of obtaining the results of a simulation of the internal circuit signal values of the circuit at points in time at which a test pattern for which the above-noted DC power supply current abnormality is not detected was applied thereto, based on the results of a simulation of the internal operation of the CMOS integrated circuit, a third step of obtaining the results of a simulation of the internal circuit signal values of the circuit at points in time at which a test pattern for which the above-noted DC power supply current abnormality is detected was applied thereto, based on the results of a simulation of the internal operation of the CMOS integrated circuit, a fourth step of selecting a short circuit failure candidates from the results of the above-noted CMOS integrated circuit internal operational simulation, the results of the above-noted functional test and above-noted DC power supply current test, and from the results of simulations obtained at the second and third steps, and a fifth step of selecting short circuit candidates from the above-noted failure candidates which satisfy the above-noted DC power supply current measurement results.

The CMOS integrated circuit failure diagnosis method according to the present invention, in addition to the above-noted steps, includes a step of selecting failure locations which, from the limitations imposed by the layout, have a possibility of occurring, based on the position information of the wiring on the CMOS integrated circuit chip that is the device under test (DUT) and information which relates this to the signal lines at the gate-level representation of this CMOS integrated circuit, so that only these locations are taken as failure candidates.

In addition to the above steps, the CMOS integrated circuit failure diagnosis method according to the present invention includes a step of identifying a location on the chip of the CMOS integrated circuit at which a failure has actually occurred, based on short circuit failures predicted at the above-noted step 5 and on the position information of the wiring on the CMOS integrated circuit chip that is the device under test (DUT) and information which relates this to the signal lines at the gate-level representation of this CMOS integrated circuit.

First the effect of the twelfth embodiment aspect of the present invention will be described.

By virtue of the constitution of a CMOS integrated circuit failure diagnosis apparatus according to the present invention, as described above, by making use of the same type of mechanism by which an abnormal Iddq current occurs as in the other, earlier-described embodiments, for an Iddq failure in a CMOS integrated circuit for which no abnormality in input and output values is detected, but for which, depending upon the test pattern, a characteristic DC power supply current abnormality occurs, it is possible to identify the location which causes that failure, even in the case in which there exists a plurality of failure locations.

That is, for an Iddq abnormality which is observed only when a certain test pattern is input to the CMOS integrated circuit, the failure candidate at that time being fi, the abnormal Iddq current flowing because of the failure fi is Ii.

If when a test pattern p is input to the CMOS integrated circuit an Iddq abnormality is detected and the abnormal Iddq current at that time is Iddq(p), if the failure candidate fi becomes prominent by means of inputting the test pattern p (that is, if the input of the test pattern p causes the two signal lines to be mutually different), Dip=1, and if the failure candidate does not become prominent, Dip=0, the overall sum of fi×Ii×Dip [ . . . (1)] with regard to i being equal to Iddq(p).

For all the test patterns for which an abnormal Iddq current flows, if the value of the Equation (1) is determined and Ii is calculated, as long as Ii≠0, the existence of the failure fi is predicted. If Ii=0, the existence of the failure fi is denied.

This embodiment aspect is described in detail below.

As described above, in this embodiment simultaneously with performing a functional test the CMOS integrated circuit device under test, using an LSI tester, the power supply current of the DUT 4 is observed at each test pattern and an Iddq test is performed to test whether this current exceeds a prescribed limit value. The results of the above-noted functional test and Iddq test are sent to and stored within the test results storage unit 6.

The failure location judgment unit 8, from the DC power supply test results and the simulation results, establishes and solves a set of first order simultaneous equations which have the current Ii flowing when the failure candidate fi becomes prominent, so as to judge a failure location existing in the DUT 4. The judgment results are output as the diagnosis results 9.

Figure 29:
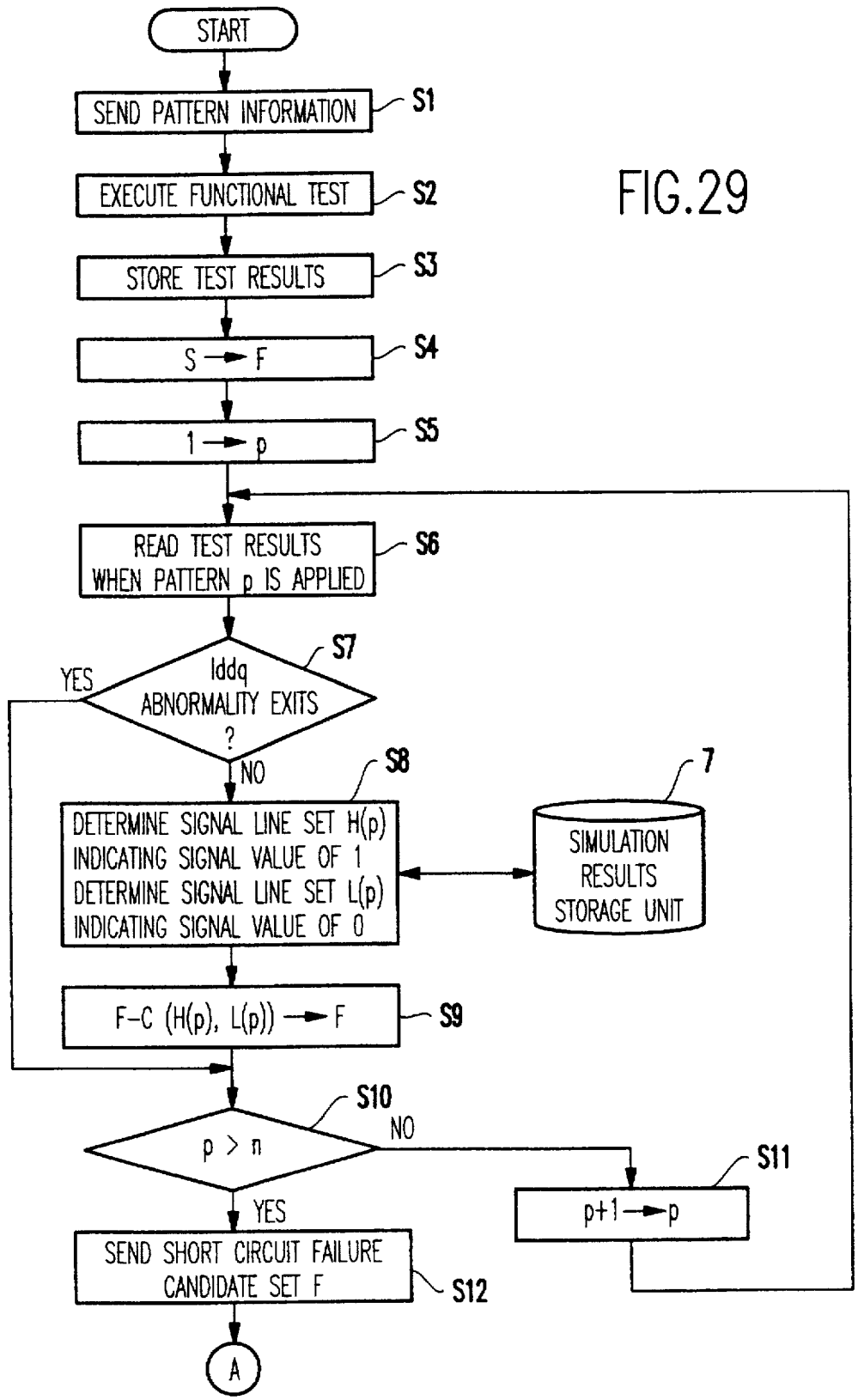
FIGS. 29 and 30 are flowcharts which show the operating procedure in the twelfth embodiment aspect of a CMOS integrated circuit failure diagnosis apparatus according to the present invention.
Figure 30:
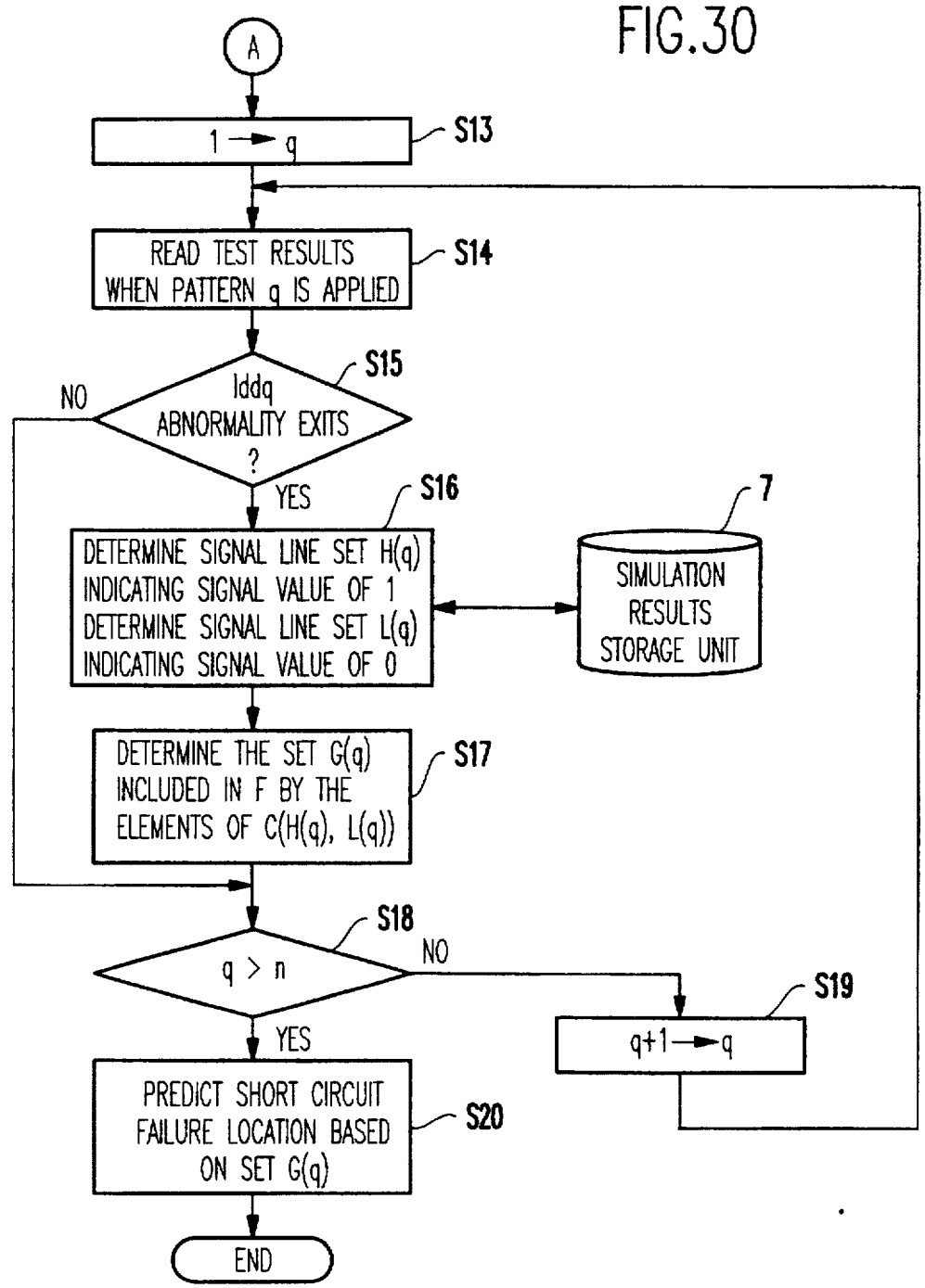
Figure 31:
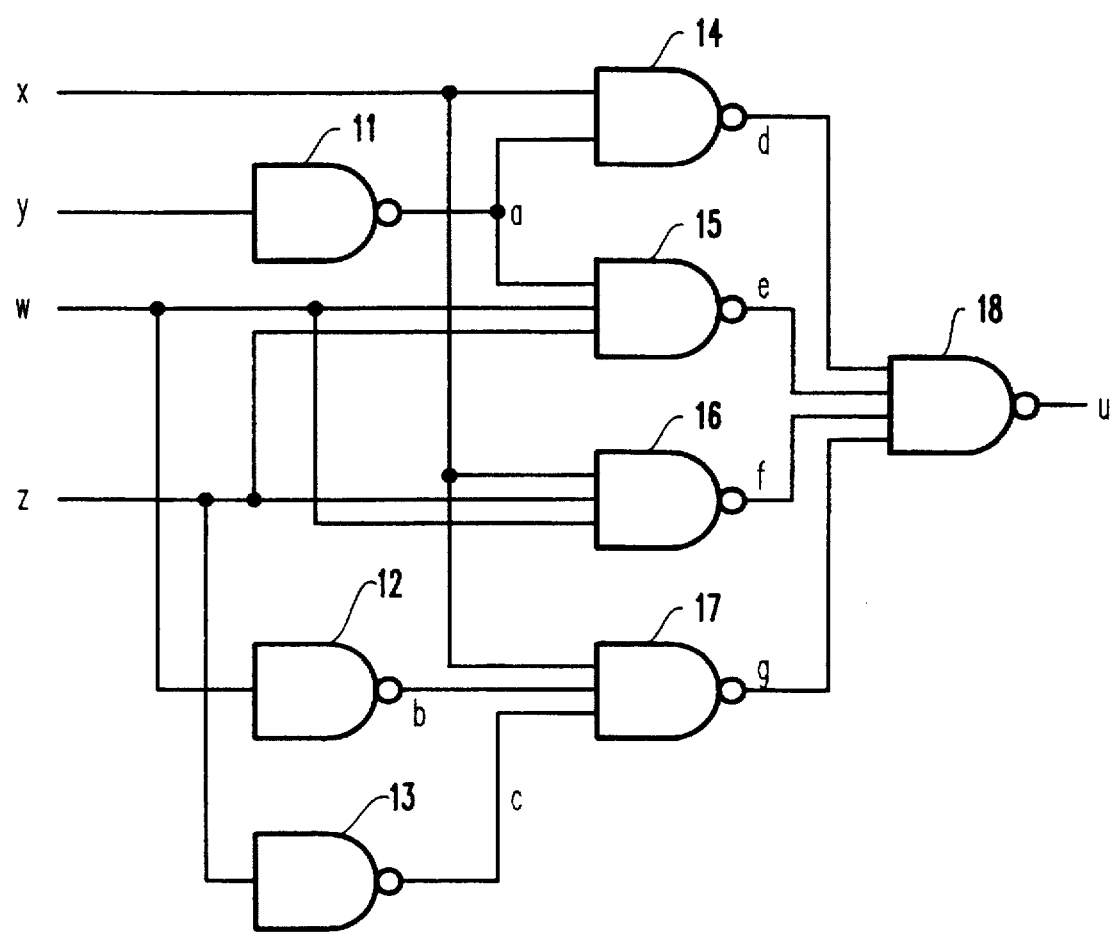
FIG. 31 is a circuit diagram which shows an example of a device under inspection used in the twelfth embodiment aspect of a CMOS integrated circuit failure diagnosis apparatus according to the present invention.

FIG. 29 and FIG. 30 show a flowchart of the processing flow in this embodiment aspect of the present invention. FIG. 31 is a circuit diagram of an example of a circuit used for the purpose of explaining the processing operation of this embodiment, FIG. 32 is a drawing which shows an example of the test patterns used for the circuit under test which is shown in FIG. 31, and FIG. 33 is a drawing which shows an example of the results of a simulation of the circuit under test which is shown in FIG. 31.

FIG. 34 is a drawing which shows an example of the test results obtained for the circuit shown in FIG. 31.

The circuit shown in FIG. 31 comprises the inverters 11 through 13 and the NAND circuits 14 through 18. The inverter 11 inverts the signal input via the signal line y and output the resulting inverted signal to the NAND circuits 14 and 15 via the signal line a.

The inverter 12 inverts the signal input via the signal line w, and outputs the resulting inverted signal to the NAND gate 17 via the signal line b. The inverter 13 inverts the signal input via the signal line z, and outputs the resulting inverted signal to the NAND gate 17 via the signal line c.

The NAND circuit 14 takes the NAND of the signal input via the signal line x and the signal received via the signal line a from the inverter 11, and outputs the result to the NAND circuit 18 via the signal line d. The NAND circuit 15 takes the NAND of the signals input via the signal lines w and z and the signal received via the signal line a from the inverter 11, and outputs the result to the NAND circuit 18 vi the signal line e.

The NAND circuit 16 takes the NAND of the signals input via the signal lines x, y, and z, and outputs the result to the NAND circuit 18 via the signal line f. The NAND circuit 17 takes the NAND of the signal input via the signal line x and the signals from inverters 12 and 13 via the signal lines b and c, and outputs the result to the NAND circuit 18 via the signal line g. The NAND circuit 18 takes the NAND of the signals input from the NAND circuits 14 through 18 via the signal lines d, e, f, and g, and outputs the result via the signal line u.

FIG. 32 shows the values of each of the signal lines x, y, w, z, and u for the test patterns #1 through 16. In this example, these are set as "00000" for test pattern #1, "00010" for test pattern #2, "00100" for test pattern #3, "00111" for test pattern #4, "01000" for test pattern #5, "01010" for test pattern #6, "01100" for test pattern #7, "01110" for test pattern #8, "10001" for test pattern #9, "10011" for test pattern #10, "10101" for test pattern #11, "10111" for test pattern #12, "11001" for test pattern #13, "11010" for test pattern #14, "11100" for test pattern #15, and "11111" for test pattern #16, with these patterns being stored in the test pattern storage unit 1.

FIG. 33 shows the results #1 through #16 of the simulation of the circuit under test, this represented as the values of the signals x, y, w, z, a, b, c, d, e, f, g, and u.

In this example, simulation result #1 is "000011111110", simulation result #2 is "000111011110", simulation result #3 is "001010111110", simulation result #4 is "001110010111", simulation result #5 is "010001111110", simulation result #6 is "010101011110", simulation result #7 is "111000111110", simulation result #8 is "011100011110", simulation result #9 is "100011101101", simulation result #10 is "100111001111", simulation result #11 is "101010101111", simulation result #12 is "110111000011", simulation result #13 is "110001111101", simulation result #14 is "110101011110", simulation result #15 is "111000111110", and simulation result #16 is "111100011011", these being stored in the simulation results storage unit 7.

FIG. 34 shows the functional test results and Iddq test results for the example circuit under test as normal or abnormal, and also indicates the Iddq current (mA), for test patterns #1 through #16.

In this example, the information stored for test pattern #1, is a functional test result of "normal", an Iddq test result of "normal" and an Iddq current value is 0 mA. The information stored for test pattern #2 is a functional test results of "normal", an Iddq test result of "normal", and an Iddq current value of 0 mA.

The information stored for test pattern #3 is a functional test results of "normal", an Iddq test result of "normal", and an Iddq current value of 0 mA. The information stored for test pattern #4 is a functional test results of "normal", an Iddq test result of "abnormal", and an Iddq current value of 0.7 mA.

The information stored for test pattern #5 is a functional test results of "normal", an Iddq test result of "normal", and an Iddq current value of 0 mA. The information stored for test pattern #6 is a functional test results of "normal", an Iddq test result of "normal", and an Iddq current value of 0 mA.

The information stored for test pattern #7 is a functional test results of "normal", an Iddq test result of "normal", and an Iddq current value of 0 mA. The information stored for test pattern #8 is a functional test results of "normal", an Iddq test result of "normal", and an Iddq current value of 0 mA.

The information stored for test pattern #9 is a functional test results of "normal", an Iddq test result of "abnormal", and an Iddq current value of 3.4 mA. The information stored for test pattern #10 is a functional test results of "normal", an Iddq test result of "abnormal", and an Iddq current value of 1.1 mA.

The information stored for test pattern #11 is a functional test results of "normal", an Iddq test result of "abnormal", and an Iddq current value of 1.1 mA. The information stored for test pattern #12 is a functional test results of "normal", an Iddq test result of "abnormal", and an Iddq current value of 1.1 mA.

The information stored for test pattern #13 is a functional test results of "normal", an Iddq test result of "abnormal", and an Iddq current value of 2.3 mA. The information stored for test pattern #14 is a functional test results of "normal", an Iddq test result of "normal", and an Iddq current value of 0 mA.

The information stored for test pattern #15 is a functional test results of "normal", an Iddq test result of "normal", and an Iddq current value of 0 mA. The information stored for test pattern #16 is a functional test results of "normal", an Iddq test result of "abnormal", and an Iddq current value of 0.7 mA.

The data shown in FIG. 32 through FIG. 34 are stored respectively in the test pattern storage unit 1, the test results storage unit 6, and the simulation results storage unit 7.

As shown in FIG. 29 and FIG. 30, pattern information which is stored in the test pattern storage unit 1 is sent to the LSI tester 3, and is input to the DUT 4 from the LSI tester 3 (at step S1). The pattern information comprises signal vectors which are input to the DUT 4 at a prescribed time interval, and expected value DUT 4 output vectors. The pattern information in the example circuit under test shown in FIG. 31 is as shown in FIG. 32.

The LSI tester 3 inputs the signal vectors to the DUT 4 based on the test patterns, and performs a functional test in which a comparison is performed between the output vector from the DUT 4 and the coded output vector (expected values) (step S2), the results therefrom being sent to and stored within the test results storage unit 6 (step S3).

The LSI tester 3 also observes the power supply current of the DUT 4 which flows for the signal vector being input to the DUT 4, based on the test patterns. This power supply current is the current Iddq(p), and if it exceeds a prescribed limit value, the judgment is made that an Iddq abnormality has occurred. In that case, the Iddq abnormality judgment results and Iddq(p) value are sent to and stored within the test results storage unit 6.

The DUT circuit information is stored in the circuit data storage unit 2, this circuit information comprising information with regard to the elements that make up the DUT 4, information with regard to element-to-element element-to-terminal connections therewithin, and functional information with regard to these elements. This circuit information is sent together with the test pattern information to the logic simulator 5, and a simulation is performed of the operation of DUT 4 when the above-noted patterns are applied.

In this simulation, the changes in the value of internal signal lines in the DUT 4 are also recorded, and the DUT 4 operational results, including changes in the value at external terminals, are sent to and stored in the simulation results storage unit 7. For the example circuit under test which is shown in FIG. 31, the simulation results when the patterns shown in FIG. 32 are applied are as shown in FIG. 33.

Assume the case in which, as a result of inputting the series of test patterns to the DUT 4, although no functional failure was detected in DUT 4, but an Iddq abnormality was detected for a number of pattern inputs.

In the case of the example circuit under test which is shown in FIG. 31, assume that there are shorts between the signal lines e and f, between the signal line d and the power supply line vdd, and between the signal line g and the power supply line vdd. Assume that while these short circuit failures do not affect the functioning of the example circuit under test, they cause an Iddq abnormality to occur. With regard to this example circuit under test, the results of an Iddq test using the pattern information shown in FIG. 32 are as shown in FIG. 34.

At the failure location judgment unit 8, from the simulation results stored in the simulation results storage unit 7 and the test results stored in the test results storage unit 6, the following processing is executed so as to predict the failure location.

First, the failure location judgment unit 8 sets the set S of all combinations of signal lines into the set F of combinations of signal lines between which there is a possibility of a failure having occurred (step S4), and sets the above-noted p (pattern number) to 1 (step S5).

At this point, assume that with test pattern p applied to the DUT 4, no Iddq abnormality was detected. It is possible to know the values of each signal line within the DUT 4 when test pattern p is applied to DUT 4 by means of the simulation results, and the set of signal lines which have a signal value of 1 being made H(p) and the set of signal lines which have a signal value of 0 being made L(p).

In the case of the example circuit under test shown in FIG. 31, the set H(1) of signal lines that are 1 when test pattern #1 is applied and the set L(1) of signal lines that are 0 when test pattern 1 is applied are each as follows.

$$H(1)=\{a, b, c, d, e, f, g, vdd\}$$

$$L(1)=\{x, y, w, z, u, gnd\}$$

(as shown in steps S6 to S8)

With regard to the combinations of signal lines indicated by C(H(p), L(p)), since an Iddq abnormality was not detected, a short circuit failure does not exist. In this expression, C(H(p), L(p)) is defined as follows.

$$C(H, L)=\{(h, 1):h\in H, 1 \in L, (h, 1)=(1, h)\}$$

In the case of the example circuit under test shown in FIG. 31, this is defined as follows.

$$\begin{aligned}C\ (H\ (1), L\ (1))\\ = \{&(a, x), (a, y), (a, w), (a, z), (a, u),\\ &(a, gnd),\\ &(b, x), (b, y), (b, w), (b, z), (b, u),\\ &(b, gnd),\\ &(c, x), (c, y), (c, w), (c, z), (c, u),\end{aligned}$$

-continued (c, gnd),
(d, x), (d, y), (d, w), (d, z), (d, u),
(d, gnd),
(e, x), (e, y), (e, w), (e, z), (e, u),
(e, gnd),
(f, x), (f, y), (f, w), (f, z), (f, u),
(f, gnd),
(g, x), (g, y), (g, w), (g, z), (g, u),
(g, gnd),
(vdd, x), (vdd, y), (vdd, w), (vdd, z),
(vdd, u), (vdd, gnd)}

In this case, there is no short circuit failure, for example, between signal lines a and x. If there were a short circuit failure between signal lines a and x, there would have been an Iddq abnormality detected when test pattern 1 was applied.

This is obtained after setting the above-noted p (pattern number) to 1 (step S5), by reading out the test results for the test pattern p one at a time from the test results storage unit 6 (step S6), a judgment being made as to whether or not results indicate an Iddq abnormality (step S7) and, if there is no Iddq abnormality, based on the simulation results stored in the simulation results storage unit 7, the set H(p) of combinations of signal lines for which the signal value is 1 and the set L(p) of combinations of signal lines for which the signal value is 0 being determined.

By removing from the set S of all signal line combinations C(H(p), L(p)) which are combinations for which an Iddq abnormality was not detected (wherein set S at step S4 is set to set F, this is [F−C(H(p), L(p))→F]), the combinations of signal lines having a possibility of the existence of a short circuit failure are narrowed (step S9).

By performing these operations for all patterns p for which an Iddq abnormality is not detected, the set F={fi} of candidate combinations of signal lines having a possibility of a failure having occurred is obtained (steps S6 through S11). In this case, if number of the test pattern is n, the above operations are repeated until p>n.

In the example circuit under test shown in FIG. 31, as shown in FIG. 34, because no Iddq abnormality is detected for the test patterns #1, #2, #3, #5, #6, #7, #8, #14, and #15, the candidate signal line combinations having a possibility of a failure having occurred are the set F, as follows.

$$F = S - C(H(1), L(1)) - C(H(2), L(2)) -$$
$$C(H(3), L(3)) - C(H(5), L(5)) -$$
$$C(H(6), L(6)) - C(H(7), L(7)) -$$
$$C(H(8), L(8)) - C(H(14), L(14)) -$$
$$C(H(15), L(15))$$
$$= \{(d, e), (d, f), (e, f), (d, g), (e, g),$$
$$(f, g), (gnd, u), (d, vdd), (e, vdd),$$
$$(f, vdd), (g, vdd)\}$$

It is this set F of candidate signal line combinations having a possibility of a failure having occurred that is sent (step S12). There is a short circuit failure (and possibly a plurality thereof) among this combination of signal lines indicated.

Assume that with a test pattern q applied to the DUT 4 an Iddq abnormality is was detected. This means that in the set of combinations of signal lines indicated by C(H(q), L(q)), there is a failure which exceeds the Iddq abnormality current.

That is, of all the failures that exist in the DUT 4, a number of failures become prominent because of a change in the status of the internal circuitry of the DUT 4 caused by the application of the test pattern q, these prominent failures causing an abnormal Iddq current to flow in the DUT 4, so that an Iddq abnormality is detected.

If the elements of C(H(q), L(q)) that are included in the above-noted set F are taken as the set G(q), the failures that were made prominent by the test pattern q will be included in the set G(q).

In the case of the example circuit under test shown in FIG. 31, an Iddq abnormality is detected when test pattern 4 is applied. At this point, the set H(4) of signal lines that are 1 when test pattern 1 is applied and the set L(4) of signal lines that are 0 when test pattern 1 is applied are each as follows.

$$H(4) = \{w, z, a, d, f, g, u, vdd\}$$

$$L(4) = \{x, y, b, c, e, gnd\}$$

This is obtained after setting the above-noted q (pattern number) to 1 (step S13), by reading out the test results for the test pattern p one at a time from the test results storage unit 6 (step S14), a judgment being made as to whether or not results indicate an Iddq abnormality (step S15) and, if there is an Iddq abnormality, based on the simulation results stored in the simulation results storage unit 7, the set H(q) of combinations of signal lines for which the signal value is 1 and the set L(q) of combinations of signal lines for which the signal value is 0 being determined.

The elements of these elements C(H(q), L(q)) that are included in the set F are determined as the set G(q) (step 17). In the above-noted case, because there is an Iddq abnormality detected with test pattern #4 applied, the set of elements of C(H(4), L(4)) that is included in the set F is as follows.

$$G(4)$$
$$= FAC (H(4), L(4))$$
$$= \{(d, e), (d, f), (e, f), (d, g), (e, g),$$
$$(f, g), (gnd, u), (d, vdd), (e, vdd),$$
$$(f, vdd), (g, vdd)\}$$
$$\cap \{(w, x), (w, y), (w, b), (w, c), (w, e),$$
$$(w, gnd),$$
$$(z, x), (z, y), (z, b), (z, c), (z, e),$$
$$(z, gnd),$$
$$(a, x), (a, y), (a, b), (a, c), (a, e),$$
$$(a, gnd),$$
$$(d, x), (d, y), (d, b), (d, c), (d, e),$$
$$(d, gnd),$$
$$(f, x), (f, y), (f, b), (f, c), (f, e),$$
$$(f, gnd),$$
$$(g, x), (g, y), (g, b), (g, c), (g, e),$$
$$(g, gnd),$$
$$(u, x), (u, y), (u, b), (u, c), (u, e),$$
$$(u, gnd),$$
$$(vdd, x), (vdd, y), (vdd, b), (vdd, c),$$
$$(vdd, c), (vdd, gnd)\}$$
$$= \{(d, e), (e, f), (e, g), (u, gnd),$$
$$(e, vdd)\}$$

By performing these operations for all test patterns q for which an Iddq abnormality is detected, the set G which is included in the set F is obtained (steps S14 through S19). In this case, if the number of test patterns is n, the above-noted operations are repeated until q>n.

If the combinations of signal lines indicated by G(q) is {gq1, gq2, ..., gqn}, and the Iddq current that flows because of a of a failure gqi is an unknown Iddq (q, i), we have the following.

$$Iddq(q) = \Sigma Iddq(q, i)$$

wherein $\Sigma$ is the sum for all of I.

If the above equation is evaluated for all the test patterns q for which an Iddq abnormality is detected, first order simultaneous equations A with the unknowns being Iddq(q,i) are obtained. If Iddq(q, i)=0, there is not short circuit failure between the signal lines indicated by gqi. As long as Iddq(q,i) is not 0, it is predicted that there is a short circuit failure between the signal lines indicated by gqi.

If the above-noted first order simultaneous equations A are determined for the example circuit under test shown in FIG. 31, we have the following.

$$0.7 = i(d, e) + i(e, f), + i(gnd, u) + i(e, vdd)$$
$$3.4 = i(d, e), + i(d, f), + i(e, g), + i(f, g) + i(gnd, u) + i(d, vdd) + i(g, vdd)$$
$$1.1 = i(d, e), + i(d, f) + i(d, g) + i(gnd, u) + i(d, vdd)$$
$$1.1 = i(d, e) + i(d, f), + i(d, g) + i(gnd, u), + i(d, vdd)$$
$$1.1 = i(d, g) + (e, g), + i(f, g) + i + (gnd, u) + i(d, vdd) + i(e, vdd) + i(f, vdd)$$
$$2.3 = i(d, g) + i(e, g), + i(f, g), + i(gnd, u) + i(g, vdd)$$
$$0.7 = i(d, f) + i(e, f) + i(f, g) + i(gnd, u) + i(f, vdd)$$

In the above, note that i(s,t) indicates the Iddq current caused by a short circuit of signal lines s and t.

Based on the limiting condition that i(s,t)≧0, one solution of these first order simultaneous equations is as follows.

$$i(d, e) = 0$$
$$i(e, f) = 0.7$$
$$i(e, g) = 0$$
$$i(d, f) = 0$$
$$i(gnd, u) = 0$$
$$i(e, vdd) = 0$$
$$i(d, vdd) = 1.1$$
$$i(g, vdd) = 2.3$$
$$i(d, g) = 0$$
$$i(f, g) = 0$$
$$i(f, vdd) = 0$$

From the contents of the above, prediction is made of a short circuit between signal lines e and f, between signal line d and vdd, and between signal line g and vdd (step S20). These prediction results are output as the diagnosis results 9.

FIG. 28 shows a block diagram of the thirteenth embodiment aspect of the present invention. In this drawing, with the exception of the provision of a layout information storage unit 10 and the selection means 13 that are connected to the failure location judgment unit 8, the CMOS integrated circuit failure diagnosis apparatus has the same configuration as the CMOS integrated circuit failure diagnosis apparatus 100 shown in FIG. 1, and corresponding elements have been assigned the same reference numerals. The operation of the same constitutional elements is the same.

The layout information storage unit 10 has stored in it positions of each wire on the chip and information which indicates what signal lines each wire corresponds to in a gate-level representation of the DUT 4.

The failure location judgment unit 8 is connected to the test results storage unit 6, the simulation results storage unit 7, and the layout information storage unit 10 through the selection means 13, and makes a selection and a judgment of a failure location within the DUT 4 based on the data which is sent from these units. These judgment results are output as the diagnosis results 9.

Figure 35:
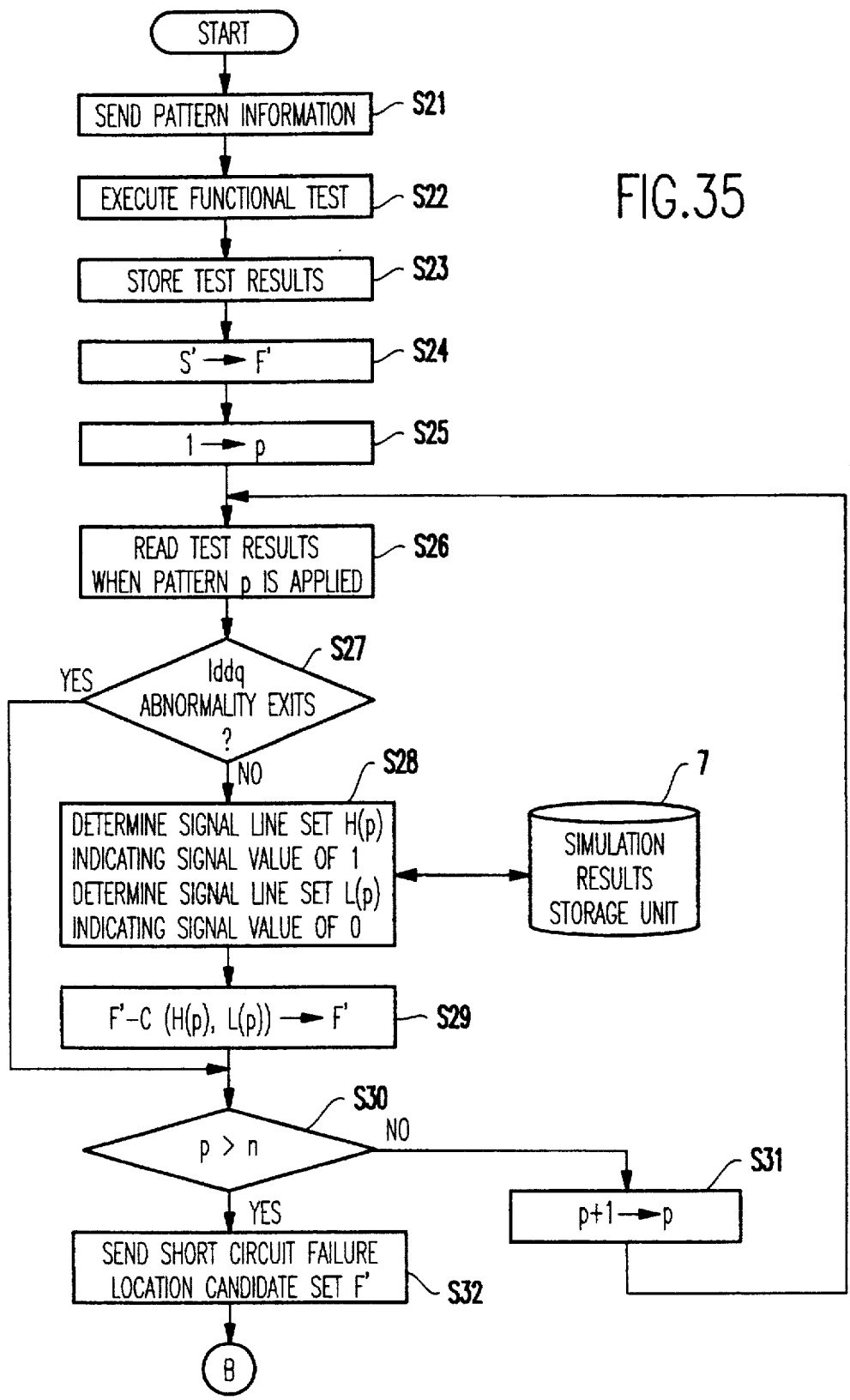
FIGS. 35 and 36 are flowcharts which show the operating procedure in the thirteenth embodiment aspect of a CMOS integrated circuit failure diagnosis apparatus according to the present invention.
Figure 36:
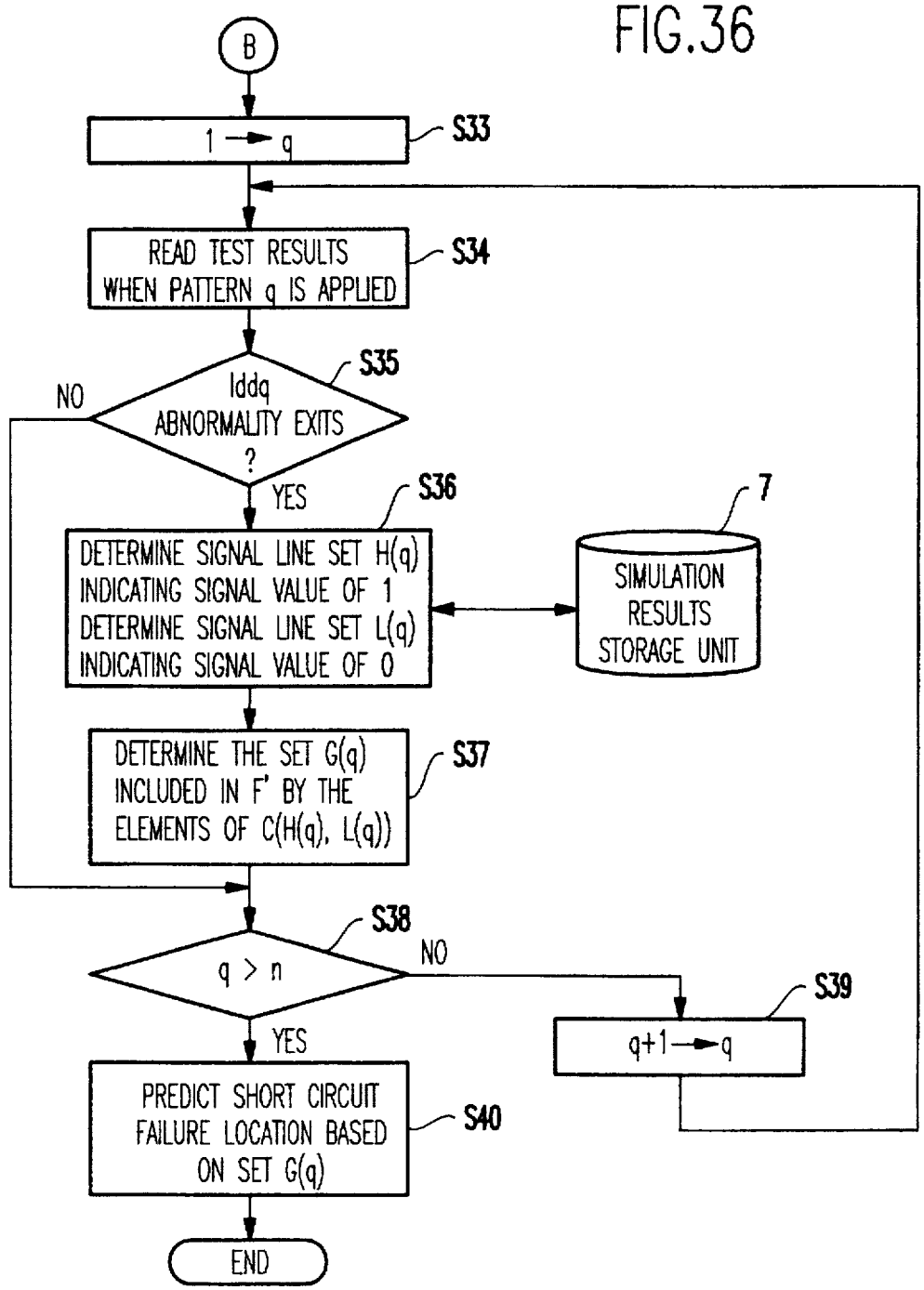

FIG. 35 and FIG. 36 are a flowchart of the processing operations in the thirteenth embodiment aspect of the present invention. The operations with respect to the example circuit under test shown in FIG. 31 through FIG. 34 will be described, with reference being made to FIG. 1 and the FIG. 35 an FIG. 36. The test pattern storage unit 1, the test results storage unit 6, and the simulation results storage unit 7 have data stored within them as shown in FIGS. 32 to 34, respectively.

In this embodiment aspect, the flow is almost the same as in the twelfth embodiment aspect, although the processing algorithm of the failure location judgment unit 8 is different.

Specifically, at the failure location judgment unit 8, from the simulation results that are stored in the simulation results storage unit 7, the following processing is executed and a failure location is predicted.

At this point, it is obvious that a short circuit failure between signal lines occurs at a point at which the signal lines either cross or are in mutually proximity on the CMOS integrated circuit chip, and so such failures cannot occur between every pair of signal lines. Because of this, instead of the set Said of all combinations of signal lines, if a set S' of combinations of signal lines that cross or are in proximity is used, of the set F of failure candidates, a new set F' of failure candidates that actually can occur is obtained. Then, the set F' will be used instead of the set F in an embodiment of the present invention, to predict a failure location having a short circuit failure, and to output this as the diagnosis results 9.

Specifically, in FIG. 35 and FIG. 36, the failure location judgment unit 8 first sets the set S' to the set F' of signal lines which cross or are in proximity (step S24), and sets the above-noted p (pattern number) to 1 (step S25).

With regard to the example circuit under test shown in FIG. 31, the set S' of failures that can occur, from the layout information, is established as follows.

$$S' = \{(x, a), (x, w), (x, z), (x, b), (x, d), (x, f), (x, g), (y, a),$$

$$(w, z), (w, e), (w, f), (w, b), (z, e), (z, f), (z, c), (a, d), (a, e),$$

$$(b, g), (b, c), (d, u), (d, e), (e, f), (e, u), (f, u), (g, u), (x, vdd),$$

$$(x, gnd), (y, vdd), (y, gnd), (w, vdd), (w, gnd), (z, vdd),$$

$$(z, gnd), (a, vdd), (a, gnd), (b, vdd), (b, gnd), (c, vdd), (c, gnd),$$

$$(d, vdd), (d, gnd), (e, vdd), (e, gnd), (f, vdd), (f, gnd), (g, vdd),$$

$$(g, gnd), (u, vdd), (u, gnd)\}$$

This set S' is set in the set F.

At this point, assume that an Iddq abnormality was not detected when test pattern p was applied to the DUT 4. It is possible to know the values of each signal line within the DUT 4 when test pattern p is applied to DUT 4 by means of the simulation results, and the set of signal lines which have a signal value of 1 being made H(p) and the set of signal lines which have a signal value of 0 being made L(p).

After setting the above-noted p (pattern number) to 1 (step S25), by reading out the test results for the test pattern p one at a time from the test results storage unit 6 (step S26), a judgment being made by the unit 8 as to whether or not results indicate an Iddq abnormality (step S27).

As a result, if the judgment is made by the unit 8 that there is no Iddq abnormality, based on the simulation results stored in the simulation results storage unit 7, the set H(p) of combinations of signal lines for which the signal value is 1 and the set L(p) of combinations of signal lines for which the signal value is 0 are determined.

In this case, by eliminating from the set S' of signals lines that cross or are in mutual proximity C(H(p), L(p)) signal lines for which the Iddq abnormality was not detected (since at step S24 the set S' is set into set F', we have [F'-C(H(p), L(p))→F']), the signal lines having a possibility that a short circuit failure occurred are narrowed (step S29).

By performing these operations for all test patterns p for which an Iddq abnormality was not detected, the set F'={fi} is obtained (steps S26 through S31), the set F' of combinations of signal lines having a possibility of a short circuit failure being sent (step S32). At least one combination (and possibly a plurality of combinations) of signal lines indicated by this has a short circuit failure. In this case, if the number of steps is n, the above-noted operations are repeated until p>n.

Assume now that when some test pattern q was applied to the DUT 4, an Iddq abnormality was detected. This means that in the set of combinations of signal lines indicated by C(H(q), L(q)), there is a failure which exceeds the Iddq abnormality current.

That is, of all the failures that exist in the DUT 4, a number of failures become prominent because of a change in the status of the internal circuitry of the DUT 4 caused by the application of the test pattern q, these prominent failures causing an abnormal Iddq current to flow in the DUT 4, so that an Iddq abnormality is detected.

If the elements of C(H(q), L(q)) that are included in the above-noted set F' are taken as the set G(q), the failures that were made prominent by the test pattern q will be included in the set G(q).

After setting the above-noted q (pattern number) to 1 (step S33), by reading out the test results for the test pattern q one at a time from the test results storage unit 6 (step S34), a judgment is made by the unit 8, as to whether or not results indicate an Iddq abnormality (step S35).

As a result, if the judgment is made by the unit 8 that there is an Iddq abnormality, based on the simulation results stored in the simulation results storage unit 7, the set H(q) of combinations of signal lines for which the signal value is 1 and the set L(q) of combinations of signal lines for which the signal value is 0 are determined.

The elements of C(H(q), L(q)) that are included in the above-noted set F' are determined as the set G(q) (step S37). By performing this operation for all test patterns q for which an Iddq abnormality was detected, the set G(q) of elements included in the above-noted set F' is obtained (steps S34 through S39). In this case, if the number of patterns is n, the above-noted operations are repeated until q>n.

If the combinations of signal lines indicated by G(q) is {gq1, gq2, ..., gqn}, and the Iddq current that flows because of a of a failure gqi is an unknown Iddq (q, i), we have the following.

Iddq(q)=ΣIddq(q, i)

(where Σ is the sum for all of i)

Using the set of failures S' that can actually occur for this layout information, this would be as follows.

F'={(d, e), (e, f), (u, gnd), (d, vdd), (e, vdd), (f, vdd), (g, vdd)}

In the thirteenth embodiment of the present invention, in contrast to the first order simultaneous equations A of the twelfth embodiment, we have the first order simultaneous equations B as follows.

0.7 = i (d, e) + i (e, f) + i (gnd, u)
    + i (e, vdd)
3.4 = i (d, e) + i (gnd, u) + i (d, vdd)
    + i (g, vdd)

-continued 1.1 = i (d, e) + i (gnd, u) + i (d, vdd)
1.1 = i (d, e) + i (gnd, u) + i (d, vdd)
1.1 = i (gnd, u) + i (d, vdd) + i (e, vdd)
    + i (f, vdd)
2.3 = i (gnd, u) + i (g, vdd)
0.7 = i (e, f) + i (gnd, u) + i (f, vdd)

If these first order simultaneous equations are solved, prediction is made of a short circuit failure between the signal lines e and f, between the signal line d and vdd, and between the signal line g and vdd (step S40).

This prediction result will be displayed at the diagnosis result display meand 9.

Next, the fourteenth embodiment aspect of the present invention will be described. FIG. 28 shows a block diagram of the fourteenth embodiment aspect of the present invention. In CMOS integrated circuit failure diagnosis apparatus 100 shown in this drawing a layout information storage unit 10 that is added to the failure location judgment unit 8.

Additionally the failure location judgment unit 8 is connected to the test results storage unit 6, the simulation results storage unit 7, and the layout information storage unit 10, and makes a judgment of a failure location within the DUT 4 based on the data which is sent from these units, and references the layout information to make a final judgment. These judgment results are output at the display means 9 as the diagnosis results.

Figure 37:
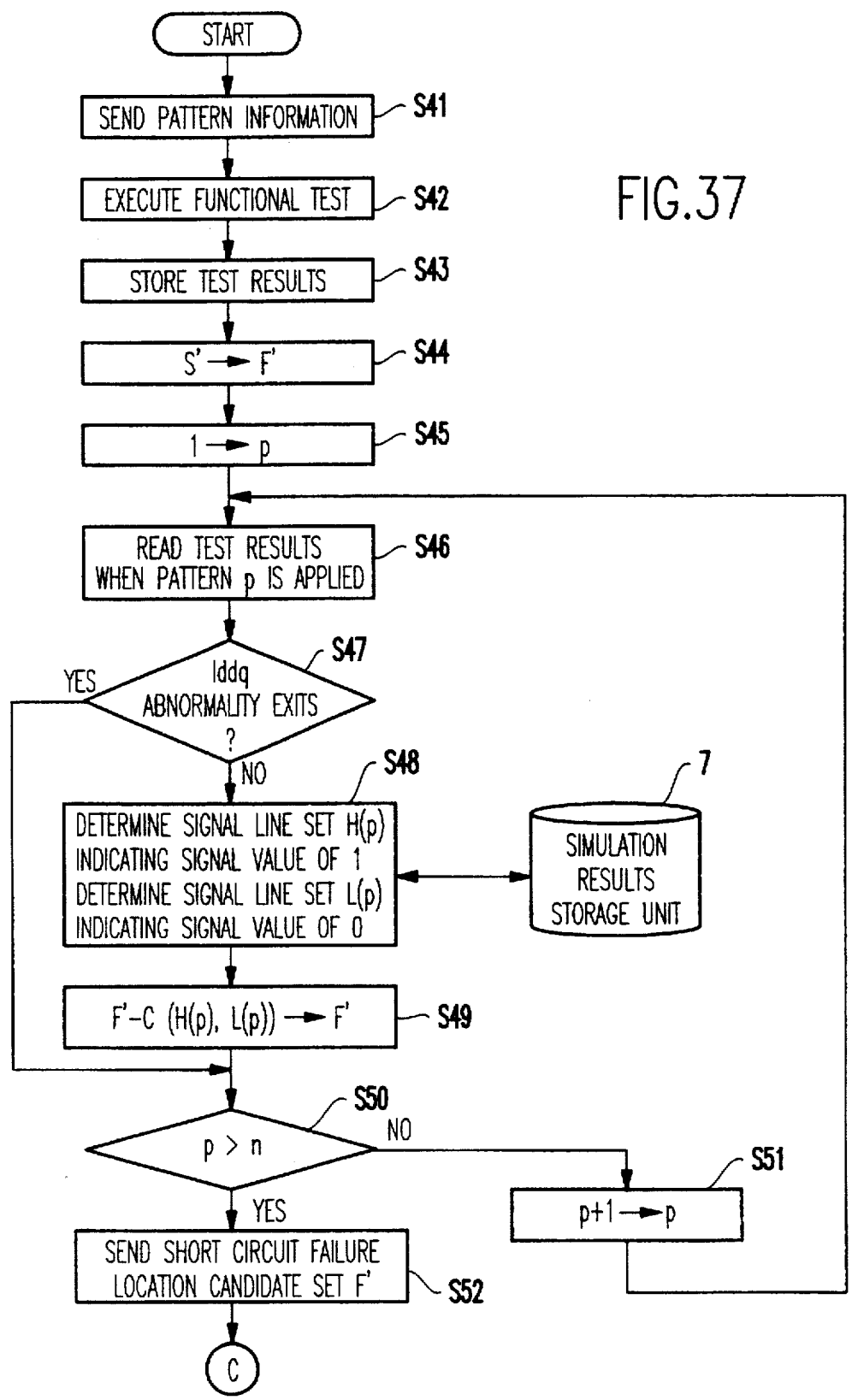
FIGS. 37 and 38 are flowcharts which show the operating procedure in the fourteenth embodiment aspect of a CMOS integrated circuit failure diagnosis apparatus according to the present invention.
Figure 38:
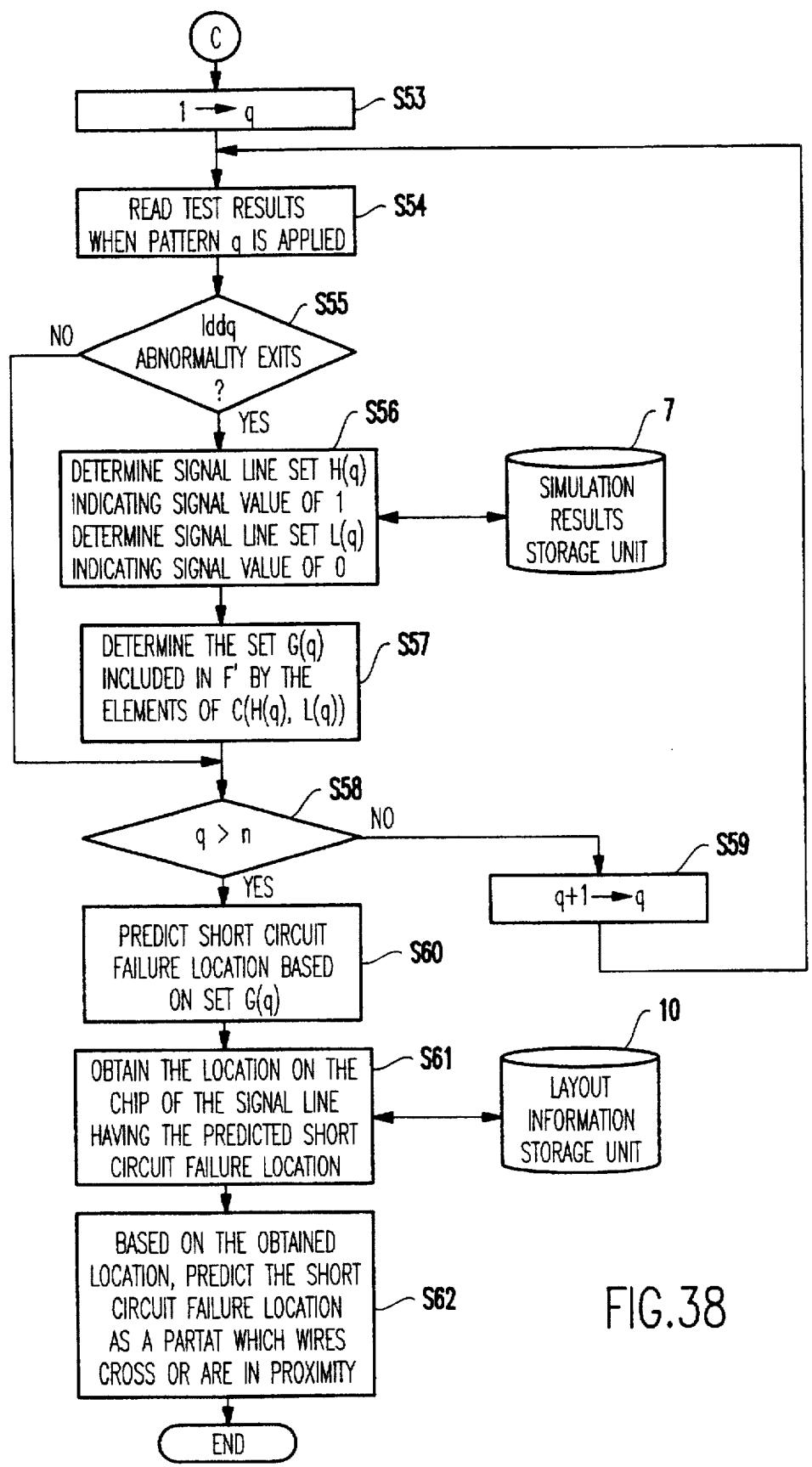

FIG. 37 and FIG. 38 show the flowchart of the processing operations in this embodiment, which will be described below with respect to the example circuit under test shown in FIG. 31 through FIG. 34. The test pattern storage unit 1, the test results storage unit 6, and the simulation results storage unit 7 have data stored within them as shown in FIGS. 32 to 34, respectively.

Because processing steps S40 of FIG. 37 through S60 of FIG. 38 are the same as steps S21 through S40 of FIG. 35 and FIG. 36, they will not be described again herein.

In this embodiment aspect, the failure location judgment unit 8 makes a prediction with respect to its own diagnosis output, of the failure location actually occurring on the chip, based on the chip wiring information and the gate-level information with regard to the DUT 4 from the layout information storage unit 10.

That is, for the case of a diagnosis result that there is a short circuit failure between signal lines i and j, from the information stored in the layout information storage unit 10, the failure location judgment unit 8 captures the positions occupied on the chip by the signal lines i and j (step S61), and predicts that for some reason there is a short circuit between them at a position at which they either cross or are in mutual proximity (step S62). This prediction result is output from the failure location judgment unit 8 as the diagnosis results 9.

In the case of the example circuit under test which is shown in FIG. 31, from the layout information, if the location on the chip at which the signal lines e and f cross is at the coordinates (x1, y1), the location on the chip at which the signal line d and vdd cross is at the coordinates (x2, y2), and the location on the chip at which the signal line g and vdd cross is at the coordinates (x3, y3), the prediction is made that a short circuit failure has occurred at each of these locations (x1, y1), (x2, y2), and (x3, y3).

Figure 39:
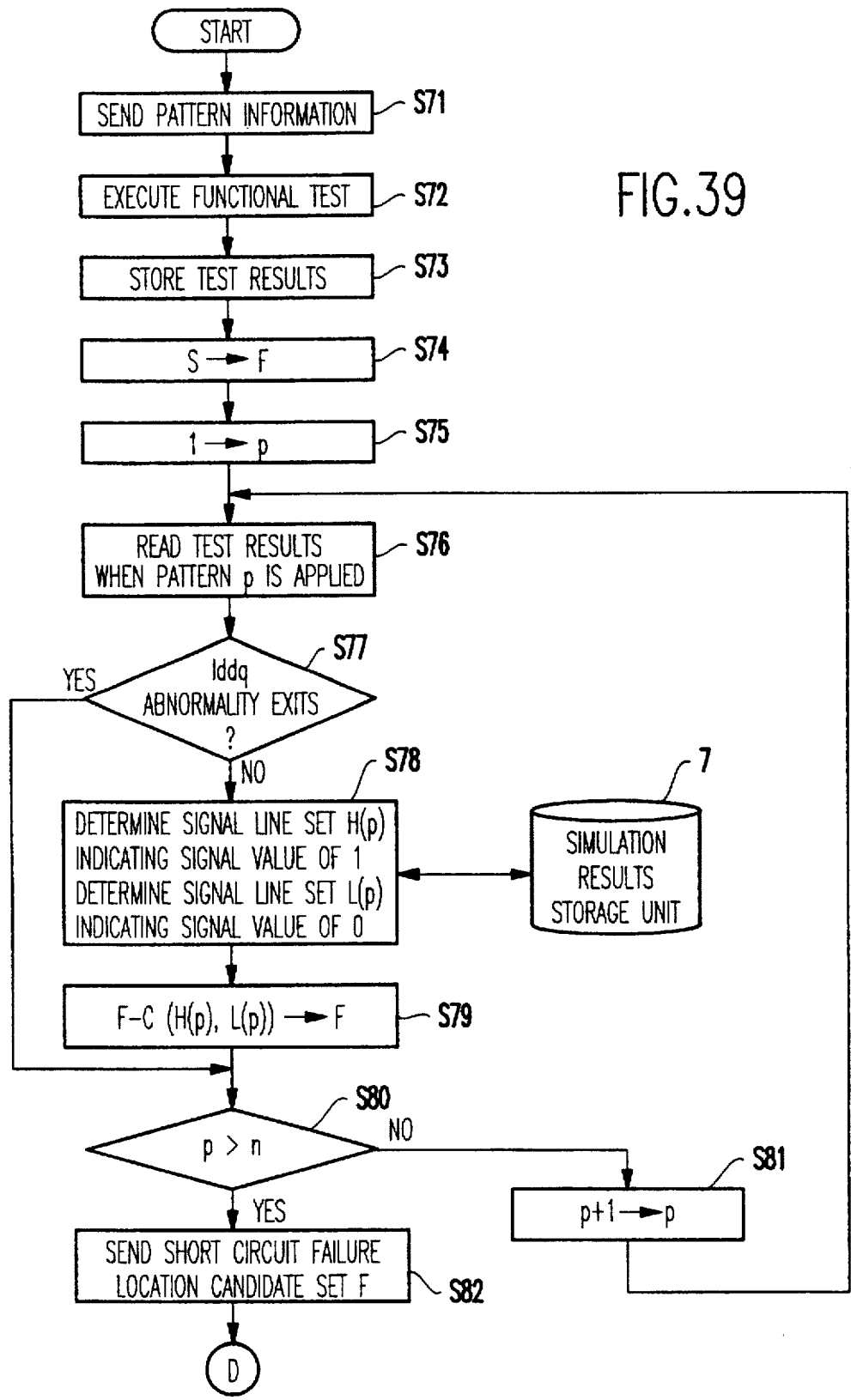

FIG. 39 and FIG. 40 show the flowchart of the processing operations in the fifteenth embodiment aspect of the present invention.

In this embodiment aspect, because the processing operations from step S71 of FIG. 39 to step S90 of FIG. 40 are the same as for the embodiment of present invention shown in FIG. 29 and FIG. 30, these processing operations will not be described again herein.

In this embodiment aspect, with respect to its own diagnosis output, eliminates failures having a small possibility of occurrence from the predicted short circuit failures, outputting only those failures that have a high possibility of having occurred as the diagnosis results as shown in the display means 9.

Specifically, the failure location judgment unit 8, in the same manner as the failure location judgment unit 8 shown in FIG. 1, establishes the above-noted first order simultaneous equations A based on the test results from the test results storage unit 6 and the simulation results from the simulation results storage unit 7, and solves these equations so as to output the location of a failure as the diagnosis results as shown at the display means 9.

However, depending on the length of the test pattern, the number of unknowns and number of equations of the first order simultaneous equations A will vary, and in some cases there will be a large number of failure candidates. Normally, because the number of failures that occur simultaneously is small, at the failure location judgment unit 8, of the failures indicated by the failure location judgment unit 8, those having the least simultaneous occurrences are taken in order as having the higher possibility of having occurred, and are output as the failure candidates (step S91). These failure candidates are output from the failure location judgment unit 8 as the diagnosis results 9.

In addition to the failures which have actually occurred in the example circuit under test which is shown in FIG. 31, failures are obtained by solving the following first order simultaneous equations A, for example.

$$
\begin{aligned}
i\,(d, e) &= 0.7 \\
i\,(e, f) &= 3.4 \\
i\,(e, g) &= 1.1 \\
i\,(d, f) &= 1.1 \\
i\,(gnd, u) &= 0 \\
i\,(e, vdd) &= 0 \\
i\,(d, vdd) &= 0 \\
i\,(g, vdd) &= 0 \\
i\,(d, g) &= 2.3 \\
i\,(f, g) &= 0 \\
i\,(f, vdd) &= 0.7
\end{aligned}
$$

This indicates that there is the simultaneous occurrence of short circuit failures between signal lines d and e, between signal lines e and f, between signal line e and g, between signal lines d and f, and between signal line f and vdd.

However, because the possibility that failures occur at 3 locations simultaneously is much greater than that failures occur at 6 locations simultaneously, at the failure location judgment unit 8, the case of fewer failures occurring simultaneously is output as having the higher possibility of having occurred.

Although it is not described above, the above-described embodiments of the present invention can be used in mutual combinations.

In this manner, by selecting failure candidates from the results of internal circuit signal value simulation for the points in time when an Iddq abnormality is detected, and from the results of internal circuit signal value simulation for the points in time when an Iddq abnormality is not detected, and deriving first order simultaneous equations having the Iddq current flowing when each of the failures exists as unknowns, it is possible to solve these first order simultaneous equations in order to identify that failure that was the cause of the Iddq abnormality.

That is, by solving the first order simultaneous equations, the short circuit judgment is made according to the magnitude of the solution, thereby enabling diagnosis not only of single short circuit failures, but also of multiple short circuit failures.

Thus, it is possible to identify a short circuit fault in an CMOS integrated circuit, even for the case in which there is a plurality of failure locations causing failures for which, although a functional test does not detect any abnormality in input and output signal values, but for which, with respect to certain test patterns, an Iddq failure occurs which manifests itself as the flow of an abnormal Iddq current.

By using layout information with regard to the relationship of signal lines to wiring locations on the chip, it is possible to point out at what actual location on the chip a failure has occurred.

As described above, a CMOS integrated circuit failure diagnosis apparatus according to the present invention uses the results of both a functional test and an Iddq test, and the results of a simulation in the predicting of the location in which a short circuit failure has occurred, and predicts the existence of a failure based on a value distribution on signal lines, including the power supply and ground lines, this being obtained from the results of an internal signal line value simulation for the case when an Iddq abnormality was detected and the results of an internal signal line value simulation for the case when an Iddq abnormality was not detected.

For this reason, it is possible to perform high-speed prediction of the location at which a short circuit failure has occurred. Additionally, by using layout information with regard to the relationship of signal lines to wiring locations on the chip, it is possible to point out the location on the chip at which a failure has actually occurred.

A CMOS integrated circuit failure diagnosis apparatus according to the present invention uses the results of both a functional test and an Iddq test, and the results of a simulation in the predicting of the location in which a short circuit failure has occurred, and predicts the location of a failure from the number of 0s and 1s in the results of an internal signal line value simulation for the case when an Iddq abnormality was detected and the results of an internal signal line value simulation for the case when an Iddq abnormality was not detected.

For this reason, it is possible to perform high-speed prediction of the lo
ion at which a short circuit failure has occurred.

Additionally, by using layout information with regard to the relationship of signal lines to wiring locations on the chip, it is possible to point out the location on the chip at which a failure has actually occurred.

According to a CMOS integrated circuit failure diagnosis apparatus according to the present invention, a CMOS integrated circuit failure diagnosis apparatus is provided which performs diagnosis, by means of an functional test and an Iddq test, of a CMOS integrated circuit having a Iddq failure which, although it is not detected as an abnormality in a functional test, results in an Iddq abnormality in form of an abnormal flow of the Iddq current in the Iddq test occurring for only a certain test pattern, in which from the functional test results, the Iddq test results, and the simulation results, expected failure candidates are created, and further by establishing and solving a set A of first order simultaneous equations having as unknowns the current Iddq that flows when each of these failures exists, the signal lines between which short circuit failures have occurred being predicted, including the case in which there is a plurality of failure present.

The effect this has is that, in a CMOS integrated circuit Iddq failure, which is not detected in a functional test as an abnormality in input and output values, but which in an Iddq test manifests itself as a characteristically abnormal power supply current, it is possible to identify the location of such failures, even if a plurality of failure locations exists.

Furthermore, according to a CMOS integrated circuit failure diagnosis apparatus according to the present invention, by storing beforehand layout information with regard to the relationship of signal lines to wiring locations on the chip and information which relates gate-level circuitry to wiring locations, from the predicted short circuit failure and this layout information, it is possible to identify the location on a chip at which a failure has actually occurred, thereby having the effect of pointing to the actual location of the failure on the chip.

What is claimed is:

1. A CMOS integrated circuit failure diagnosis apparatus which uses functional test results and Iddq test results to diagnosis a failure in a CMOS integrated circuit in which exists an Iddq failure which in an Iddq test exhibits an Iddq abnormality for a specific test pattern only, and which is not detected in a functional test, said CMOS integrated circuit failure diagnosis apparatus comprising:

a test pattern storage unit into which are stored test patterns coded as input and output signals to and from said circuit to which said functional test is carried out;

an LSI tester which receives said test patterns and which performs a functional test and an Iddq test of said CMOS integrated circuit to be tested;

a test results storage unit into which are stored results of said functional test and said Iddq test;

a circuit data storage unit into which is stored circuit data which is a record of element placement information, element function information, and element-to-terminal wiring information of said circuit under test;

a logic simulator which performs a logic simulation of the operation of the internal circuitry of said circuit under test using said test patterns and above-noted circuit data;

a simulation results storage unit into which are stored results of said logic simulation;

and a failure location judgment unit which outputs diagnosis results which predict the location of a failure in the above-noted circuit, based on the results of said functional and Iddq tests and the results of said simulation.

2. A CMOS integrated circuit failure diagnosis apparatus according to claim 1, wherein said failure location judging unit outputs said diagnosis results that a short circuit failure has occurred at a combination of signal lines which indicate the same signal value at all times, based on a simulation of internal signal line values at a point in time at which a test pattern is applied for which an abnormality is not detected in performing an Iddq test.

3. A CMOS integrated circuit failure diagnosis apparatus according to claim 1, wherein said failure location judging unit outputs said diagnosis results that a short circuit failure has occurred at a combination of signal lines which indicate the different signal values from each other, at all times, based on a simulation of internal signal line values at a point in time in which a test pattern is applied for which an abnormality is detected in performing an Iddq test.

4. A CMOS integrated circuit failure diagnosis apparatus according to claim 1, wherein said failure location judging unit, from results of the functional test and the Iddq test, and from the results of the simulation, outputs as the diagnosis results short circuit failures between signal lines that exist in common in both a combination of signal lines which, from the results of a simulation of internal circuit signal values at a point in time at which a test pattern is applied for which an Iddq abnormality was not detected indicate the same signal value at all times and a combination of signal lines which, from the results of a simulation of internal circuit signal values at a point in time at which a test pattern is applied for which an Iddq abnormality was detected indicate the signal values being different from each other, at all times.

5. A CMOS integrated circuit failure diagnosis apparatus according to claim 1, wherein said failure location judging unit, from results of the functional test and the Iddq test, and from results of the simulation, outputs as the diagnosis result, from the results of simulation of internal circuit signal values at a point in time at which a test pattern is applied for which an Iddq abnormality was not detected or was detected in said Iddq test, a decision in that in a combination of signal lines showing the same signal values, the more time the signal values thereof show same to each other, the higher possibility of a short circuit failure exists between such signal lines combination.

6. A CMOS integrated circuit failure diagnosis apparatus according to claim 1, wherein said failure location judging unit, from results of the functional test and the Iddq test, and from results of the simulation, takes combinations of signal lines which, from the results of a simulation of internal circuit signal values at a point in time at which a test pattern was applied for which an Iddq abnormality was not detected in an Iddq test, indicate the same signal value to have the higher possibility of having a short circuit failure between the combination of the signal lines, when the more is the number of times in which the signal values of both signal lines show identical to each other, and takes combinations of signal lines which, from the results of a simulation of internal circuit signal values at a point in time at which a test pattern is applied for which an Iddq abnormality was detected in an Iddq test, indicate the different signal values from each other, to have the higher possibility of having a short circuit failure between the combination of the signal lines, when the more is the number of times in which the signal values of both signal lines are different from each other, and finally outputs as the diagnosis results combinations of signal lines having a high possibility of the existence of a short circuit failure by means of the product of these two.

7. A CMOS integrated circuit failure diagnosis apparatus according to claim 1, wherein said failure location judging unit, from results of the functional test and the Iddq test, and from results of the simulation judges, from a simulation of internal circuit signal values at a point in time at which a test pattern is applied for which an Iddq abnormality is not detected in an Iddq, that a signal line which indicates the same signal value, which is one of 1 and 0 values, at all times is suspect of having a short circuit failure with respect to a power supply line, and judges, that a signal line which indicates the same signal value, which is the other value of 1 and 0 values, at all times is suspect of having a short circuit failure with respect to a ground line.

8. A CMOS integrated circuit failure diagnosis apparatus according to claim 1, further comprising a wiring layout information storage unit which stores information with regard to the location of wiring and location of signal lines on the chip of the circuit under test, and a short circuit location prediction unit which indicates the location on the chip of an actual short circuit that has occurs, based on the failure location diagnosis results output from said failure location judgment unit and said wiring layout information.

9. A CMOS integrated circuit failure diagnosis apparatus according to claim 1, said failure location judgment unit is configured so that, from said functional test results, said Iddq test results, and said simulation results, said position of a short circuit failure in said circuit under test is predicted based on the number of 0s and 1s in the results of a simulation of internal circuit signal values at a point in time at which a test pattern is applied for which an Iddq abnormality was not detected in an Iddq test and based on the number of 0s and 1s in the results of a simulation of internal circuit signal values at a point in time at which a test pattern is applied for which an Iddq abnormality was detected in an Iddq test.

10. A CMOS integrated circuit failure diagnosis apparatus according to claim 9, wherein said failure location judgment unit applies a weighting of the degree of suspicion of a failure from the number of 0s and 1s in predicting the failure location.

11. A CMOS integrated circuit failure diagnosis apparatus according to claim 1, wherein said Iddq test is a DC power supply current test, and in which an Iddq abnormality is a DC power supply current abnormality.

12. A CMOS integrated circuit failure diagnosis apparatus according to claim 11, wherein said failure location judgment unit, from said functional test results, said DC power supply current test results, and said simulation results, creates an expected failure candidate set and establishes and solves a set of first order simultaneous equations, the unknowns of which are the DC power supply current which flows with the existence of each failure, thereby predicting a short circuit failure between signal lines which are included in a plurality of failures.

13. A CMOS integrated circuit failure diagnosis apparatus according to claim 11, which further comprises a layout information storage means which stores information with regard to wiring position on the chip of said CMOS integrated circuit and corresponding information for the wiring of the gate-level circuit of the CMOS integrated circuit, and a selection means which selects, a failure occurrence location having a possibility of occurring from limitations imposed by the layout, based on information which is shown in said layout information storage means, said failure location judgment unit, from functional test results and DC power supply current test results at said failure occurrence location selected by said selection means, and from simulation results, a set of expected failure candidates is created and establishes and solves a set of first order simultaneous equations, the unknowns of which are the DC power supply current which flows with the existence of each failure, thereby predicting a short circuit failure between signal lines which include a plurality of failures.

14. A CMOS integrated circuit failure diagnosis apparatus according to claim 13, said selection means being configured so as to select from locations on the chip of said CMOS integrated circuit at which signal lines cross or are in mutual proximity, at least one thereof as said failure occurrence location.

15. A CMOS integrated circuit failure diagnosis apparatus according to claim 11, which further comprises a layout information storage means which stores information with regard to wiring position on the chip of said CMOS integrated circuit and corresponding information for the wiring of the gate-level circuit of the CMOS integrated circuit, and means for identifying a location in which a failure has actual occurred on a chip of said CMOS integrated circuit, from the short circuit failure predicted by said failure location judgment means and layout information which is stored in said layout information storage means.

16. A CMOS integrated circuit failure diagnosis apparatus according to claim 11, which further comprises a means for identifying an location of occurrence of a failure on a chip of said CMOS integrated circuit, from the short circuit failure predicted by said failure location judgment means and layout information which is stored in said layout information storage means.

17. A CMOS integrated circuit failure diagnosis apparatus according to claim 11, further comprising an elimination means for eliminating from the short circuit failures predicted by said failure location judgment means, a failure having a low possibility of existence.

18. A CMOS integrated circuit failure diagnosis apparatus according to claim 17, wherein said elimination means is configured so as to eliminate short circuit failures which occur many simultaneous, which have a low possibility of existing.

19. A CMOS integrated circuit failure diagnosis method which uses functional test results and Iddq test results to diagnosis a failure in a CMOS integrated circuit in which exists no abnormality in a functional test but exhibits an Iddq abnormality in an Iddq test, for a specific test pattern only, said method comprising:

a first step of using a test pattern for the purpose of performing a functional test of said CMOS integrated circuit and performing a functional test and an Iddq test of said CMOS integrated circuit by means of a prescribed LSI tester;

a second step of performing an operational simulation with regard to said CMOS integrated circuit; and a third step of predicting a location of a short circuit failure in a signal line within said CMOS integrated circuit, from the test results from said first step and the simulation results from said second step.

20. A CMOS integrated circuit failure diagnosis method according to claim 19, wherein said third step makes a judgment that a short circuit failure occurs at a combination of signal lines which indicate the same signal value at all times, from results of a simulation of internal circuit signal values at a point in time at which a pattern is applied for which an Iddq abnormality is not detected in an Iddq test.

21. A CMOS integrated circuit failure diagnosis method according to claim 19, wherein said third step makes a judgment that a short circuit failure occurs at a combination of signal lines which indicate the signal values being different from each other at all times, from results of a simulation of internal circuit signal values at a point in time at which a pattern is applied for which an Iddq abnormality was detected in an Iddq test.

22. A CMOS integrated circuit failure diagnosis method according to claim 19, wherein said third step makes a judgment that a short circuit failure occurs at a combination of signal lines which is common to combinations of signal lines which from results of a simulation of internal circuit signal values at a point in time at which a pattern is applied for which an Iddq abnormality is not detected in an Iddq test indicate the same signal value at all times, and to combinations of signal lines which from results of a simulation of internal circuit signal values at a point in time at which a pattern is applied for which an Iddq abnormality was detected in an Iddq test indicate the signal values being different from each other at all times.

23. A CMOS integrated circuit failure diagnosis method according to claim 19, wherein said third step, from results of an internal signal value simulation for the points in time at which a test pattern is applied at which an Iddq abnormality is not detected in an Iddq test, or at which a test pattern is applied at which an Iddq abnormality is detected in an Iddq test, judges that in a combination of signal lines showing the same signal values, the more time the signal values thereof show same to each other, the higher possibility of a short circuit failure exists between such signal lines combination.

24. A CMOS integrated circuit failure diagnosis method according to claim 19, wherein said third step takes combinations of signal lines which, from the results of a simulation of internal circuit signal values at a point in time at which a test pattern was applied for which an Iddq abnormality was not detected in an Iddq test, indicate the same signal value to have the higher possibility of having a short circuit failure between the combination of the signal lines, when the more is the number of times in which the signal values of both signal lines show identical to each other, and takes combinations of signal lines which, from the results of a simulation of internal circuit signal values at a point in time at which a test pattern is applied for which an Iddq abnormality was detected in an Iddq test, indicate the different signal values from each other, to have the higher possibility of having a short circuit failure between the combination of the signal lines, when the more is the number of times in which the signal values of both signal lines are different from each other, and finally outputs as the diagnosis results combinations of signal lines having a high possibility of the existence of a short circuit failure by means of the product of these two.

25. A CMOS integrated circuit failure diagnosis method according to claim 19, wherein said third step, from results of a simulation of internal circuit signal values at a point in time at which a test pattern is applied for which an Iddq abnormality is not detected in an Iddq test, suspects a signal line which indicates the same signal value, which is one of 0 and 1, at all times to have a short circuit failure with respect to a power supply line, and suspects a signal line which indicates the signal values being different from each other, which is the other of 0 and 1, at all times to have a short circuit failure with respect to a ground line, making the judgment that these signal lines have the possibility of either a short circuit failure with respect to a power supply line or a short circuit failure with respect to a ground line.

26. A CMOS integrated circuit failure diagnosis method according to claim 19, wherein said third step, by referring information with regard to the location of wiring and location of signal lines on the chip of the circuit under test, makes a judgment of the location of a failure in terms of the circuit and of the actual location of the failure on the device under test.

27. A CMOS integrated circuit failure diagnosis method according to claim 19, wherein said third step, from the simulation results corresponding to individual times when a pattern for which an Iddq abnormality does not occur and/or simulation results corresponding to individual times when a pattern for which an Iddq abnormality does occur, the number of patterns of logic values 0 and 1 are counted for the internal signal lines within said device under test, and a prediction is made of the location of a short circuit of the above-noted signal lines with respect to a power supply line or with respect to a ground line.

28. A CMOS integrated circuit failure diagnosis method according to claim 27, wherein from results of a simulation of internal circuit signal values at a point in time at which a test pattern is applied for which an Iddq abnormality is not exhibited in an Iddq test, for a signal line for which the number of patterns indicating a logic value of 1 is zero, the possibility of a short circuit failure with respect to a ground line is predicted as being high, and for a signal line for which the number of patterns indicating a logic value of 0 is zero, the possibility of a short circuit failure with respect to a power supply line is predicted as being high.

29. A CMOS integrated circuit failure diagnosis method according to claim 27, wherein from results of a simulation of internal circuit signal values at a point in time at which a test pattern is applied for which an Iddq abnormality is exhibited in an Iddq test, for a signal line for which the number of patterns indicating a logic value of 1 is zero, the possibility of a short circuit failure with respect to a power supply line is predicted as being high, and for a signal line for which the number of patterns indicating a logic value of 0 is zero, the possibility of a short circuit failure with respect to a ground line is predicted as being high.

30. A CMOS integrated circuit failure diagnosis method according to claim 27, wherein from results of a simulation of internal circuit signal values at a point in time at which a test pattern is applied for which an Iddq abnormality is not exhibited in an Iddq test, for a signal line for which the number of patterns indicating a logic value of 1 is nearly zero, the possibility of a short circuit failure with respect to a ground line is predicted as being high, and for a signal line for which the number of patterns indicating a logic value of 0 is nearly zero, the possibility of a short circuit failure with respect to a power supply line is predicted as being high.

31. A CMOS integrated circuit failure diagnosis method according to claim 27, wherein from results of a simulation of internal circuit signal values at a point in time at which a test pattern is applied for which an Iddq abnormality is exhibited in an Iddq test, for a signal line for which the number of patterns indicating a logic value of 1 is nearly zero, the possibility of a short circuit failure with respect to a power supply line is predicted as being high, and for a signal line for which the number of patterns indicating a logic value of 0 is nearly zero, the possibility of a short circuit failure with respect to a ground line is predicted as being high.

32. A CMOS integrated circuit failure diagnosis method which uses functional test results, DC power supply current test results, and measurement results from said DC power supply current test in performing diagnosis of a CMOS integrated circuit, having a DC power supply current failure, for which no abnormality is detected in said functional test, but for which a DC power supply current abnormality results for only a specific test pattern, said method comprising:

a first step of performing said functional test and said DC power supply current test, based on test patterns which describe input and output signals to and from said circuit for the purpose of performing said functional test;

a second step of obtaining results of an internal circuit signal value simulation of said circuit at a point in time at which a test pattern is applied for which a DC power supply current abnormality is not detected in said DC power supply current test, based on results of an internal operational simulation of said CMOS integrated circuit;

a third step of obtaining results of an internal circuit signal value simulation of said circuit at a point in time at which a test pattern is applied for which a DC power supply current abnormality was detected in said DC power supply current test, based on results of an internal operational simulation of said CMOS integrated circuit;

a fourth step of selecting short circuit failure candidates from results of the internal circuit operational simulation of said CMOS integrated circuit, said functional test and DC power supply current test results, and simulation results obtained in said second and said third steps; and a fifth step of selecting a short circuit failure from said failure candidates which satisfies said DC power supply current measurement results.

33. A diagnosis method according to claim 32 further comprising a step which, based on wiring position information for wiring on the chip of said CMOS integrated circuit and corresponding information for wiring in a gate-level circuit of said CMOS integrated circuit, selects failure occurrence locations having a possibility of occurring, based on limitations imposed by the layout of said CMOS integrated circuit, and wherein diagnosis is performed with the only failure candidates being said failure occurrence locations.

34. A diagnosis method according to claim 33, wherein said step of selecting failure occurrence locations selects from locations on the chip of said CMOS integrated circuit at which signal lines cross or are in mutual proximity, at least one thereof as said failure occurrence locations.

35. A diagnosis method according to claim 32, further comprising a step which identifies, from short circuit failures obtained at step 5 and from wiring position information for wiring on the chip of said CMOS integrated circuit and corresponding information for wiring in a gate-level circuit of said CMOS integrated circuit and from wherein said fifth step, an actual location on a chip of the CMOS integrated circuit at which a failure occurs.

36. A diagnosis method according to claim 32, further comprising a step which, of short circuit failures predicted at step 5, eliminates failures having a low possibility of existing.

37. A diagnosis method according to claim 36, wherein said step that eliminates failures having a low possibility of existing eliminates failures having a large number of simultaneous occurrences as having a low possibility of existing.

* * * * *